United States Patent [19]

Peterson et al.

[11] Patent Number: 5,420,799
[45] Date of Patent: May 30, 1995

[54] CIRCUIT BREAKER - ASSOCIATED BACKPACK UNIT FOR LOWER-LINK COMMUNICATION WITH A PC COMPUTER MONITORING SYSTEM AND ENERGY MONITORING SYSTEM USING A PLURALITY OF SUCH BACKPACK UNITS

[75] Inventors: Clyde O. Peterson, Plum Borough; Joseph C. Engel, Monroeville Boro, both of Pa.; Denis A. Mueller, Asheville, N.C.; Richard B. Bell, Upper St. Clair; Robert L. Cather, Wilkins Township, Allegheny County, both of Pa.

[73] Assignee: Eaton Corporation, Cleveland, Ohio

[21] Appl. No.: 185,668

[22] Filed: Jan. 21, 1994

Related U.S. Application Data

[62] Division of Ser. No. 746,019, Aug. 15, 1991, Pat. No. 5,384,712.

[51] Int. Cl.⁶ .................................. G01R 21/06
[52] U.S. Cl. .................. 364/483; 324/142; 340/870.02; 340/870.05
[58] Field of Search .......... 324/142; 340/870.02, 340/870.05; 364/464.04, 483

[56] References Cited

U.S. PATENT DOCUMENTS

| | | | |
|---|---|---|---|
| 3,906,242 | 9/1975 | Stevenson | 307/38 |
| 3,937,978 | 2/1976 | Owenby, Jr. | 307/41 |
| 4,077,061 | 2/1978 | Johnston et al. | 364/483 |
| 4,090,062 | 5/1978 | Phillips | 219/486 |
| 4,100,426 | 7/1978 | Baranowski | 307/41 |
| 4,120,031 | 10/1978 | Kincheloe et al. | 364/464.04 |
| 4,130,874 | 12/1978 | Pai | 364/514 |
| 4,157,501 | 6/1979 | Cain, Jr. | 324/115 |
| 4,164,719 | 8/1979 | Young | 335/14 |
| 4,168,491 | 9/1979 | Phillips | 340/310 A |
| 4,178,572 | 12/1979 | Gaskill | 335/14 |
| 4,206,443 | 6/1980 | Britton | 340/310 |
| 4,219,860 | 8/1980 | DePuy | 361/94 |
| 4,308,511 | 12/1981 | Borona | 335/14 |
| 4,413,230 | 11/1983 | Miller | 324/142 |
| 4,415,896 | 11/1983 | Allgood | 340/870.03 |
| 4,418,333 | 11/1983 | Schwarzbach et al. | 340/310 A |
| 4,423,459 | 12/1983 | Stich | 361/94 |
| 4,568,934 | 2/1986 | Allgood | 340/870.02 |
| 4,608,560 | 8/1986 | Allgood | 340/825.52 |
| 4,644,547 | 2/1987 | Vercellotti et al. | 340/825.07 |
| 4,675,828 | 6/1987 | Winston | 364/464.04 X |
| 4,682,264 | 7/1987 | Domeyer | 361/96 |
| 4,689,752 | 8/1987 | Fernandes | 364/492 |
| 4,692,761 | 9/1987 | Robinton | 340/825.01 |
| 4,783,748 | 11/1988 | Swarztrauber et al. | 364/483 |
| 4,795,974 | 1/1989 | Landman et al. | 324/142 |
| 4,799,005 | 1/1989 | Fernandes | 324/127 |
| 4,803,632 | 2/1989 | Frew et al. | 364/464.04 |
| 4,806,855 | 2/1989 | Davis | 324/127 |
| 4,814,996 | 3/1989 | Wang | 324/142 X |
| 4,819,180 | 4/1989 | Hedman et al. | 364/492 |
| 4,831,327 | 5/1989 | Chenier | 324/127 |
| 4,853,619 | 8/1989 | Paulsen | 324/115 |
| 4,855,671 | 8/1989 | Fernandes | 324/127 |
| 4,866,714 | 9/1989 | Adams et al. | 371/22.1 |
| 4,874,926 | 10/1989 | Sanders | 219/486 |
| 4,884,021 | 11/1989 | Hammond | 324/142 |
| 4,884,022 | 11/1989 | Bishop | 324/157 |
| 4,920,476 | 4/1990 | Brodsky et al. | 364/140 |
| 4,933,633 | 6/1990 | Allgood | 324/142 |
| 5,001,315 | 3/1991 | Runyan et al. | 200/307 |
| 5,136,514 | 8/1992 | Laumann | 364/464.04 |
| 5,153,837 | 10/1992 | Shaffer et al. | 364/464.04 |
| 5,179,376 | 1/1993 | Pamatto | 364/483 X |
| 5,185,705 | 2/1993 | Farrington | 364/483 |
| 5,196,982 | 3/1993 | Landsberg et al. | 361/93 |
| 5,224,054 | 6/1993 | Wallis | 364/483 |
| 5,233,538 | 8/1993 | Wallis | 364/483 |
| 5,315,531 | 5/1994 | Oravetz et al. | 364/550 |

Primary Examiner—Edward R. Cosimano
Attorney, Agent, or Firm—Martin J. Moran

[57] ABSTRACT

A PC computer monitors the energy consumed at a plurality of local stations placed behind the electrical meter of the utility company for individual billing of the local users, a bidirectional communication line being used between the PC computer and the plurality of local stations. A command from the PC computer causes the totalized energy to be stored at each station, and thereafter the PC computer derives individually the results for separate energy estimations and central billing.

10 Claims, 40 Drawing Sheets

16 OCTAVES $O_0 - O_{15}$

CIRCUIT BREAKER - ASSOCIATED BACKPACK UNIT FOR LOWER-LINK COMMUNICATION WITH A PC COMPUTER MONITORING SYSTEM AND ENERGY MONITORING SYSTEM USING A PLURALITY OF SUCH BACKPACK UNITS

This application is a divisional application of U.S. patent application Ser. No. 07/746,019 filed on Aug. 15, 1991 now U.S. Pat. No. 5,384,712 and entitled "ENERGY MONITORING SYSTEM FOR A PLURALITY OF LOCAL STATIONS WITH SNAPSHOT POLLING FROM A CENTRAL STATION".

This application is also related to the following patent and copending patent application, which are also incorporated-by-reference:

a. Patent application Ser. No. 636,634, filed Dec. 28, 1990, for "Sure Chip Plus", now U.S. Pat. No. 5,270,898, issued Dec. 14, 1993; and b. Patent application Ser. No. 636,643, filed Dec. 28, 1990, for "Sure Chip", pending.

"This application is further related to the following patent: patent application Ser. No. 07/915,171, filed Jul. 15, 1992, for "Energy Monitoring System for a Plurality of Local Stations with Snapshot Polling from a Central Station", now U.S. Pat. No. 5,315,531, issued May 24, 1994."

FIELD OF THE INVENTION

The invention relates to load management for electrically operated loads in general, and more particularly to a PC computer monitored system for instantaneously ascertaining the individual consumption of energy by users at several locations behind the meter which has been installed by the electrical utility company for computing the total energy used from the main lines.

BACKGROUND OF THE INVENTION

The electrical companies usually place at least one meter at the junction of the main distribution power lines with their customer consumption location, that it be a factory, a house, a shop, a business, or a residential building, thereby to collectively monitor the kilowatts drawn from the main AC lines on the basis of the sensed voltage and current, and to compute the energy so as to bill the customer according to actual demand. It is now proposed to determine at the customer's level how much at a sublevel has been consumed, behind such an electrical meter of the utility company, at each of the sublocations of users in order that the billing can be divided and the cost fairly distributed between them, that they be residents, tenants, workshop craftsmen, or shopkeepers.

It is known from U.S. Pat. No. 4,168,491 to control the demand of energy consumed by several users pertaining to a common building. The purpose, there, is to stop the user's consumption whenever it exceeds a predetermined limit. To this effect, when power may be exceeded, from a central location all the users in the group are distributively switched OFF, either cyclically and for a certain duration, or told to switch OFF.

It is known from U.S. Pat. No. 3,937,978 to control remotely electrical loads, such as multi-unit lodging establishments, power sensing being used to deenergize a load having excessive consumption.

From U.S. Pat. No. 3,906,242 it is known to monitor loads under programmed peak load reduction from a computer load center operating with a signal transmitter upon a plurality of installations having their local signal receiver and load limiter.

U.S. Pat. No. 4,090,062 shows an energy demand controller for a house, or a building, having separated heaters and appliances, each having a local control unit and an intermediary switch.

In U.S. Pat. No. 4,100,426 load controlling is accomplished with plug-in modules which are pat of a standard package associated with the respective loads for a given installation.

With U.S. Pat. No. 4,206,443 protective load disconnection is remotely performed at a single control input terminal from a master controller and monitoring unit.

U.S. Pat. No. 4,874,926 discloses the use of low voltage thermal relays placed adjacent to the downstream or outlet side of a residential circuit breaker in the in-residence power distribution lines leading to individual electrical heating elements.

U.S. Pat. No. 4,164,719 is for a load management application wherein, between the local load and the power input, a conventional circuit breaker is combined with a management module.

U.S. Pat. No 4,178,572 is like the -719 patent but with a contactor-circuit breaker arranged for mounting in the same panelboard having the load circuit breaker serving for energization.

U.S. Pat. No. 4,308,511 relates to a load management circuit breaker containing an electronic package and a remote-controlled switch, associated with an electric energy meter and a master control transmitter connected through a line of communication.

Complementary to the -511 patent, in U.S. Pat. No. 4,130,874 is described a power line communication system with selectable address formats.

Digital processing for producing signals representative of electrical energy parameters, in a system like shown in the -511 and -874 patents, is described by U.S. Pat. No. 4,077,061.

U.S. Pat. No. 4,806,855 relates to a system for rating electric power transmission lines. The system there described includes current sensor-transmitter for multiplexed transmission by telecommunication-link to a computer.

U.S. Pat. No. 4,219,860 shows digital overcurrent relay apparatus using sampling with digital conversion in relation to the monitored AC current.

In U.S. Pat. No. 4,423,459 a solid state circuit is illustrated involving AC current monitoring by sampling and digital conversion.

In U.S. Pat. No. 4,682,264 a microprocessor-based solid-state trip unit processes digital signals derived from current sensors.

Digital power metering with voltage and current samples is shown in U.S. Pat. No. 4,884,021.

It is known from U.S. Pat. No. 4,689,752, from U.S. Pat. No. 4,799,005 and from U.S. Pat. No. 4,855,671 to perform metering functions with high speed sampling at several local stations and to transmit the information to a common remote station.

It is known from U.S. Pat. No. 4,933,633 to effectuate energy monitoring with a communication channel between a central station and several remote stations.

From U.S. Pat. No. 4,692,761, a communication system is known including a master unit and several remote units with transfer of data relating to power consumption from one remote unit to the master unit.

SUMMARY OF THE INVENTION

The present invention relates to a multiple users load distribution system secondary to a primary AC power supply from an electrical company having a common energy meter. The purpose of the present invention is to provide compact apparatus for integrating sensing and providing monitoring from a remote location. The apparatus at the remote location can be readily plugged-in upon an existing circuit breaker without any modification in the panelboard installation. The apparatus is used instantaneously for ascertaining and totalizing the share of a selected user in the overall cost computed by the meter of the electrical company.

According to the present invention, a PC-based system is installed for internal use within the secondary distribution system wherein, under a master-slave relationship each user installation is centrally and digitally addressed, for the purpose of determining instantaneously the local consumption of energy.

This is achieved without disturbing the normal power line distribution and installation from the main power terminals going to the individual circuit breakers assembled on a panelboard for the secondary users. Another important consideration in this context is that there is no need to add any conventional current, or voltage, transformer for sensing, thereby to accept the circuit breaker panelboard as is when implementing upon it the system according to the present invention.

The invention resides in locally integrating into, or around, a central solid state device: 1. the computer functions required at the receiving and transmitting end of a local user station for instantaneously determining and constantly storing the up-to-date electrical energy consumed locally; and 2. the lower-link gating function of a bi-directional highway of a communication line established with a PC computer station. This local integrated system is compacted into a backpack unit plugged into a circuit breaker serving the local user from the main AC lines. Each local circuit breaker being so provided, the PC computer monitors centrally all the local users, thereby deriving information regarding the energy consumed for individual billing. The resulting billing is for internal use besides the collective company meter. A simple 2-wire synchronous communication line is connected as a daisy line to the several small backpack units plugged-in with the respective circuit breakers of the intended users having their loads behind the collective utility meter. An integrated transducer and lower-link slave communication unit is specially designed to fit exactly the dimensions of the circuit breaker so that it can be readily applied as a backpack-unit within the projected cross-section thereof, the terminal lines being simply passed therethrough for enabling sensing in-situ once mounted upon the normal terminals of the circuit breaker. Twinned printed-circuit boards are placed within the unit, one for operation on the voltage and current transducer side, the other intervening digitally and facing the line of communication as its lower-link. Digital treatment allows transmission of messages both ways in a standard address and message format.

The digital datalink used in the preferred embodiment is of the type disclosed in U.S. Pat. No. 4,644,547, and also as illustrated in U.S. Pat. No. 4,866,714 for a personal-computer-based dynamic burn-in system.

The invention is applicable to mere performing, of metering functions at the level of the several local users with centralized monitoring and accounting of the individual demand and energy billings. It is also applicable to individual billing of the electrical utility share under the company billing system which may include peak-demand ratings, for instance.

BRIEF DESCRIPTION OF THE DRAWINGS

FIGS. 3A, 3B and 3C are front, top and side views of one of the backpack units of FIG. 1, whereas

FIG. 21A illustrates on a half-cycle, the distribution of two consecutive octaves of samples, whereas

DETAILED DESCRIPTION OF THE INVENTION

Figure 1:
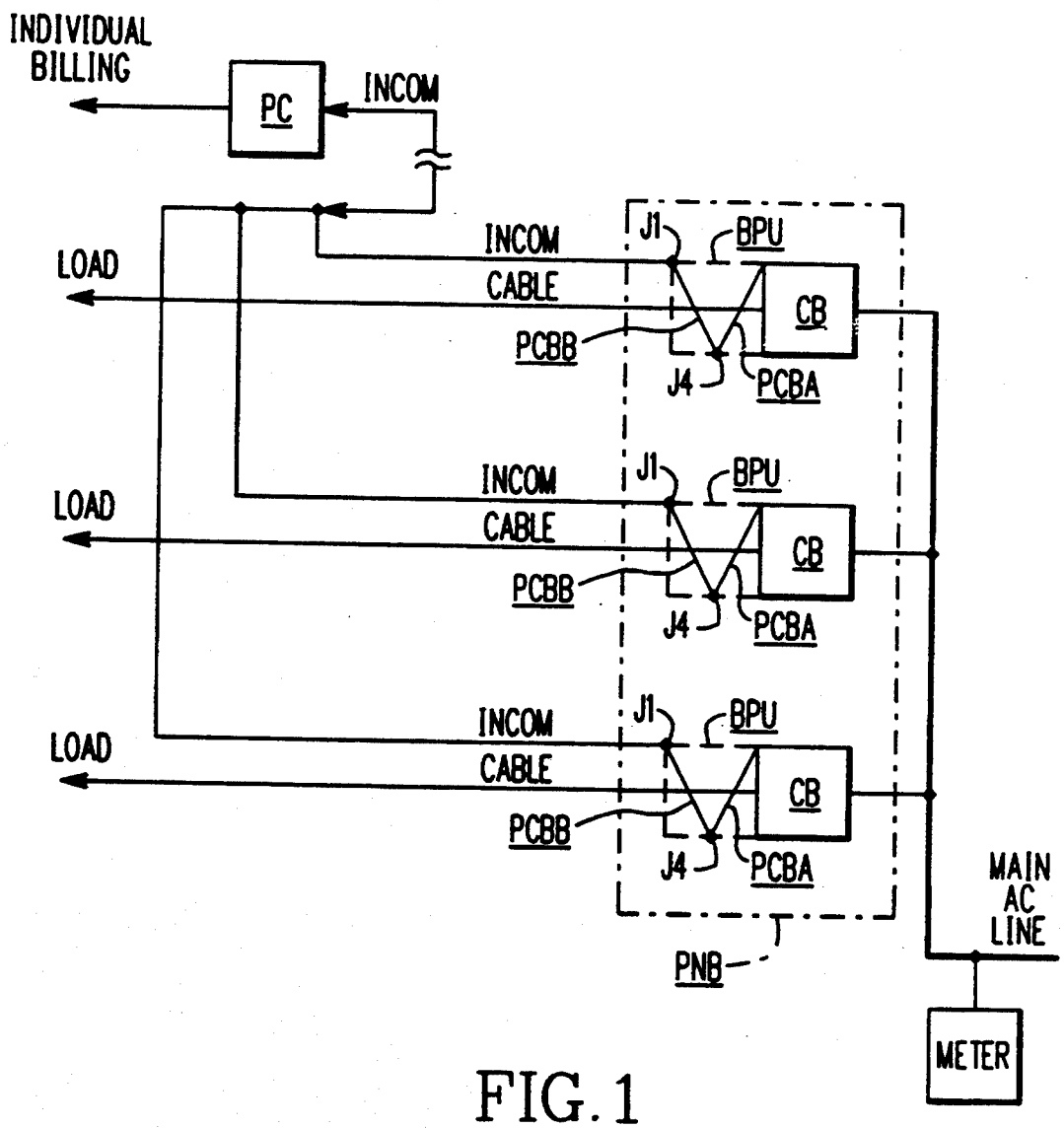
FIG. 1 is a schematic diagram of a panelboard installation incorporating the energy monitoring system according to the invention coupled, through individual backpack units, to a plurality circuit breakers serving local users.

FIG. 1 is a diagrammatical view of the energy monitoring system embodying, according to the present invention, several backpack units BPU each coupled with one of several circuit breakers CB which are part of a panel board PNB through which the main electrical AC lines are interconnected with local cables leading individually to serve separate user's loads. Each backpack unit includes two printed-circuit boards PCBA and PCBB which are interconnected at J4, one (PCBA) for effecting current transducer and voltage sensing functions with the circuit breaker, the other (PCBB) for deriving digital information therefrom (at junction J1) which is transmitted through a telecommunication channel INCOM for bilateral transmission with a PC computer PC. As a result of energy monitoring through a selective combination of the several printed-circuit boards with the PC computer, it is possible from the PC computer station to establish instantaneously individual load billings for the different local users, at a stage which is after the collective Meter (FIG. 1) installed by the Electrical Company supplying energy through the main AC lines.

Figure 2A:
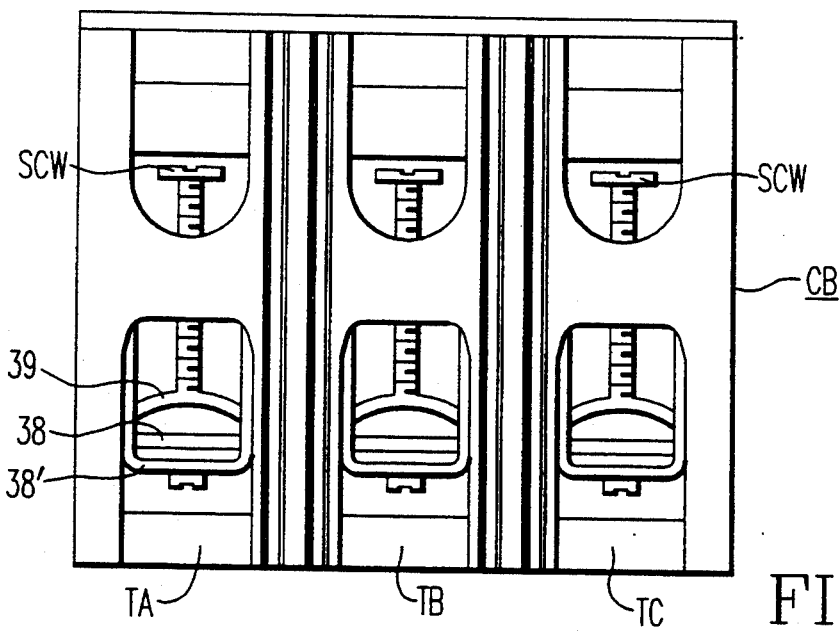
FIGS. 2A and 2B are front and top views of one of the circuit breakers of FIG. 1.
Figure 2B:
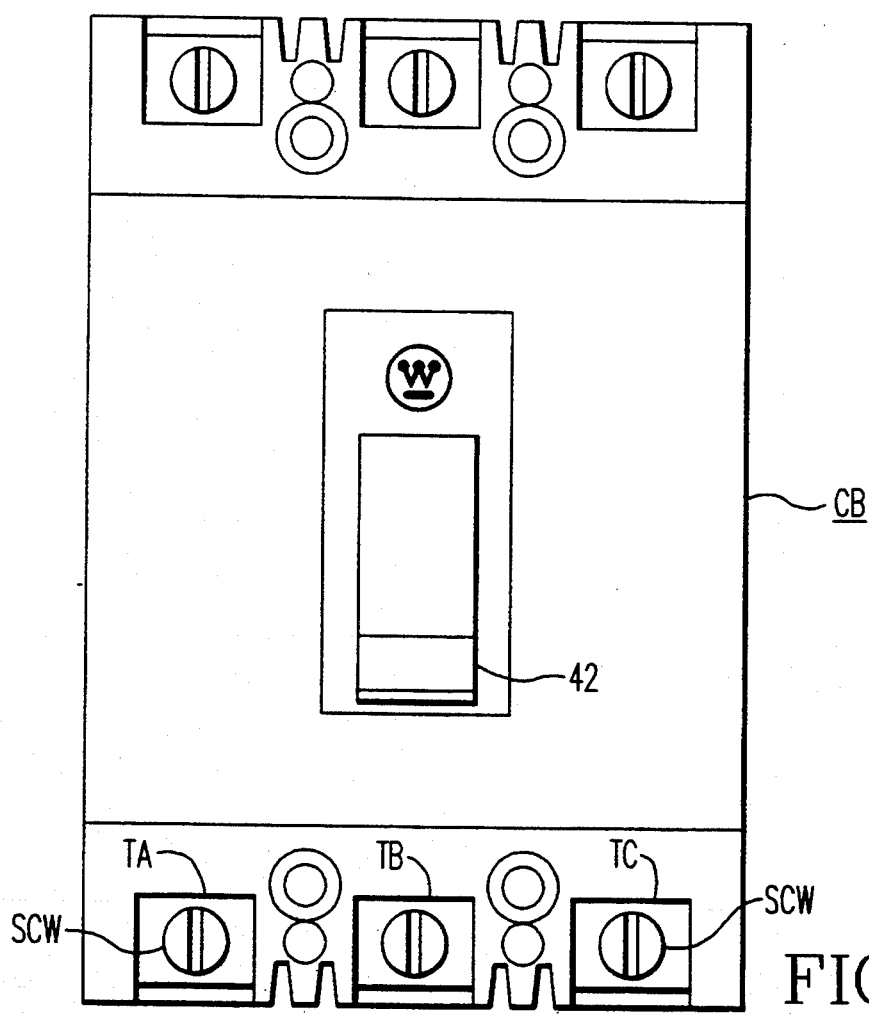

FIGS. 2A and 2B are front and top views, respectively, of a circuit breaker which can be installed, as illustrated by CB in FIG. 1. The circuit breaker, typically has three terminals TA, TB and TC (for the respective poles, in a three-pole example) upon which the individual local cables (each shown as only one pole in FIG. 1) are attached between a screw (SCW) driven member 39 engaging the cable and a stopping member 38 held by a bracket 38' within the terminal (TA, TB, or TC). The handle is protruding at 42, for manual control, namely, on the front plane of the panel board PNB of FIG. 1. As shown in FIG. 1, the local cable, before entering with its open end the terminal of the circuit breaker, is passed through the two printed-circuit boards PCBA and PCBB, which have been provided, each with a proper opening (not shown). The other side of the circuit breaker is likewise connected through terminals to the AC lines from the Electrical Company.

Figure 3A:
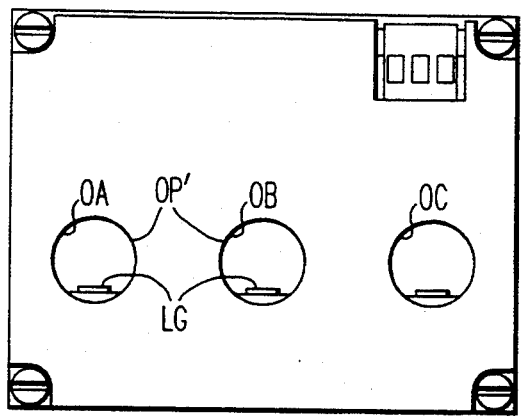
Figure 3C:
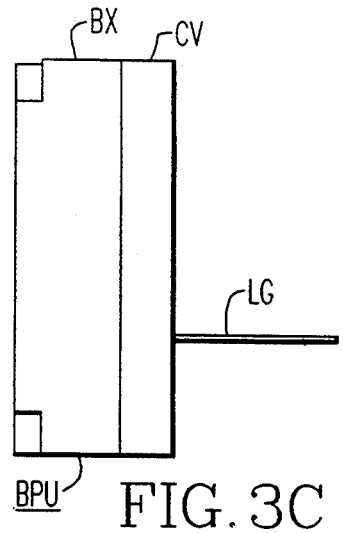
Figure 3B:
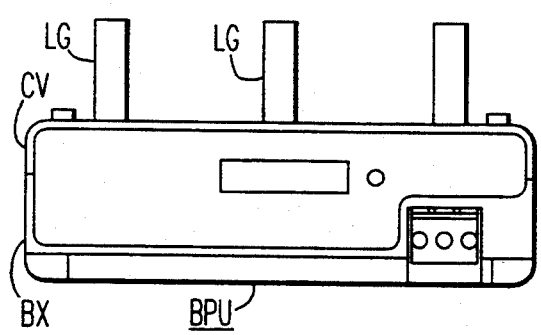
Figure 3D:
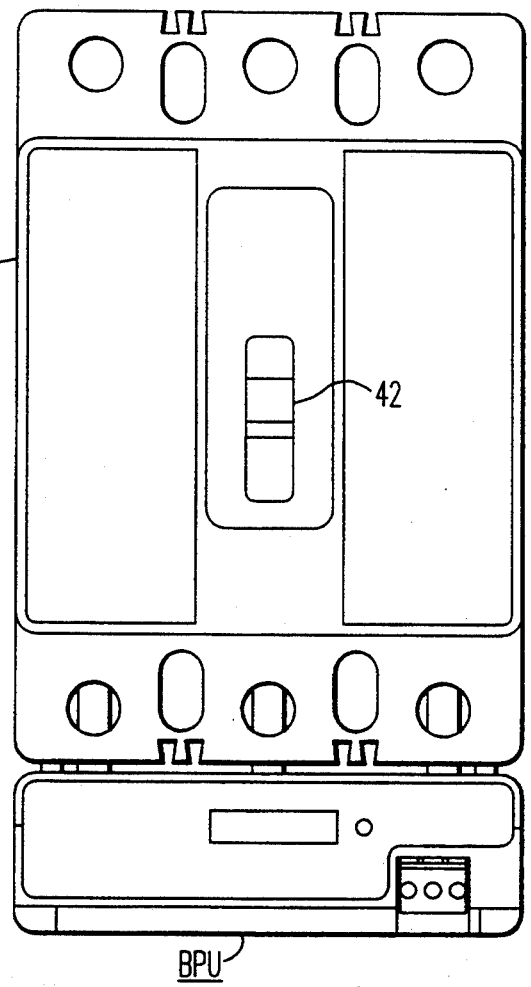
FIG. 3D is like FIG. 3B, but with a circuit breaker shown coupled to it.

FIGS. 3A, 3B and 3C are front, top and side views of one of the backpack units BPU of FIG. 1, shown as a housing comprising a bottom casing BX and a cover CV, with protruding blades, or lugs, LG, one for each pole of a three-pole circuit breaker such as the one of FIGS. 2A and 2B. J1 is the connector, inserted within the BPU housing, into which the telecommunication line INCOM of FIG. 1 is plugged-in. Three circular openings (OA, OB, OC) are visible (on FIG. 3A) which are provided crosswise through the entire housing and the internal printed-circuit board assembly (PCBA and PCBB on FIG. 1) of the backpack unit BPU. A lug LG is seen mounted in each hole (OA, OB, OC). The local user's cable associated with one pole of the circuit breaker is passed through a corresponding opening (OA, OB, or OC) of the circuit breaker housing, and beyond it, its open end is placed along the lug LG, or conversely, within the terminal (TA, TB, or TB in FIG. 2A) of the Circuit breaker, so that cable conductor and lug become held together, while being closely pressed under the tight grip of a screw for good electrical contact. FIG. 3D shows the backpack unit BPU plugged-in with the circuit breaker CB.

Figure 4A:
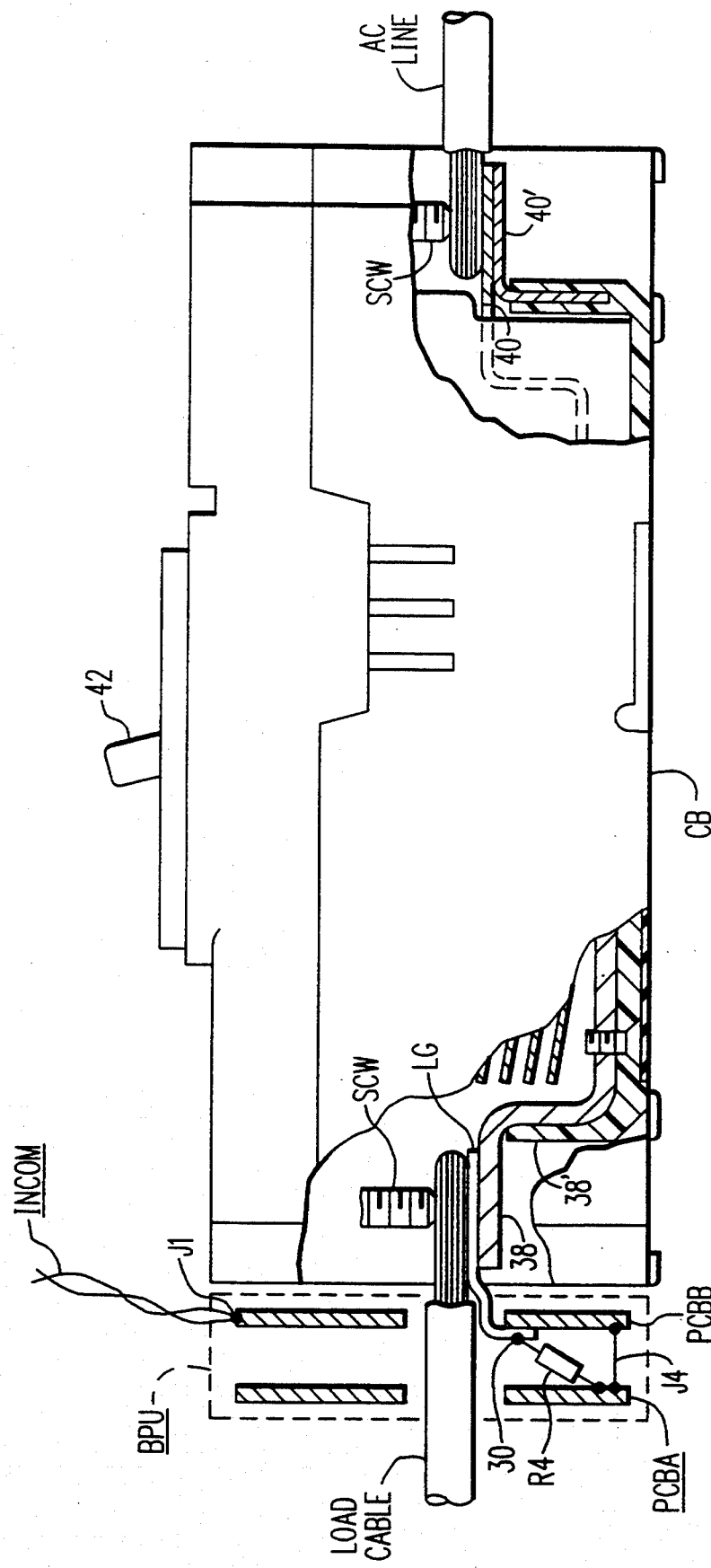
FIGS. 4A and 4B and top views of one of the circuit breakers of FIG. 1, the two opposite conductor terminals being shown in FIG. 4A attached to the respective incoming and outgoing cable lines, the associated backpack unit being shown plugged-in on the outgoing local load line side.
Figure 4B:
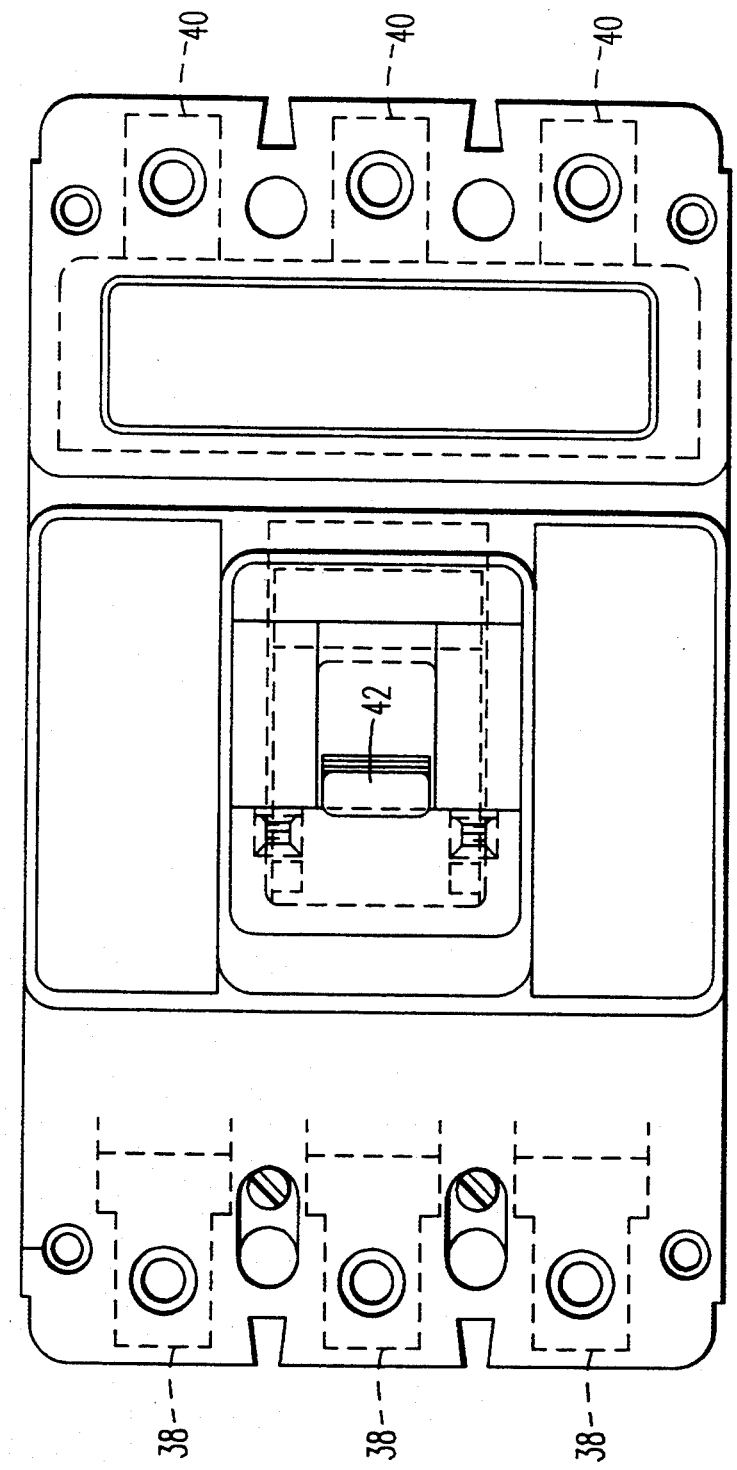
Figure 5A:
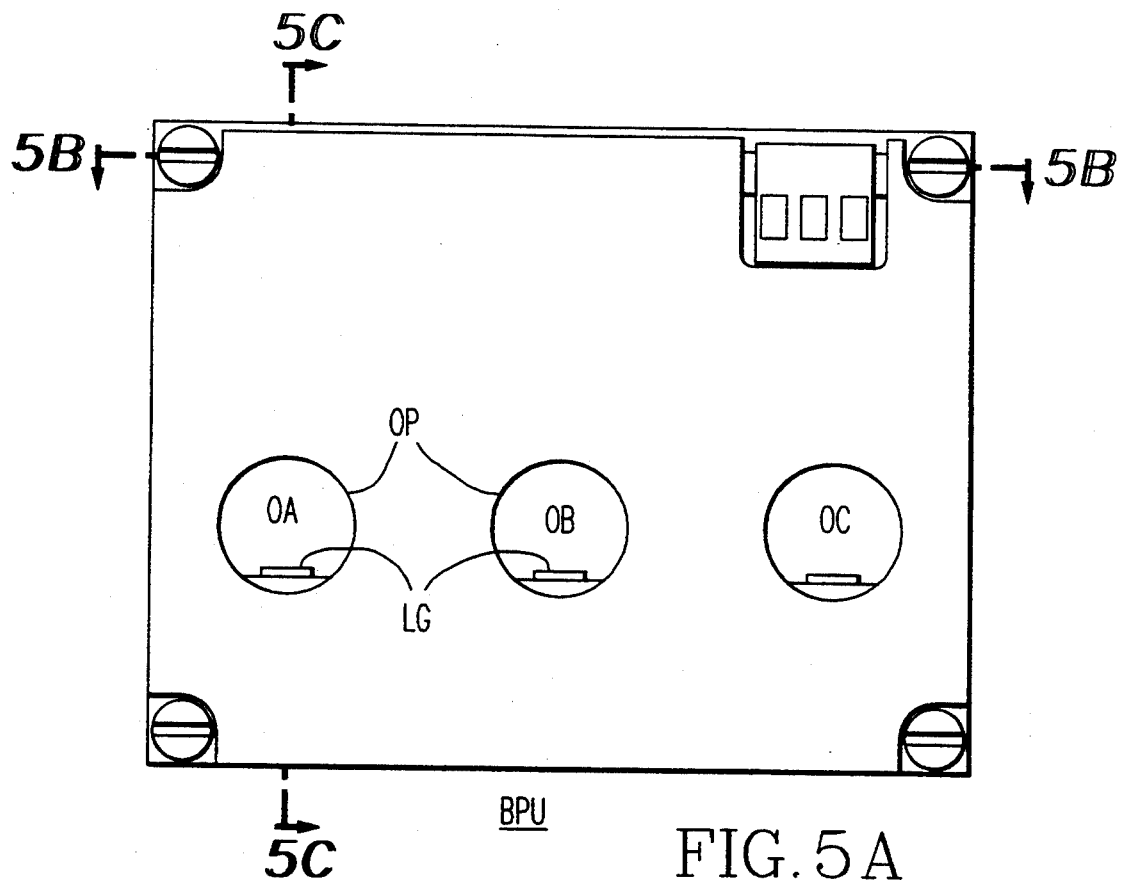
FIG. 5A is, like FIG. 3A, a front view of one of the backpack units of FIG. 1, with FIGS. 5B and 5C showing two cross-sections of the backpack unit of FIG. 5A.
Figure 5B:
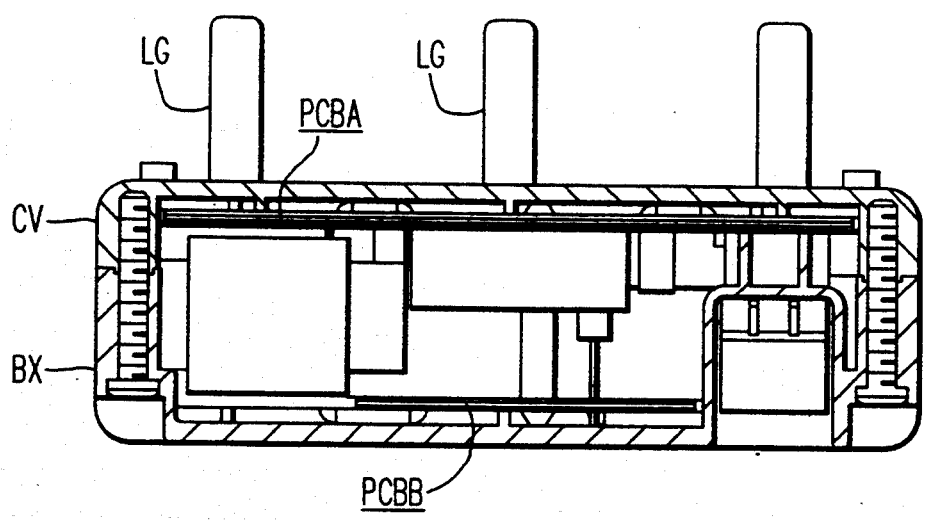
Figure 5C:
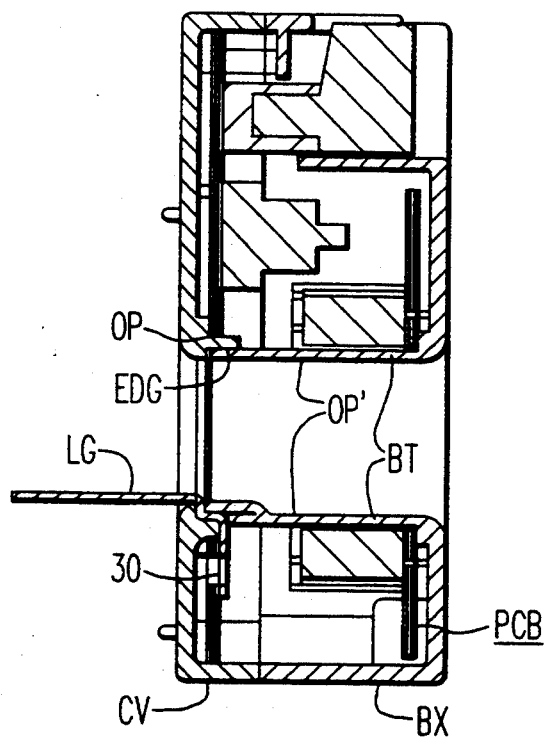

FIG. 4A is a side view of the circuit breaker of FIG. 3D (while FIG. 4B is a top view thereof) showing the naked end of the electrical cable from the local user engaged with the terminal conductor 38 of the breaker and pressed against it under a screw SCW. The local user's cable passes across the housing of the backpack unit BPU and through two parallel printed-circuit boards PCBA and PCBB. Although in FIG. 1, printed-circuit PCBA is shown closer to the circuit breaker CB whereas the other printed-circuit PCBB appears on the opposite side and closer to the communication line INCOM, in FIG. 4A the PCBB printed-circuit board is shown mounted close to the circuit breaker, a lug LG being attached to it and extending therefrom directly to the outside for insertion into the terminal (TA, TB or TC of FIG. 2A). Consequently, from a rivet of fixation 30, mounted on printed-circuit board PCBB, is derived a signal characteristic of the phase voltage which is passed to the other printed-circuit board (PCBA), via a resistor R4 (for phase A, for instance). As will be explained in detail hereinafter, printed-circuit board PCBA supports transducers which sense the phase currents passing through the local cable. Therefore, the sensed phase voltage signal passed through R4 is also received by board PCBA. Conversely, via an electrical connector J4, the current and voltage sensed signals are together passed to the PCBB printed-circuit. There, after digital conversion and digital treatment, there will be information passed, through connector J1 of printed-circuit board PCBB, to the INCOM line leading to a PC computer for central monitoring of the energy consumed through the particular circuit breaker and the local user's cable. The circuit breaker's conductor 38 is mounted on a bracket 38′. The terminal bare end of the cable is pressed with a screw against the lug LG of the backpack unit, the latter being squeezed between the cable and conductor 38. The AC line is fixed inside the opposite terminal of the circuit breaker directly against conductor 40, the latter being mounted on a bracket 40′, as generally known FIG. 5A is a front view of a backpack unit, like in FIG. 3A, bearing cross-section lines 5B—5B and 5C—5C to which are related the cross-sectional views of FIGS. 5B and 5C, respectively. FIG. 5C shows lug LG as installed and mounted with its rivet 30. The parallel printed-circuit boards have a circular opening (OA for phase A, for instance) having a rim OP. The insulating housing includes a bottom casing BX having a plastic boot BT, extending across the openings of the two printed-circuit boards (PCBA and PCBB), with an internal cylindrical surface OP′ of sufficient diameter to allow the local cable therethrough. Boot BT, extends in proximity of the rim OP of the printed-circuit boards. It starts from the bottom of casing BX until it engages at the other end a complementary circular ridge EDG provided on the bottom of the cover CV. The two are joined together to close the space and provide insulation in the gap between rim OP of the printed-circuit boards and the axially mounted local cable.

Figure 6A:
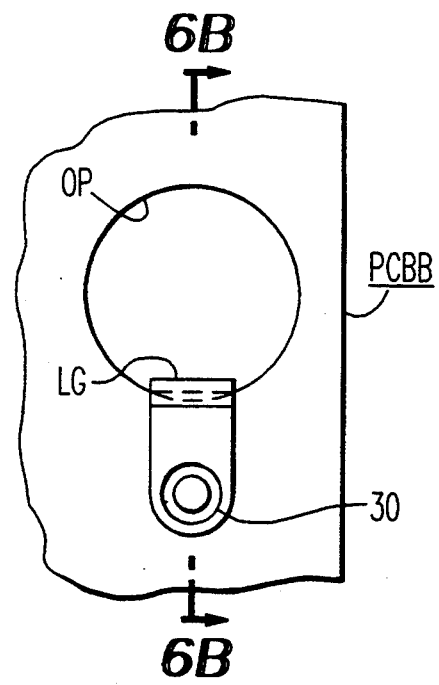
FIG. 6A is a front view of the lug of the backpack unit of FIGS. 3A, 3B, 3C,.5A, 5B or 5C, as it is mounted near the rim of the printed-circuit board opening through which a cable line is to be axially passed.
Figure 6B:
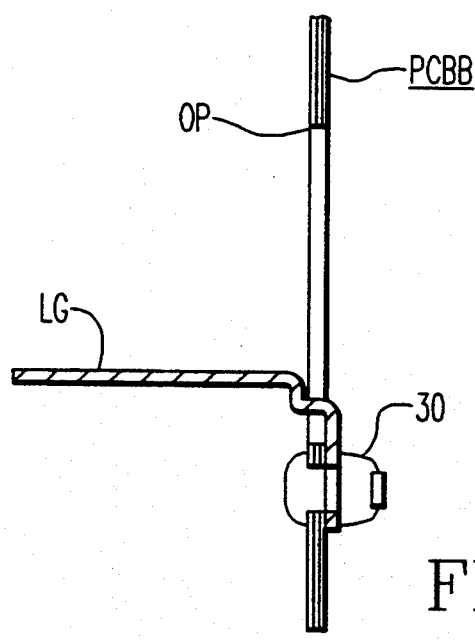
FIG. 6B is a cross-section taken from FIG. 6A.

FIGS. 6A and 6B show lug LG as it is mounted on the printed-circuit board PCBB. FIG. 6B is a cross-section along line BB of FIG. 6A. OP is the rim of the opening OA (for phase A, instance).

Figure 7:
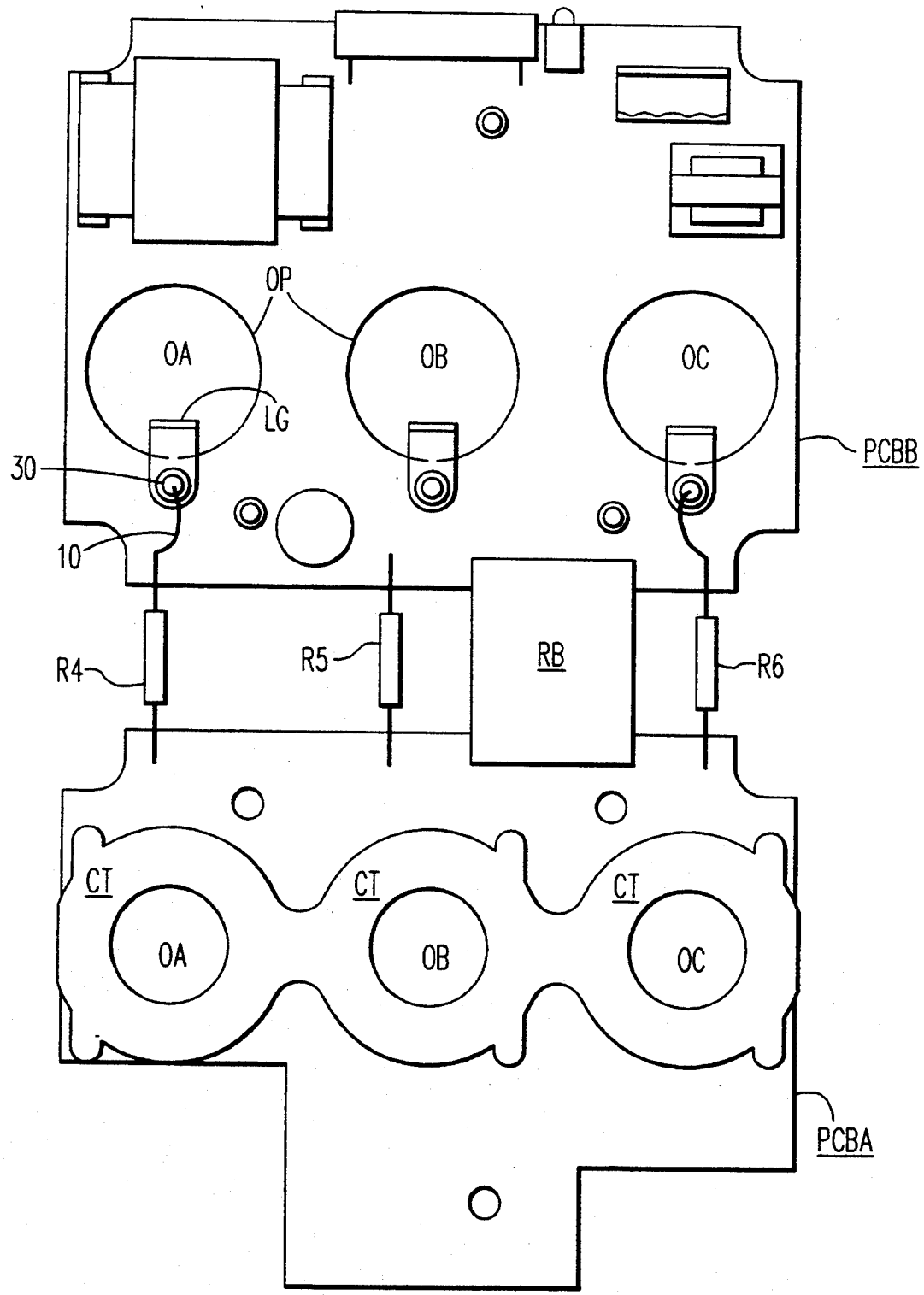
FIG. 7 shows side-by-side the two printed-circuit boards of FIG. 1.

FIG. 7 illustrates how the two printed-circuit boards are connected side-by-side. Each lug (one for each of the respective openings OA, OB, OC in the case of a three-pole circuit breaker) LG is mounted on board PCBB with a rivet 30 which is electrically connected by line 10 to a resistor. R4 (for opening OA and phase A), R5 (for OB), or R6 (for OC) which are bridging the two edges of the two printed-circuits bards. Printed-circuit PCBA shows circular compartments CT for the current transducers of opening OA, OB″ and OC, destined to surround the local cable for sensing. The AC voltage representative signals VA, VB, VC (derived through resistors R4, R5 and R6), and the current representative signals IA, IB, IC (derived from the current sensors CT) are, via connecting lines (assembled at J4 in FIG. 4A), passed back through a ribbon RB to the PCBB printed-circuit board for digital treatment thereon.

Figure 8A:
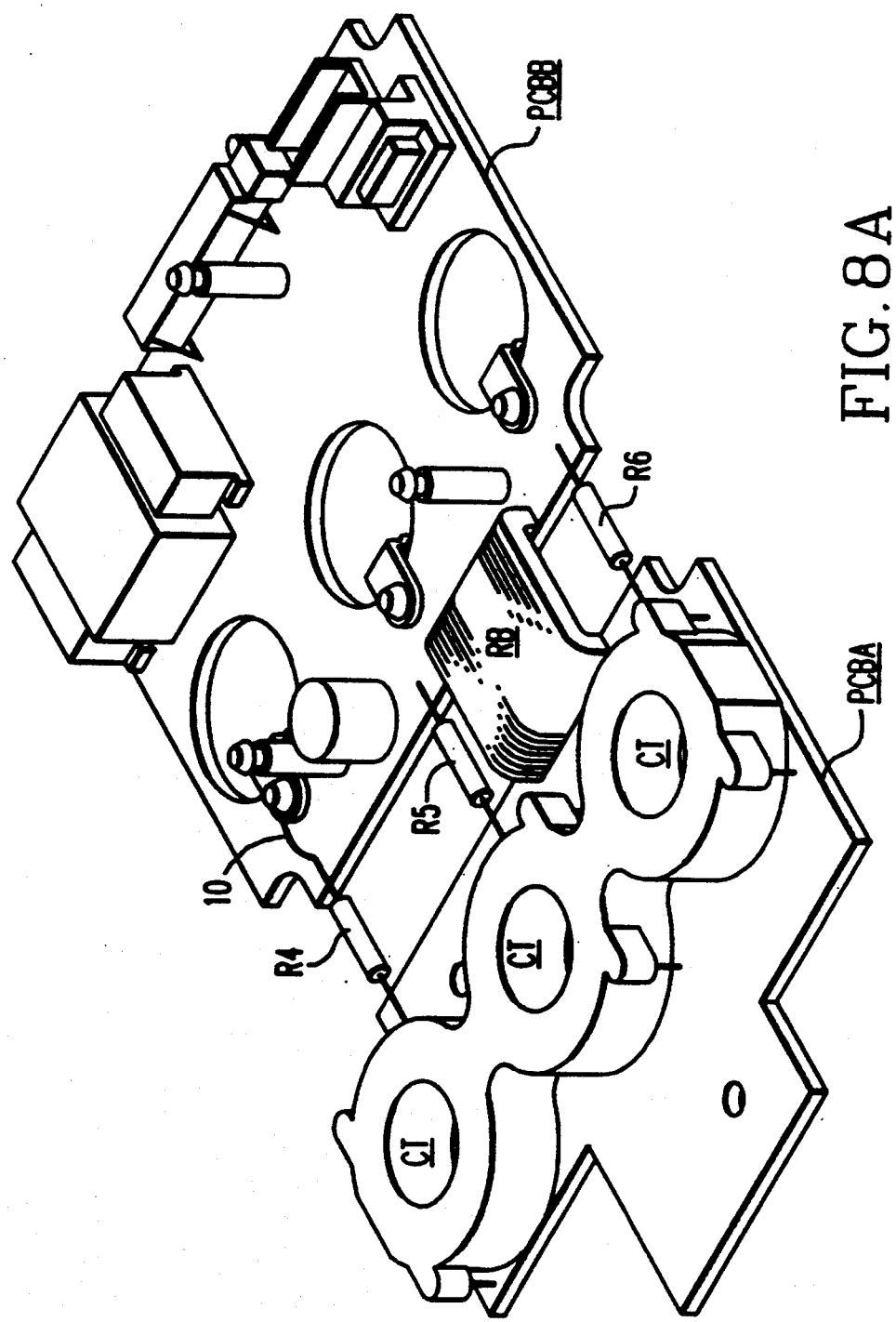
FIGS. 8A and 8B are illustrating the internal organization of a backpack unit built around two printed-circuit boards, the latter being initially mounted side-by-side (FIG. 8A) before being folded and brought on top of the other (FIG. 8B) once assembled.
Figure 8B:
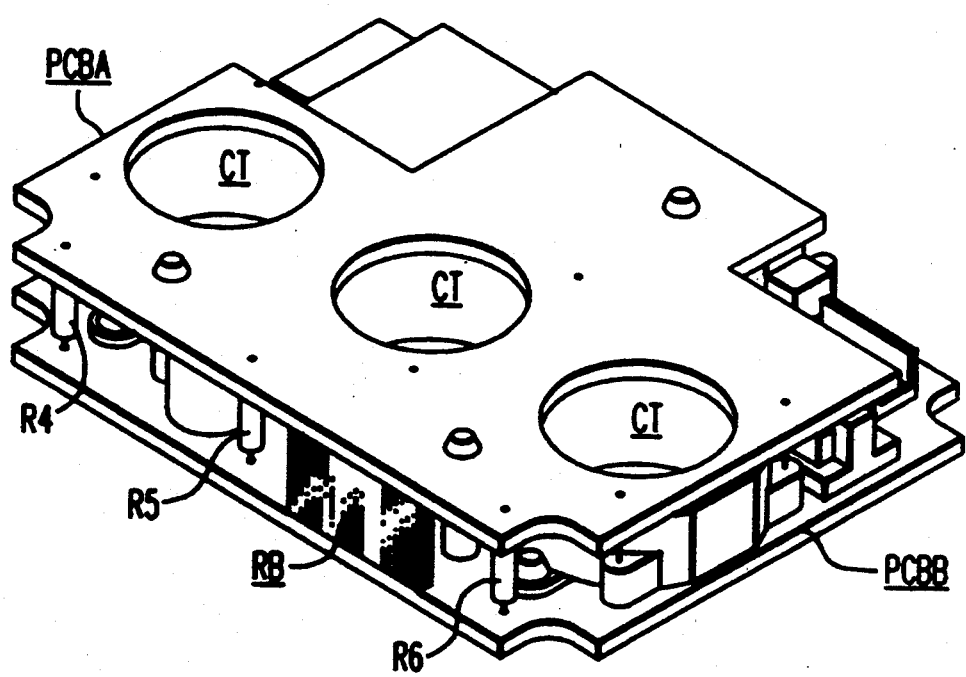
Figure 9:
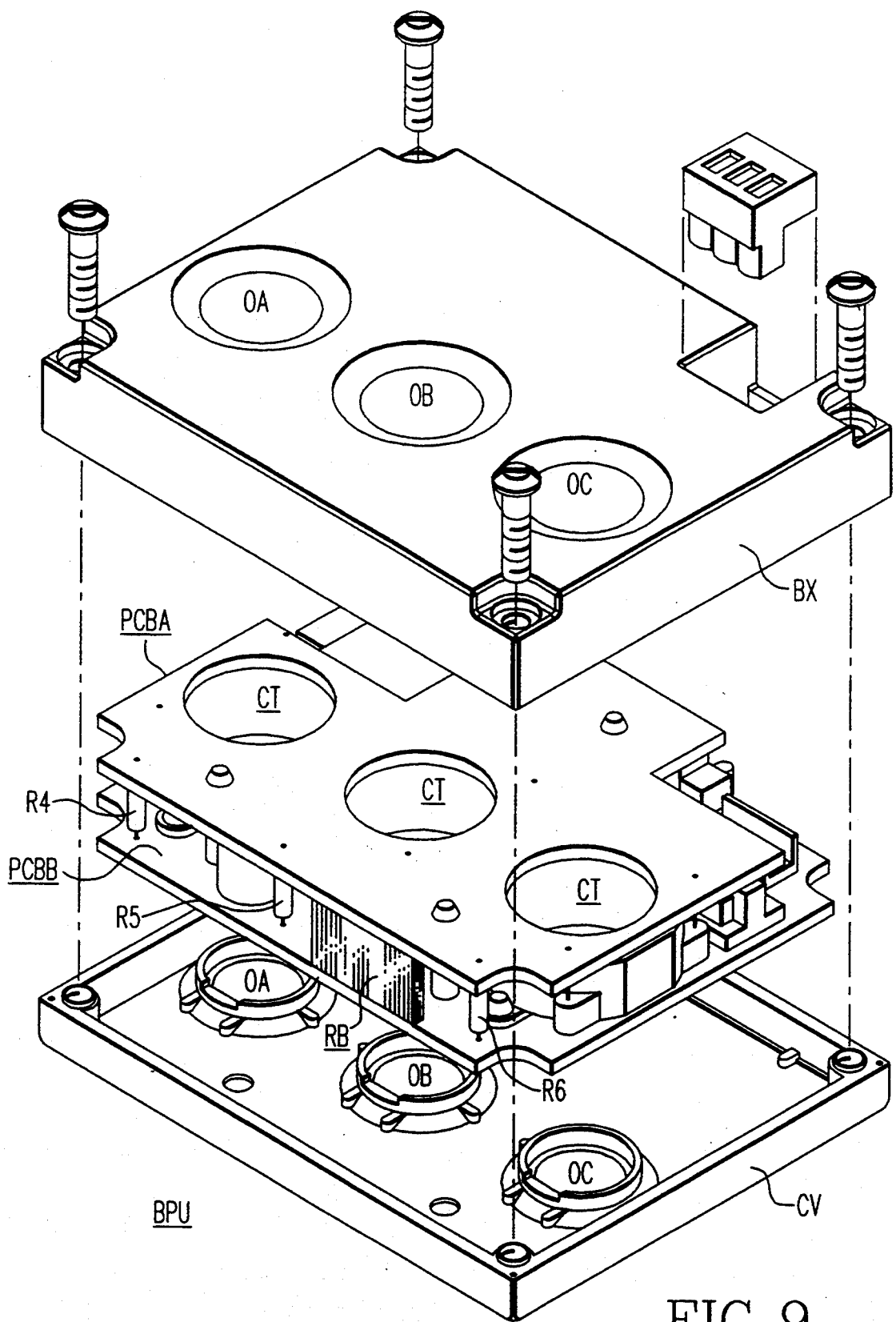
FIG. 9 is an exploded view of the bottom casing of the backpack unit and its cover, the functional unit of FIG. 8B being shown nearly sandwiched therebetween.
Figure 10A:
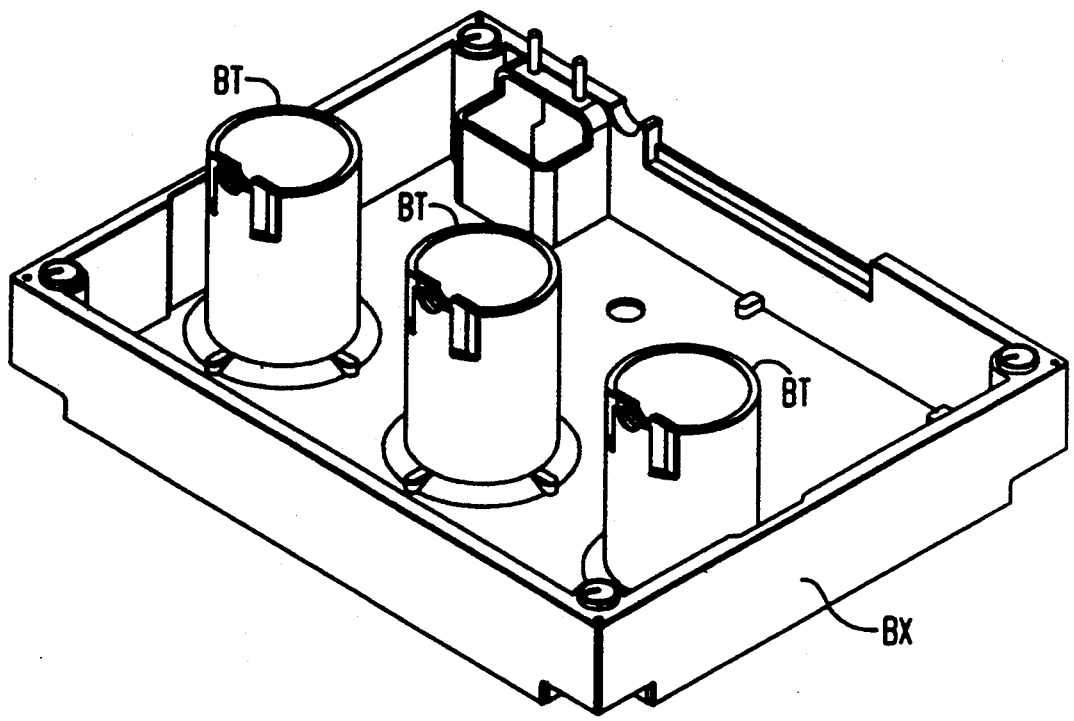
FIGS. 10A and 10B are separate views, taken in perspective, of the bottom casing and the cover used for the backpack unit of FIG. 9.
Figure 10B:
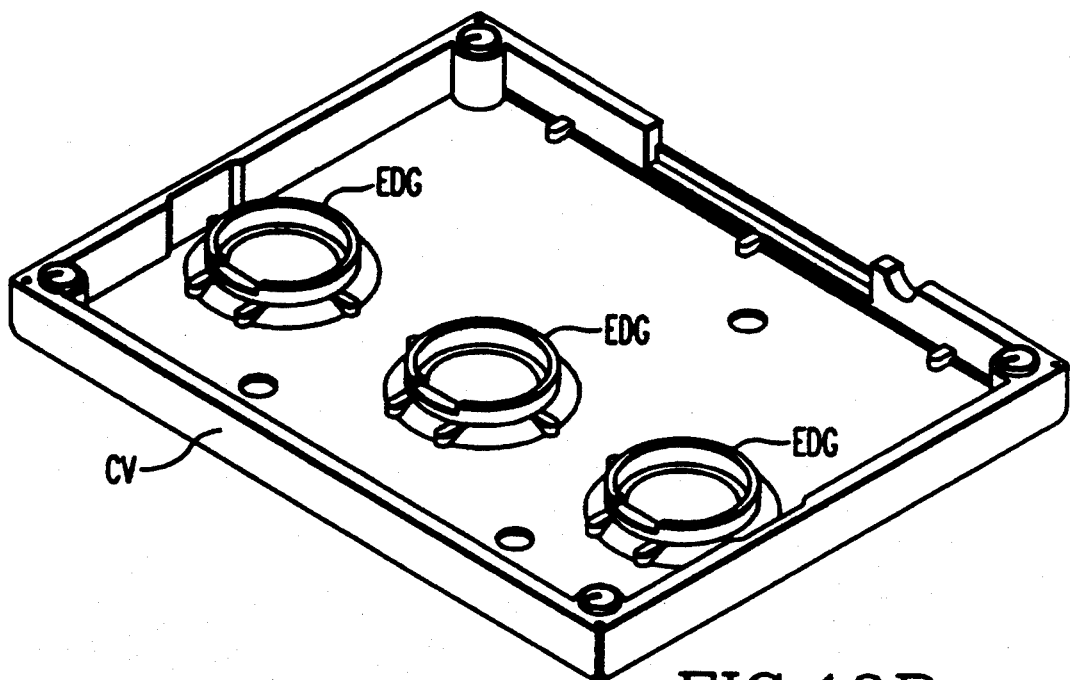

FIGS. 8A and 8B are perspective views of the two printed-circuit boards of FIG. 7 shown after they have been fully mounted with additional equipment, such as transformers, connectors, pins and fixation tools. One view (FIG. 8A) shows the two boards side-by-side, the other (FIG. 8B) shows them together after board PCBA has been folded on top of board PCBA. FIG. 9 is an exploded view of bottom casing BX and of cover CV of a backpack unit BPU, the two printed-circuit boards of FIG. 8B being shown sandwiched therebetween. FIG. 10A is a perspective view of the bottom casing BX with the three boots BT to be inserted through the respective printed-circuit board openings. FIG. 10B is a perspective view of the cover CV with its three edges EDG. They both have plastic rectangular bodies provided at the four corners with matching holes to allow rods having threaded ends to be passed therethrough when closing the overall housing of the backpack unit with screws.

Figure 11:
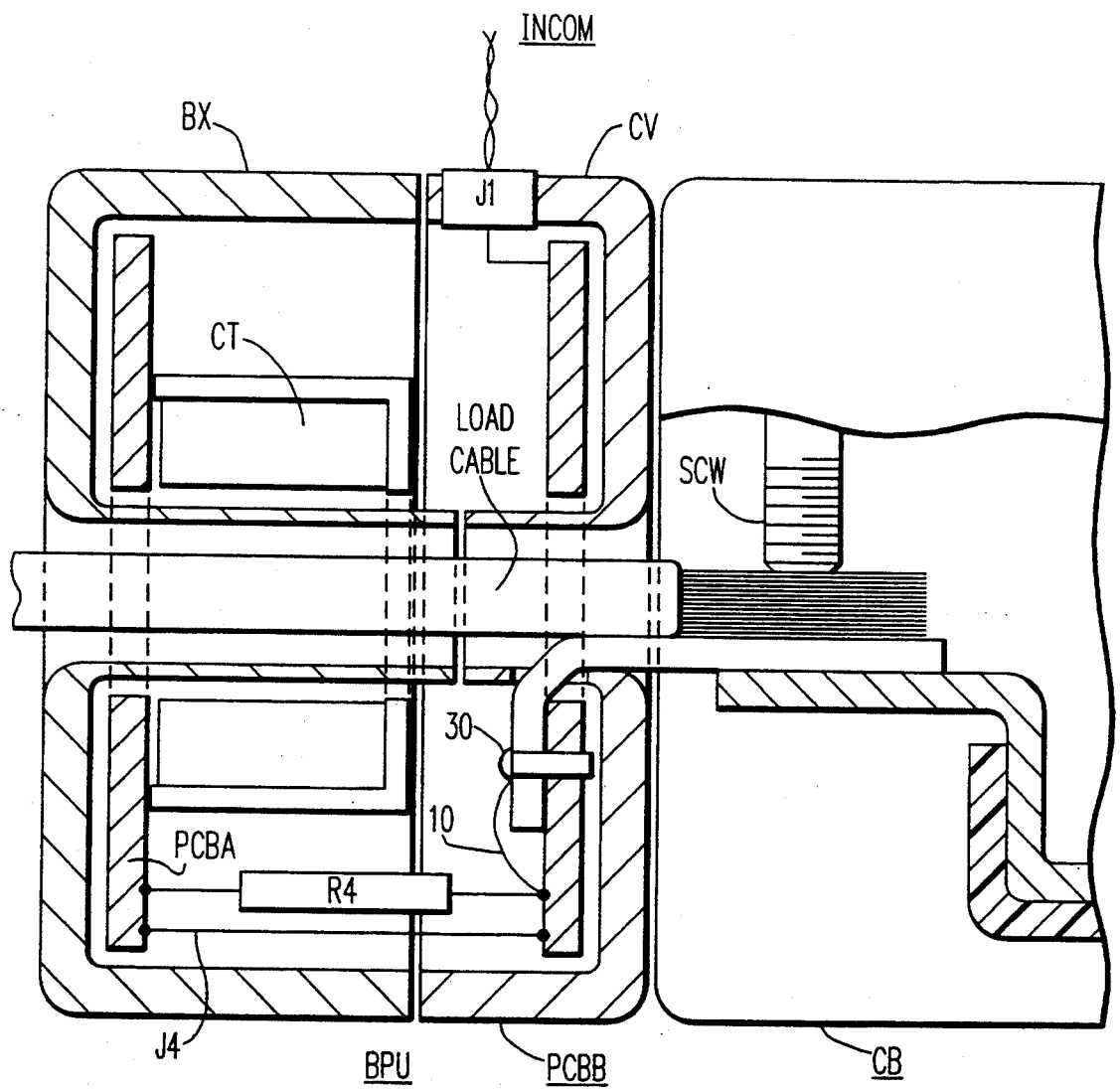
FIG. 11 shows diagrammatically the mechanical and electrical connections within the backpack unit.

FIG. 11 is a cross-section showing, with more details than with FIG. 4A, how the internal parts are assembled between one terminal of the circuit breaker CB and the central opening of the backpack unit BPU. The transducer CT is shown in position within the corresponding compartment of the bottom casing BX of FIG. 7. Connector J1 is interposed between the upper edge of the PCBB printed-circuit and the INCOM line. Connector J4 is between PCBA and PCBB so is resistor R4 connecting radial line 10 of PCBB to PCBA (for opening OA, for instance).

Figure 12:
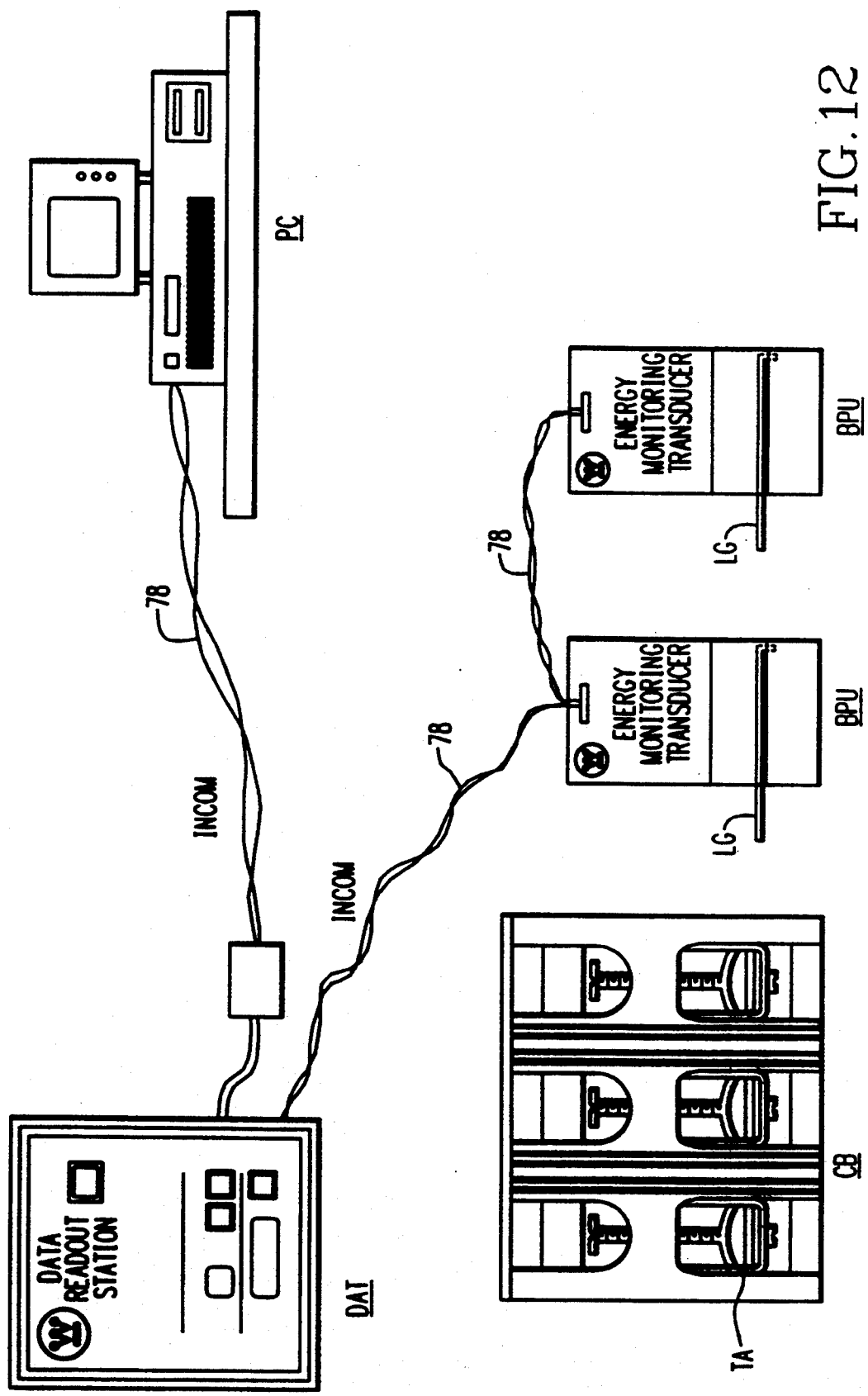
FIG. 12 illustrates the energy monitoring system according to the invention with a PC computer operator control station, connected to a plurality of slave backpack units, each backpack unit being coupled, or to be coupled, to a corresponding circuit breaker serving the local electricity user, monitoring being effected through a common line of communication, with an optional local data collecting station inserted therein.

FIG. 12 illustrates the backpack units according to the invention as occupying expanded-slave stations within an INCOM system like the one described in U.S. Pat. No. 4,866,714. Two backpack units BPU are shown pertaining to two different circuit breakers (only one being shown at CB for the purpose of clarity). A two-wire line of communication 78 (assumed to be of the INCOM type) is connecting in a daisy line fashion the backpack units serially at their different locations. Line 78 leads to a P.C. Computer Station. Typically it passes through an optional Data Readout Station DAT as explained hereinafter. The function of the communication line 78 is like the one explained fully in the context of a Personal Computer-Based Dynamic Burn-In System given by U.S. Pat. No. 4,866,714. This Patent is hereby incorporated-by-reference.

Figure 13:
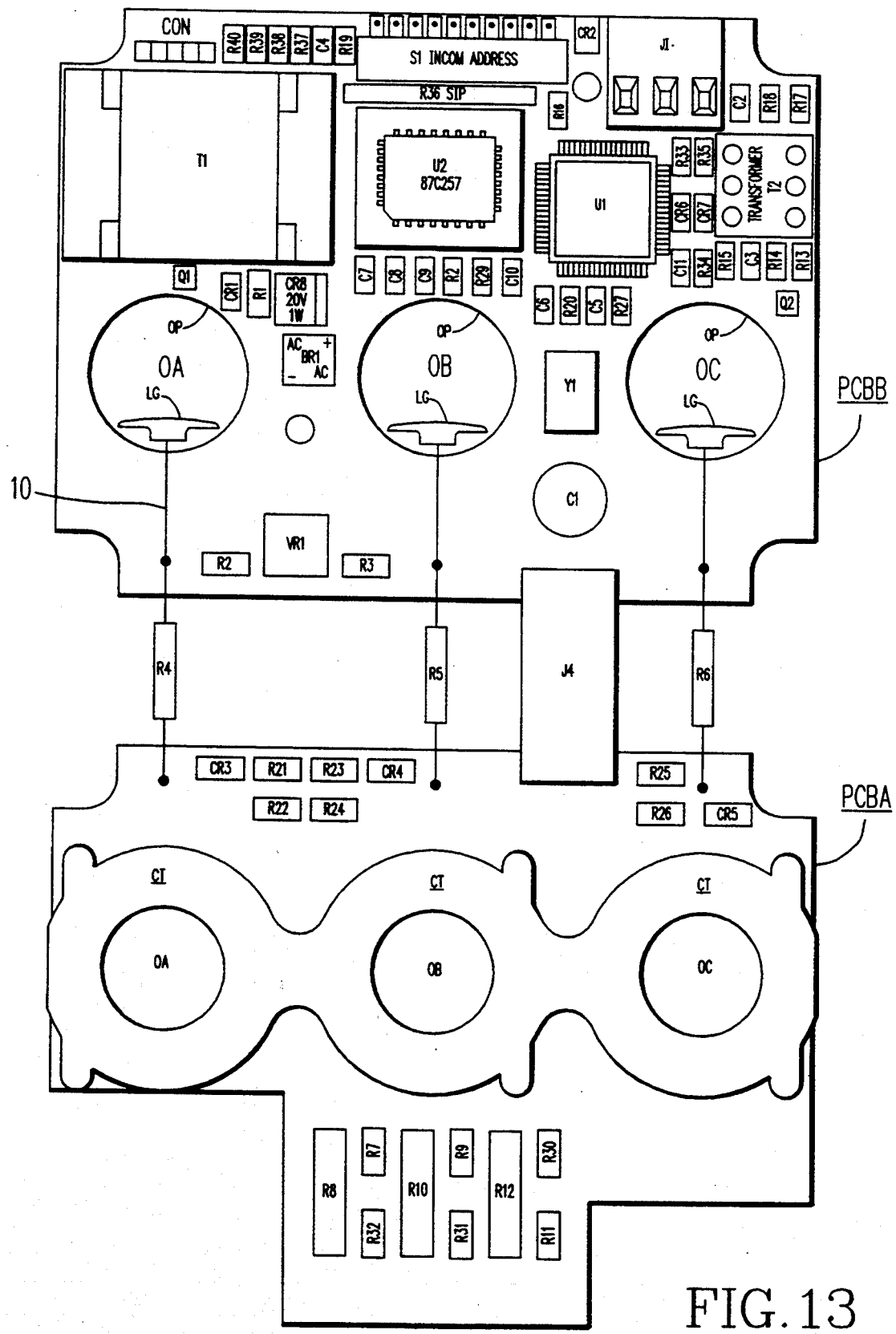
FIG. 13 illustrates in an exploded view the face-to-face relationship between the two printed-circuit boards which inside the backpack unit establish an interface between the circuit breaker terminal sensing functions and the lower-link functions of the PC computer communication line.

The previous FIG. 8A showed two printed-circuit boards side-by-side with their main mechanical parts attached to it. FIG. 13 illustrates the internal electrical organization about the rims OP of board PCBB for the three phases with their respective radial lines 10 going through resistors R4, R5 and R6 from board PCBB to board PCBA. Connector J4 is illustrated as a ribbon RB connecting the signal outputs from board PCBA to board PCBB, for digital treatment.

Figure 14:
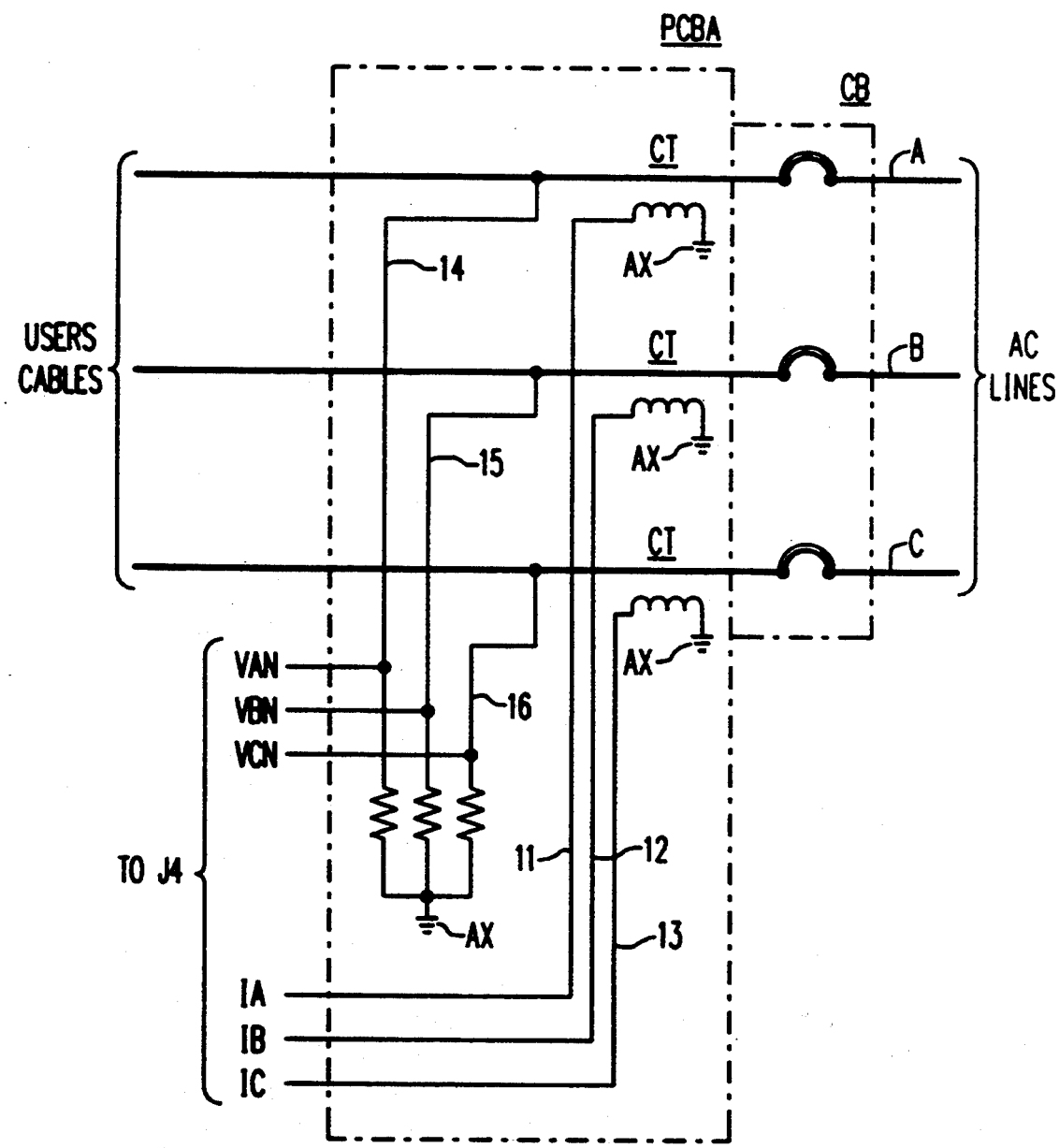
FIG. 14 is a diagram illustrating the current and voltage sensing functions involved in the transducer printed-circuit board.
Figure 14A:
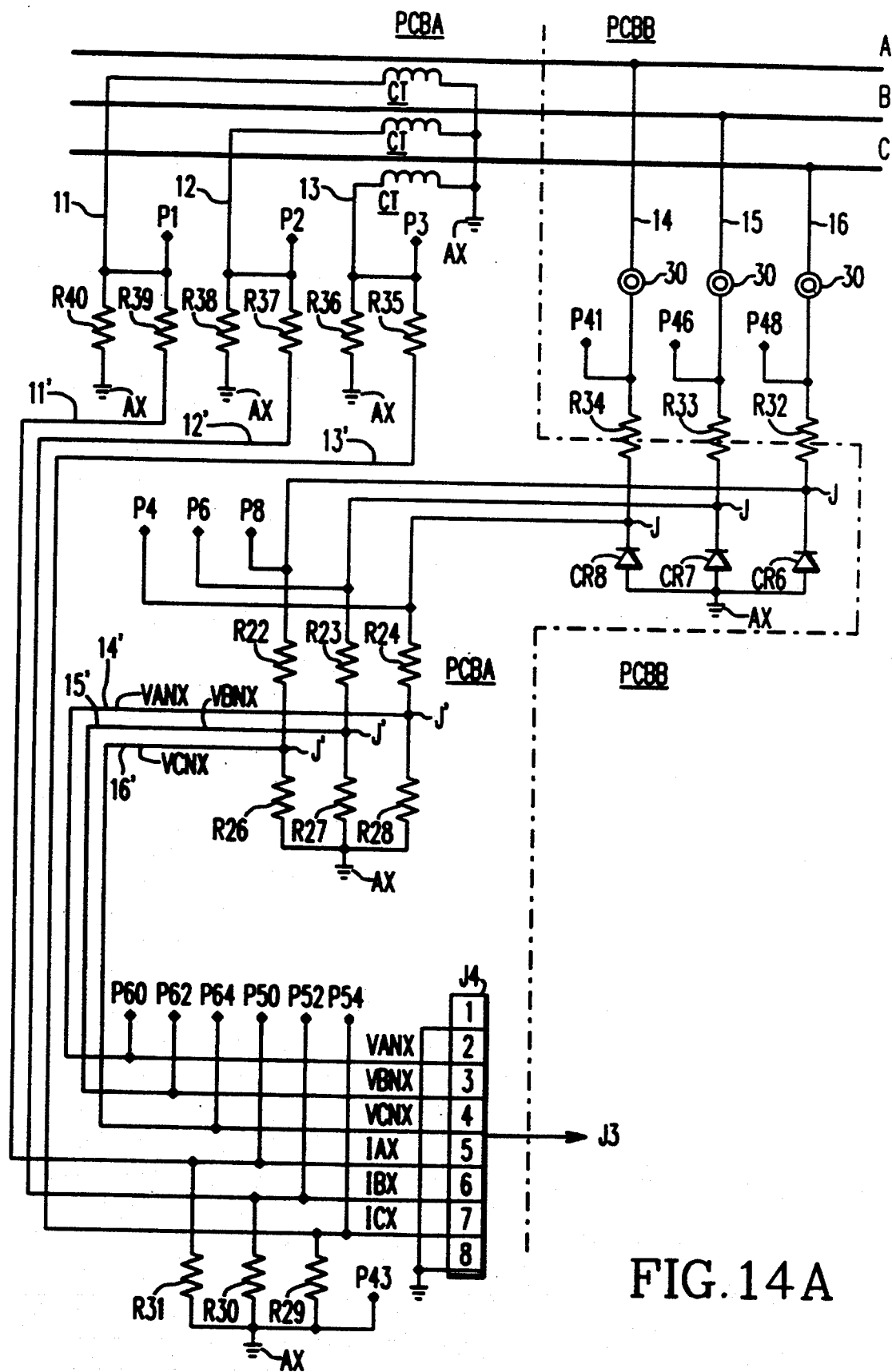
FIG. 14A shows the internal circuitry of the printed-circuit board of FIG. 14.

FIG. 14 is a diagrammatic representation of the current and voltage sensing circuit embodied in the PCBA board. The three current sensing transformers CT are shown with the respective local cables which are in line (through the PCBA board and the circuit breaker CB) with the AC line phases A, B, C. The secondaries are providing the respective current (via lines 11, 12 and 13) signals IA, IB, IC for the other printed-circuit board PCBB. Similarly, at junction points with the lug LG, simulated by nodal points 30, which are the rivets of fixation of FIGS. 4A and 7, the voltages VAN, VBN and VCN are derived (via lines 14, 15 and 16) by reference to a neutral point AX. The circuitry involved is illustrated by FIG. 14A. Line 11 from the A line secondary winding of transformer CT goes to the common ground. AX through a resistor R40, whereas through a resistor R39 and line 11' it reaches pin 7 of connector J4. Similarly, for line 12 from the B line secondary winding of transformer CT and for line 13 from the C line secondary winding of transformer CT (resistors R38 and R37 with line 12', in one instance, resistors R36 and R35 with line 13', in the second instance) go to respective pins 6 and 5 of connector J4. The three lines 11', 12' and 13' are also connected to the common ground via resistors R31, R30 and R29, respectively. With regard to voltage sensing, from rivet 30 respective series networks (resistors R34, R33 and R32 and corresponding rectifiers CR5, CR7 and CR6) are connected to the common ground AX, with their nodal points J going, by respective lines 14, 15, 16, through two series resistors (R22, R24; R23, R27; R24, R28) to the common ground AX. From the nodal points J' between resistors, respective line 14', 15' and 16' are derived and applied to pins 4, 3, 2 of connector J4, respectively. Thus, connector J4 which belongs to printed-circuit board PCBA is available for connection through a ribbon RB to a similar connector J3 present on printed-circuit board PCBB for receiving the derived signals representative of IAX, IBX and ICX (for the phase currents IA, IB and IC of the AC lines) and of the derived line-to-neutral voltages VANX, VBNX and VCNX.

Figure 15:
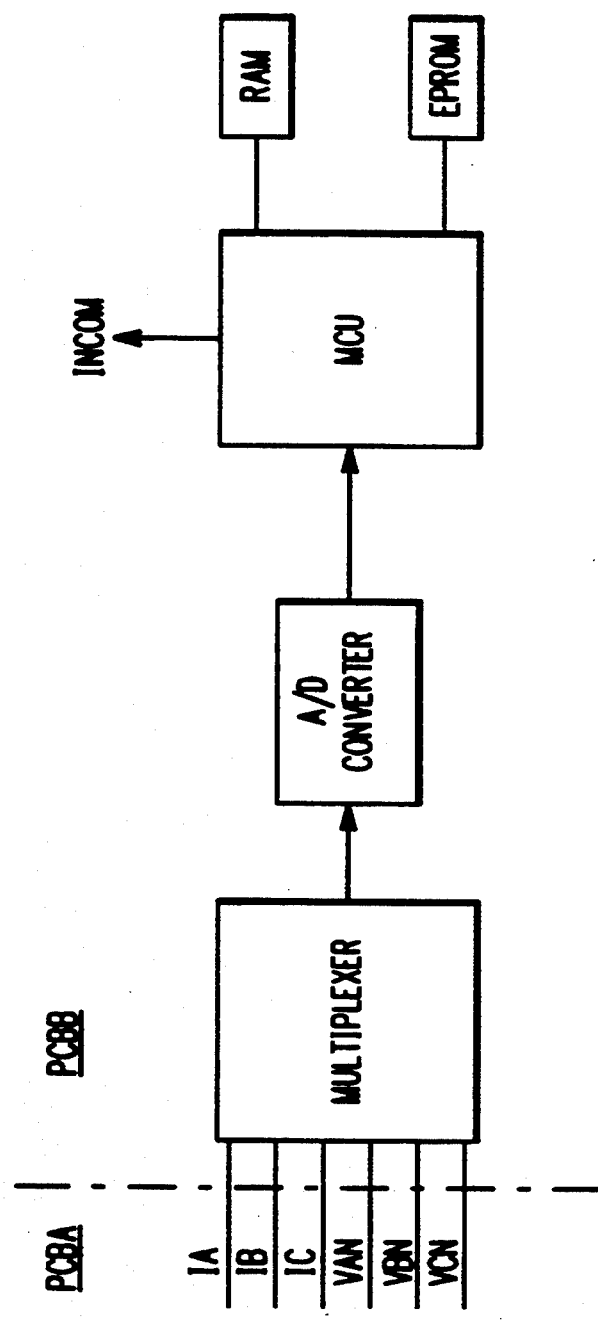
FIG. 15 is a schematic representation of the basic functions performed digitally by the printed-circuit board interfacing with an INCOM communication line to the PC computer.

FIG. 15 is a schematic view of printed-circuit board PCBB receiving, on one side, the sensed currents and the sensed voltages (IA, IB, IC, VAN, VBN and VCN) and communicating, on the other side, with the INCOM line which is a bi-directional line of communication with the PC computer. A multiplexer responds to the inputted analog current and voltage signals which are converted from analog to digital by an A/D converter. The digital signals so obtained are treated digitally for information processing and control by a microcomputer MCU using RAM and EPROM devices. As a result, at each local station involving two printed-circuit boards PCBA and PCBB, as shown in FIG. 15, local information and control commands are sent through the INCOM system to the PC computer for central energy monitoring.

Figure 16:
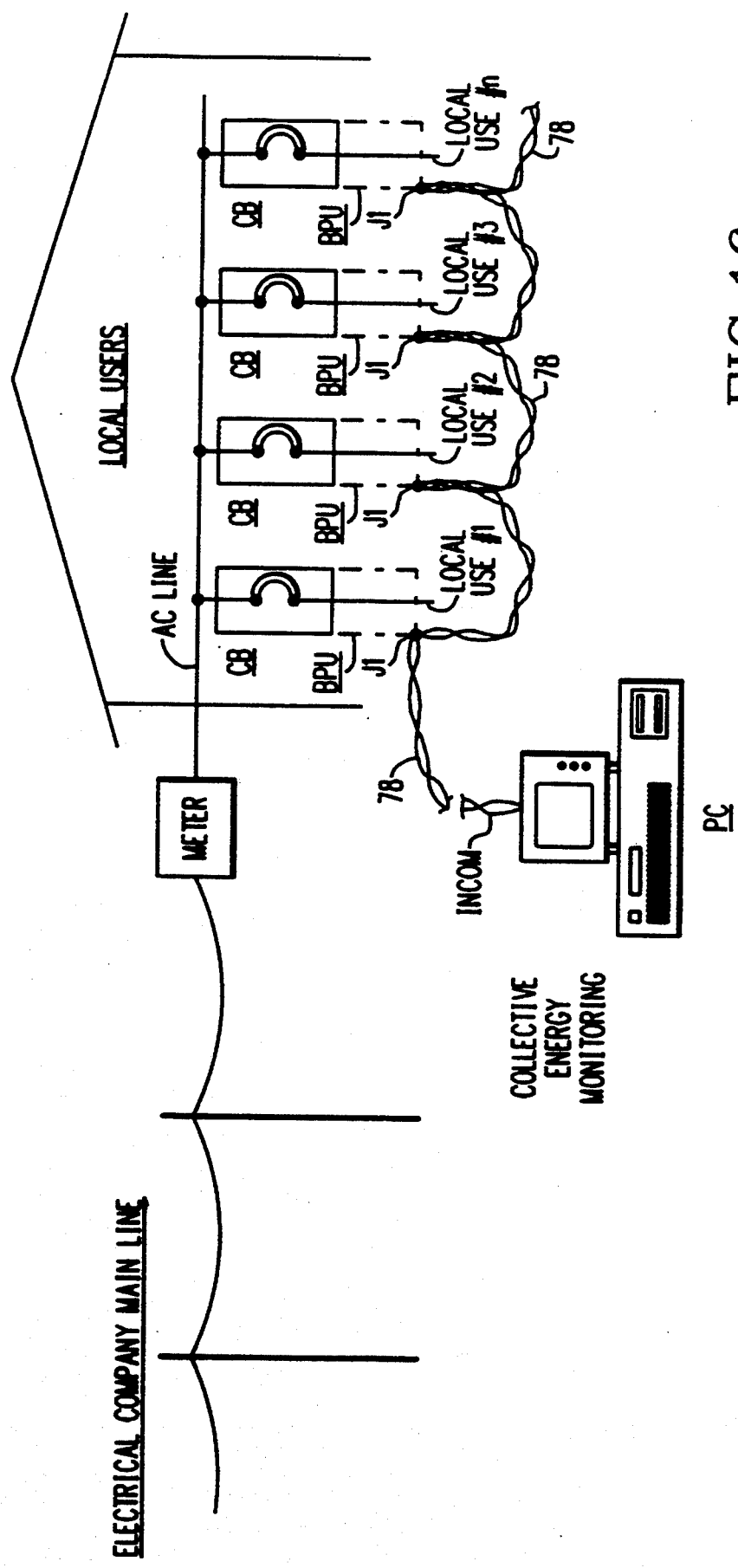
FIG. 16 is an overall view of the energy monitoring system according to the present invention.

FIG. 16 provides an overview of the energy monitoring system according to the present invention. The electrical company main line is arriving at a meter in front of the building where there are several local users (#1, #2, #3 . . . #n), each supplied from the main line through an individual circuit breaker CB, belonging to a panel-board. The backpack units BPU are shown mounted each upon one circuit breaker. From the INCOM junction J1 of each backpack unit, a daisy line 78 is interconnecting all the local PCBB boards to the PC computer station PC for energy monitoring and individual billing. For instance, the distribution of energy consumed behind the common meter is 20% for user #1, 10% for user #2, 0% for user #3 and 30% for user #n.

Figure 16A:
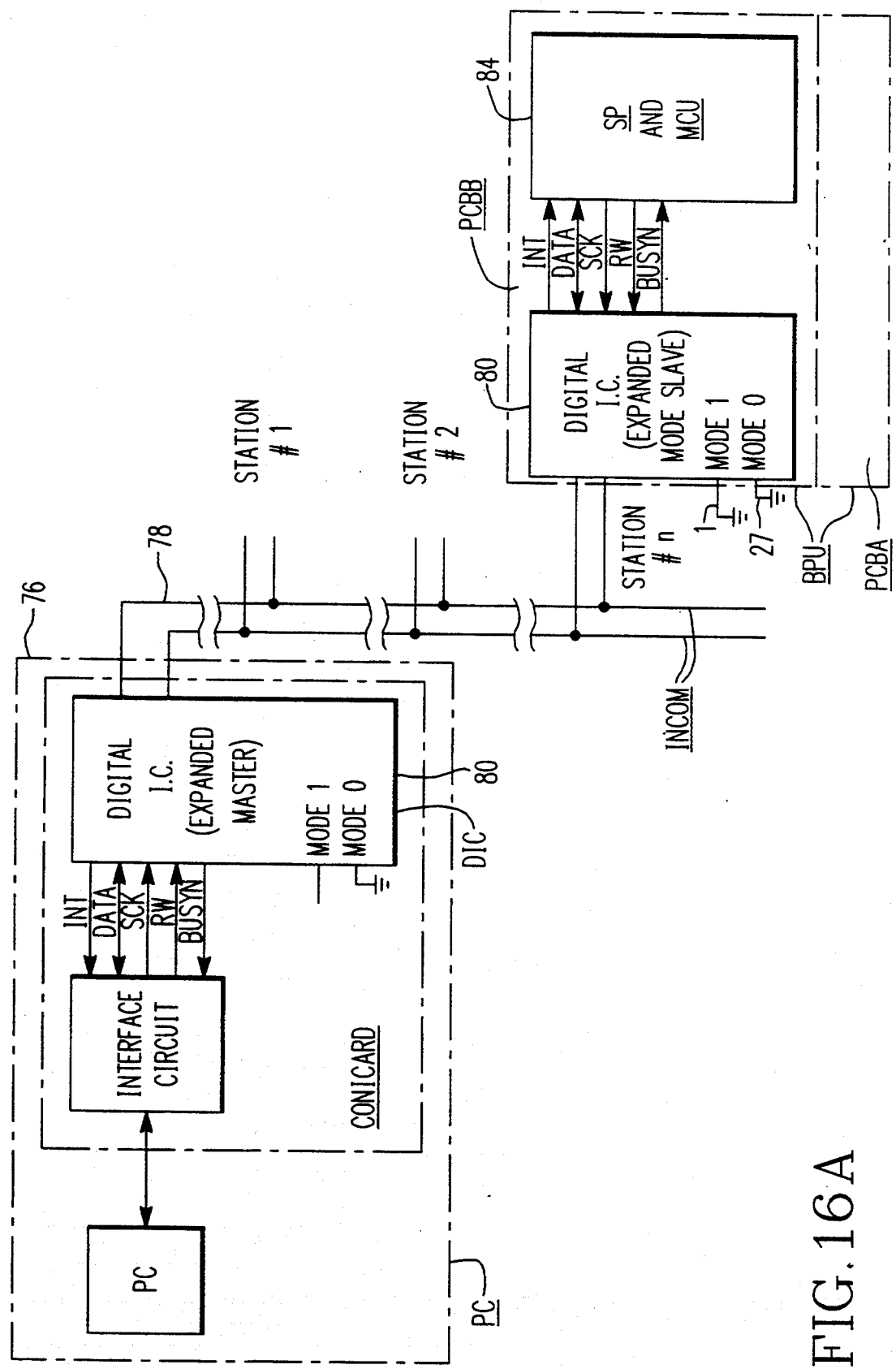
FIG. 16A shows the backpack unit according to the present invention mounted in an expanded mode slave relationship with the INCOM communication line to the PC computer.

FIG. 16A is borrowed from FIG. 1 of U.S. Pat. No. 4,644,547 which relates to the interface between a two-way communication network of the INCOM type. Transposed to energy monitoring as the present field of application, the printed-circuit PCBB fulfills the role of blocks 80 and 84 in a local station operating as an expanded mode slave.

In FIG. 16A, the PC station is indicated at 76 as the central controller which transmits and receives messages from the several remote stations over the bidirectional transmission line 78 of the INCOM. The PC computer communicates with a conicard including an interface circuit and a digital integrated circuit (DIC 80) operating as an expanded master. At the receiving end, there is another digital IC 80 operating in the expanded mode slave. These two units insure a dialog over line 78 between the two ends. Each of the digital IC's 80 is provided with a so many bits address field so that they can be addressed individually. In the expanded slave mode, the digital IC 80 responds to a particular command from the central controller 76 by establishing an interface with the local microcomputer MCU indicated at 84 as part of a Sure Plus Chip SP, within printed-circuit board PCBB. The digital IC 80 responds to an enable interface instruction in a message received from the central controller 76, by producing an interrupt signal on the INT line to the microcomputer at 84 permitting the latter to read serial data out of a buffer shift register over the bidirectional DATA line, in response to serial clock pulses transmitted over the SCK line from the MCU to the digital IC 80. The digital IC 80 also responds to a signal on a read write line RW from the MCU by loading serial data into the buffer shift register of the device from the DATA line in coordination with serial clock pulses supplied over the SCK line from the MCU. The digital IC 80 will respond to a change in the potential logic of the RW line by the MCU by incorporating the data supplied to it from the MCU in a so many bit message formatted to include all of a standard message transmitted by the central controller 76. As a result, the expanded slave device 80 enables bidirectional communication and transfer of data between the central controller 76 and the local MCU over line 78 in response to a specific enable interface instruction initially transmitted to the local expanded slave device 80 from the central controller. This interface remains in effect until the digital IC receives a message including a disable instruction, or until there is a command addressed to a different local station. There is also a busy signal over line BUSYN to the MCU whenever device 80 receives, or transmits, over line 78. For the purpose of disclosing the INCOM system in an expanded slave relationship with a local station, U.S. Pat. No. 4,644,547 is hereby incorporated by reference.

Figure 17:
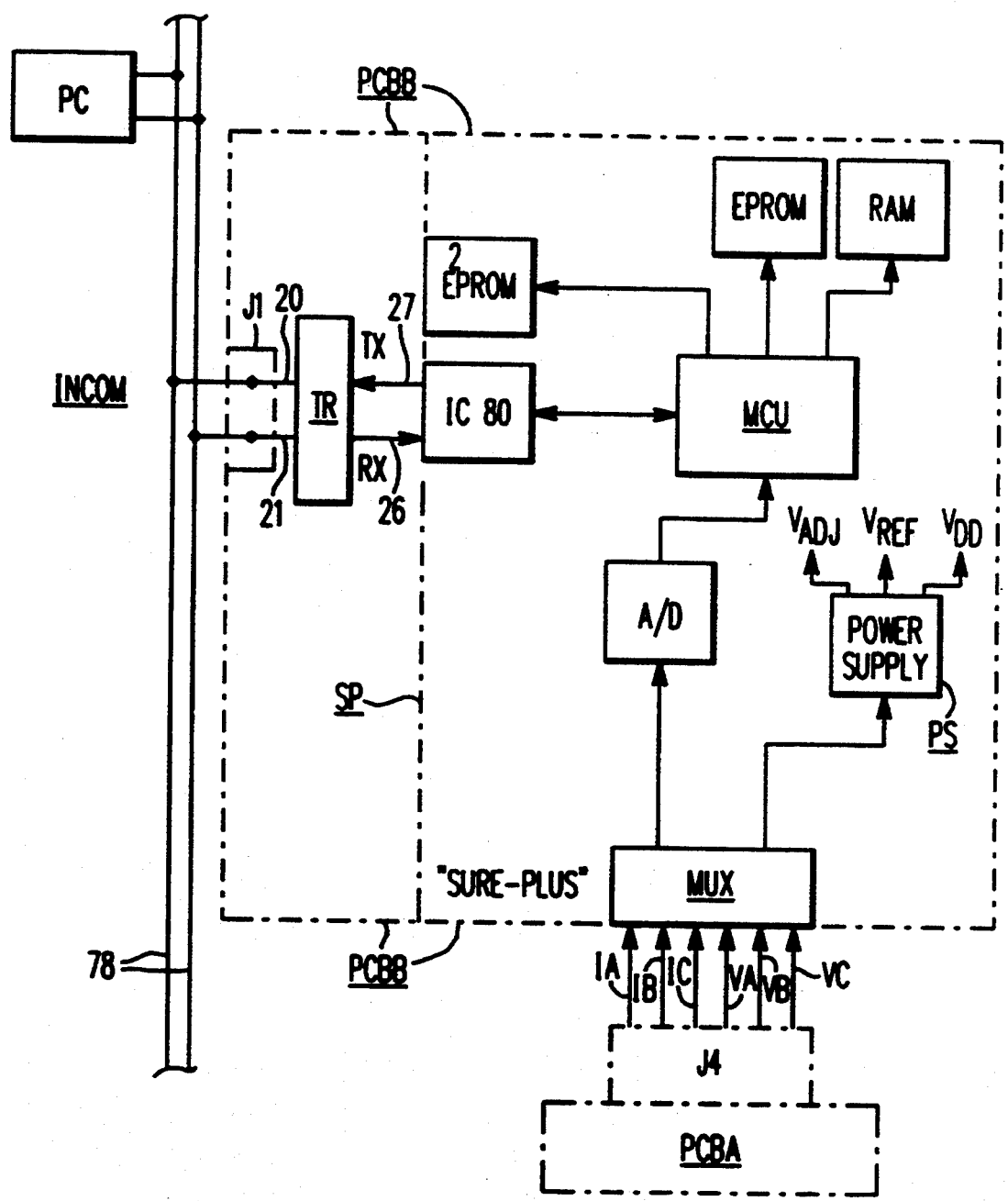
FIG. 17 is a diagram illustrating the INCOM communication line connection with the digital printed circuit board of a backpack unit through a Sure Plus Chip.

FIG. 17 is specific to the relation between the INCOM line 78 and the Sure Plus Chip SP. Within the PCBB board, a transmitting-receiving interface circuit TR is provided between the PCBB connector J1 and the SP digital device IC 80. It relates the message, to or from the INCOM, to the transmitting signal TX (message coming from the IC 80 to be transmitted on the INCOM to the PC computer) or to the receiving signal RX (message arriving on the INCOM for the addressed local station and to the IC 80). FIG. 17 also shows the MCU centrally disposed within chip SP, energized by the power supply PS and receiving the PCBA signals through the multiplexer MUX. An EPROM, an EEPROM (E2) and a RAM device are also provided within the PCBB board to assist the operation of the MCU.

Figure 18A:
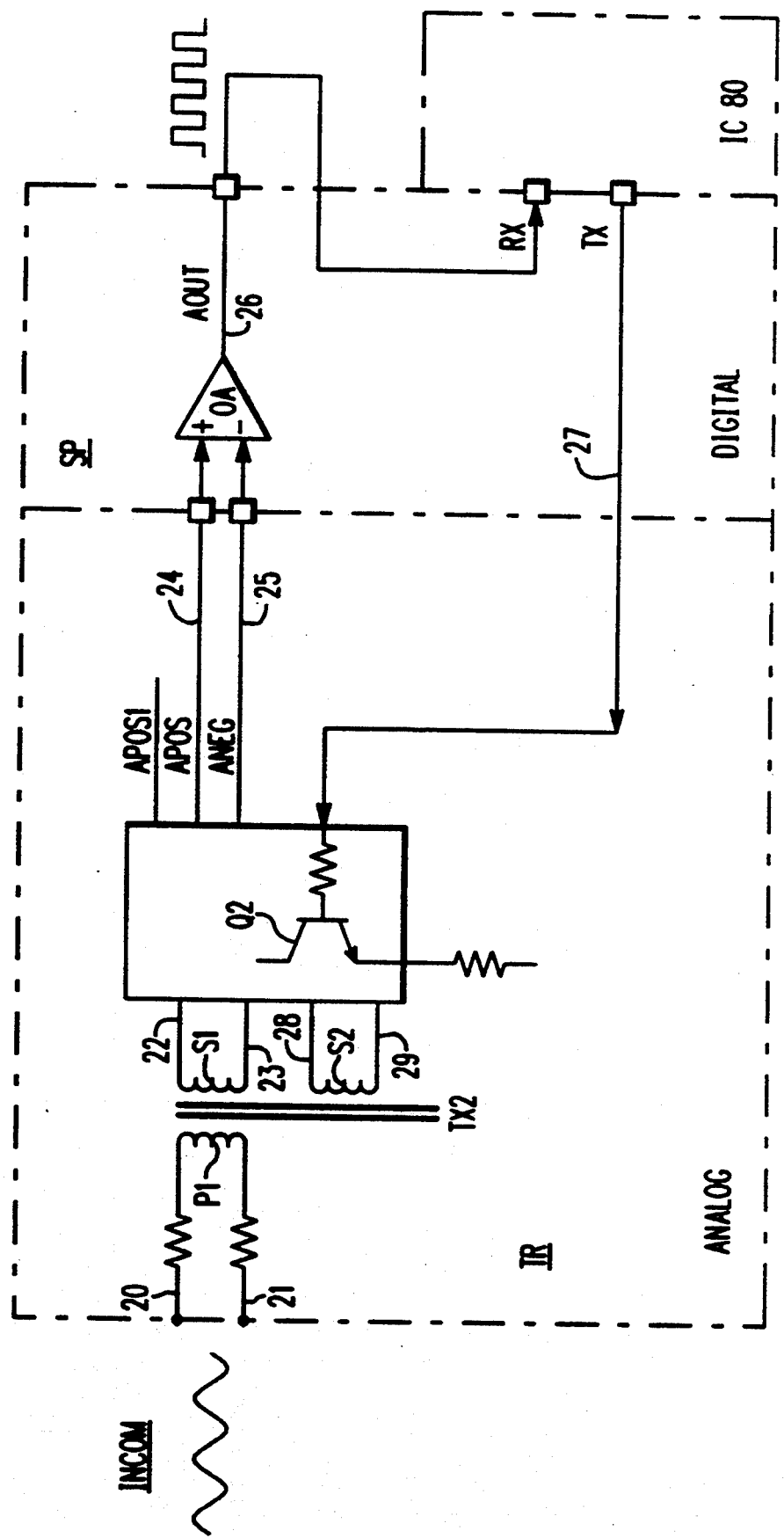
FIG. 18A is a diagram showing the interface between the INCOM communication line and the Sure Plus Chip of FIG. 17.

FIG. 18A is a block diagram representing circuit TR of FIG. 17. This is required because the high frequency signal characterizing each logic state of the transmitted message (address and data fields) of the INCOM has to match an equivalent logical state (based on a 5 volts potential) within the SP chip. Accordingly, at the input, namely, from connector J1 and the INCOM, lines 21 and 22 go to the primary P1 of a transformer TX2, the secondary S1 of which, by lines 22 and 23, go to circuitry centered on a solid state device Q2 (hereafter explained by reference to FIG. 18B) with an output line 24 carrying a signal APOS and an output line carrying a signal ANEG matching the alternate peaks of the input analog signal of lines 20 and 21. Lines 24 and 25 enter the chip SP and become the respective positive and negative inputs of an operational amplifier OA outputting on line 26 a signal AOUT which is the digital counter-part of the inputted analog signal of lines 20 and 21. Line 26 becomes for the IC 80 device the received signal RX from the INCOM system. Conversely, line 27 from the IC 80 device is transmitting from the PCBB board a digital signal TX which is applied to the base, electrode of the Q2 device, thereby leading through transformer TX2 to an outputted signal, for connector J1 and the INCOM, supplied by lines 20 and 21 of the primary winding P1 in response to lines 28 and 29 of secondary winding S2.

Figure 18B:
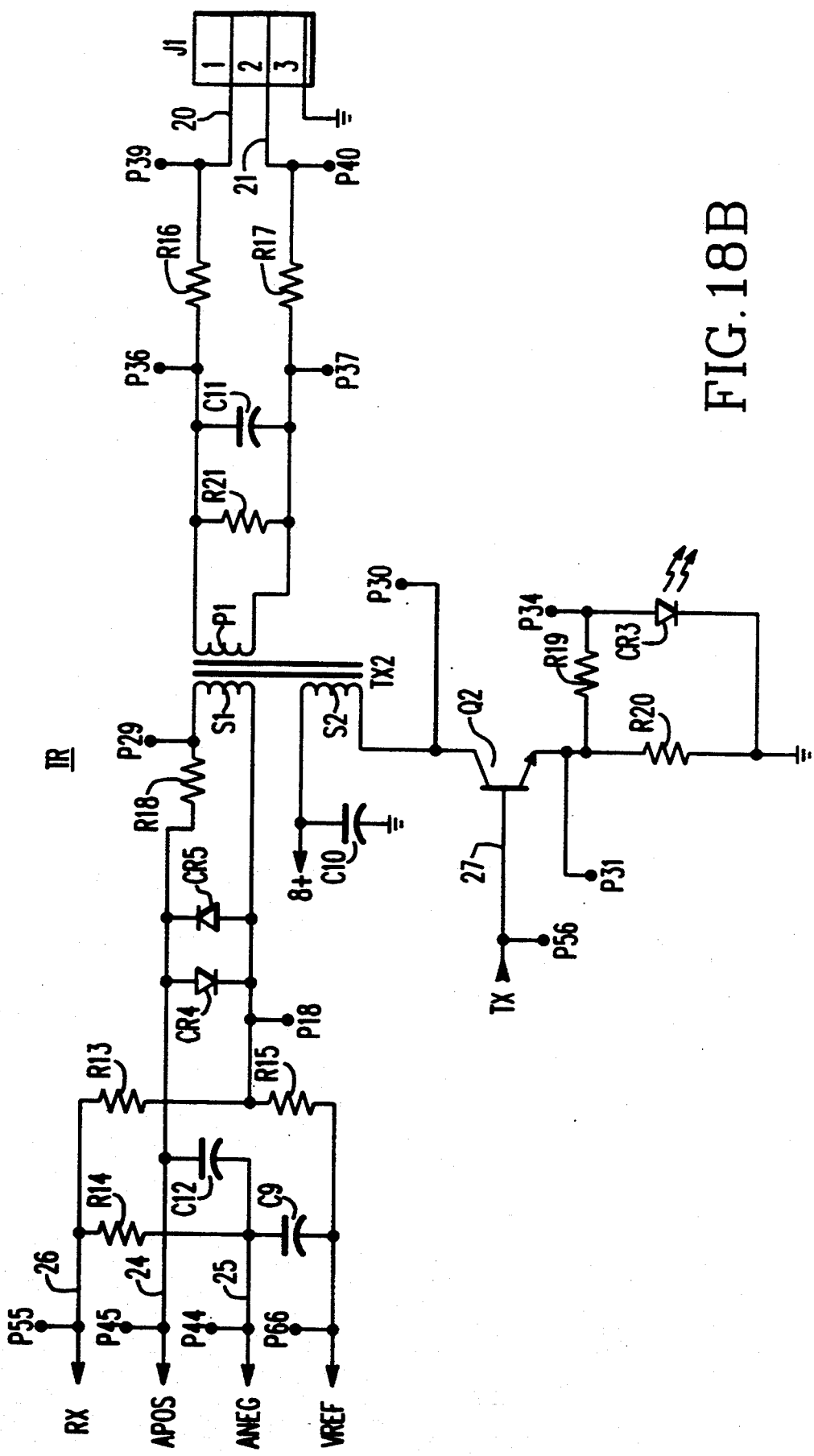
FIG. 18B illustrates circuitry used in the implementation of the diagram of FIG. 18A.

FIG. 18B shows specific circuitry used according to the preferred embodiment of the invention for circuit TR. Device Q2 is a 2N2222 transistor. It is mounted in series with the secondary winding S2 of TX2 between resistor R20 to ground A on the emitter electrode side and a 8 v potential beyond winding S2, on the collector electrode side. Potentials RX (line 26), APOS (line 24), ANEG (line 25), VREF (line 28) are outputted on the side of secondary S2.

Figure 19A:
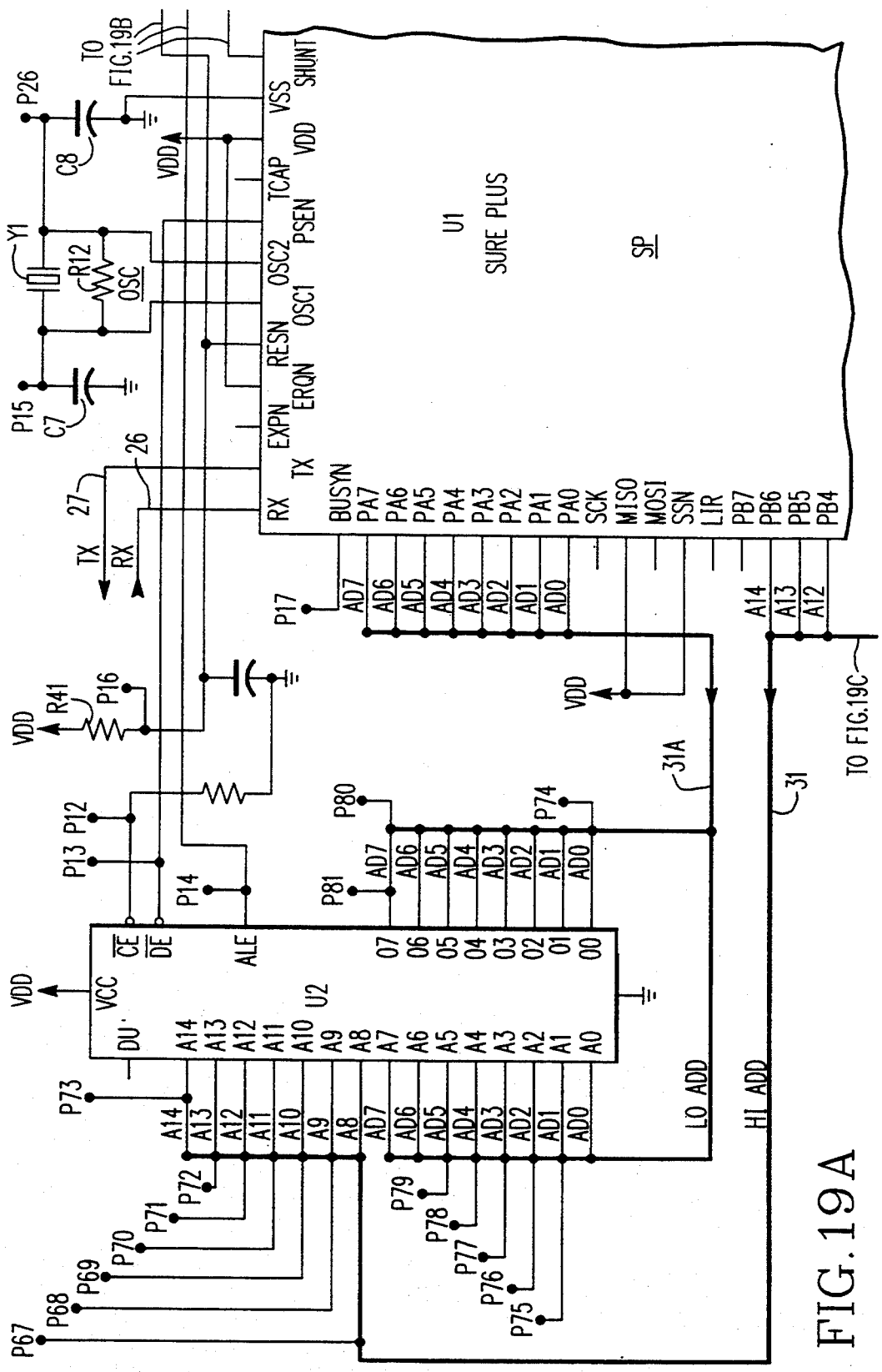
FIGS. 19A–19C illustrate the overall circuitry of the digital printed-circuit of the backpack unit according to the present invention.
Figure 19B:
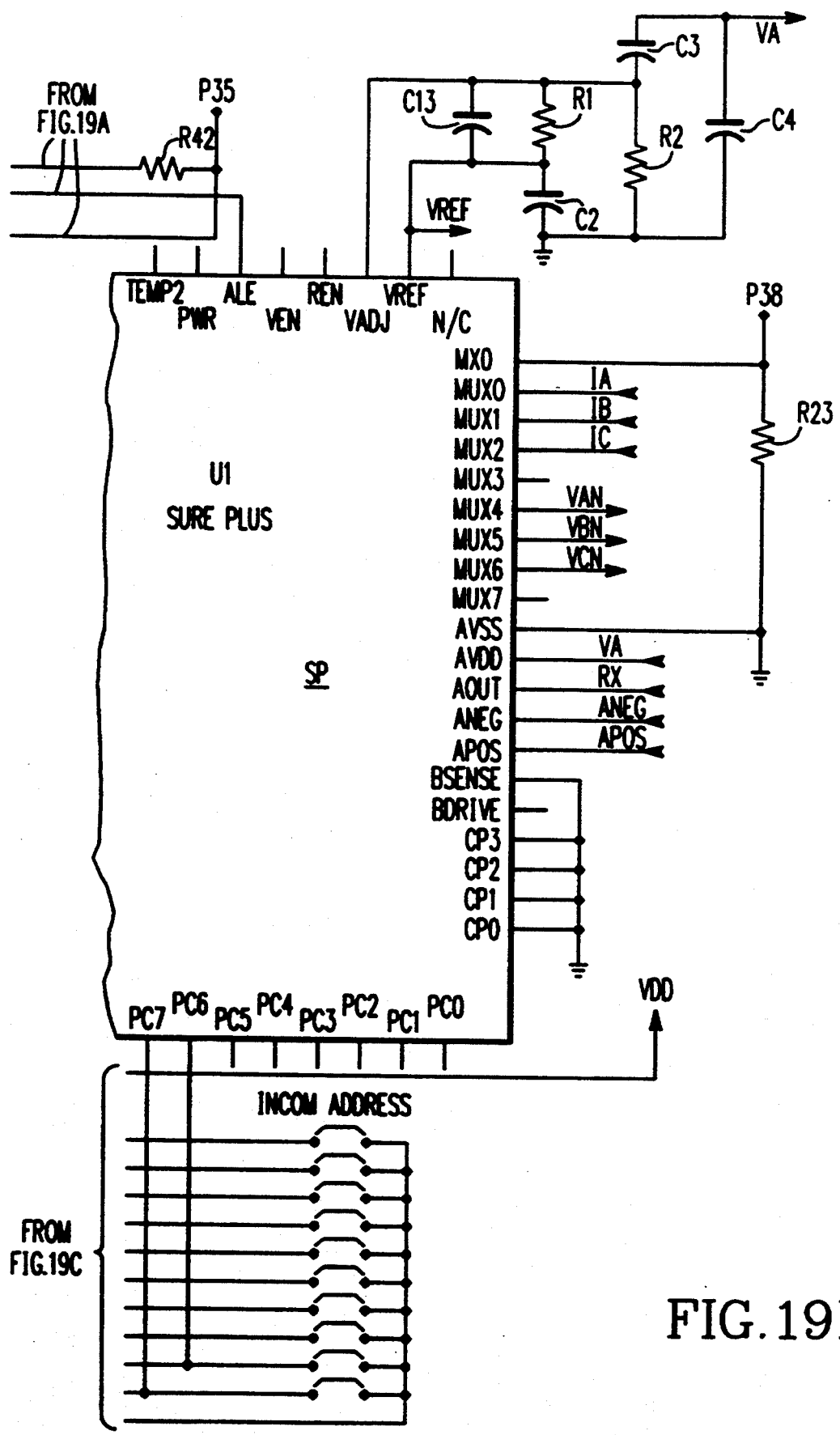
Figure 19C:
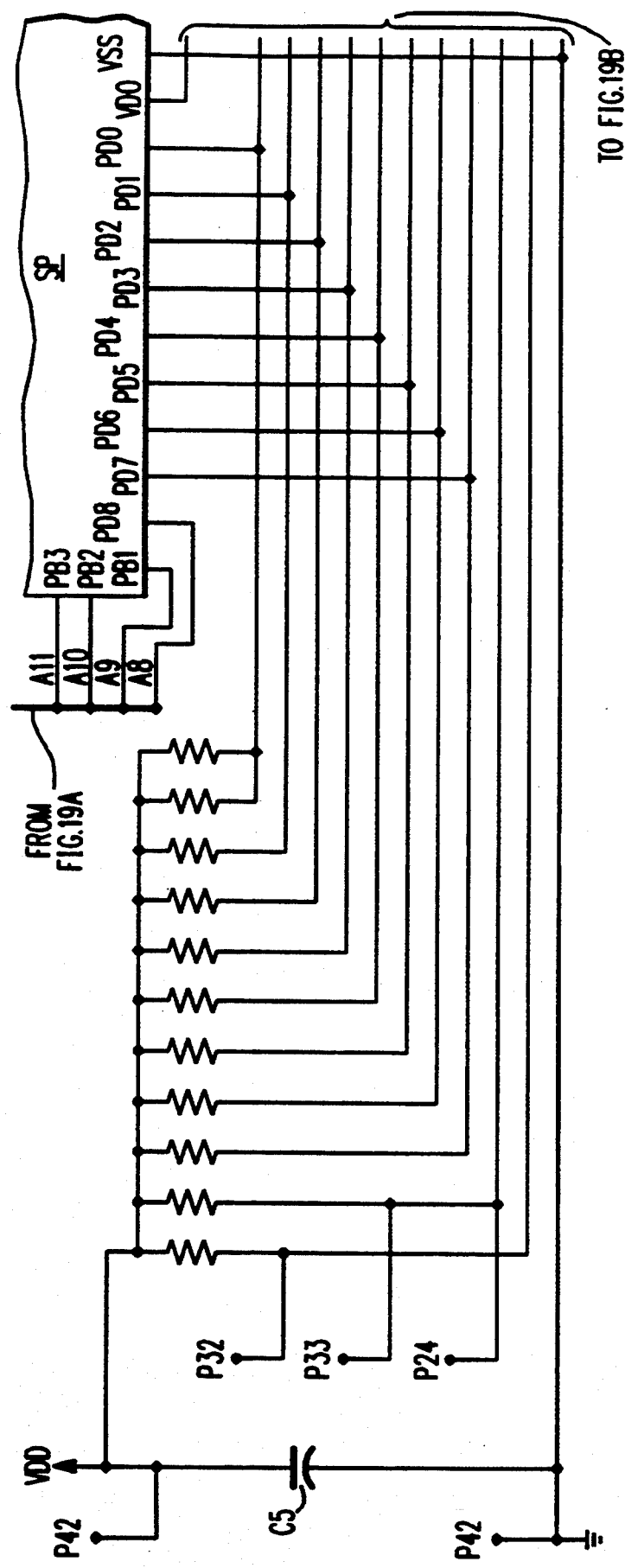

FIGS. 19A–19C provide a detailed description of the circuitry involved in the printed-circuit board PCBB, with a SURE PLUS Chip U1 at the center. The Sure Plus Chip unit U1 involves a microprocessor (model 87C257 on the market). It is based on a MC68HCO5CG Single-Chip Mode Pinout (of Motorola), which is a 80 Pin Quad Flat Package. It includes, associated with the microprocessor, a random access memory (RAM) for the purpose of writing data to be saved, or reading saved data. It also includes an EEPROM device, which is an electrically erasable programmable memory, for the purpose of being a nonvolatile memory, e.g. which will not be erased upon an unexpected loss of power. The U1 unit also includes the power supply PS and the A/D conversion unit of FIGS. 15 and 17. The IC 80 device is also included in the SP. The Sure Plus is fully disclosed in the two last cross-referenced patent applications. For that reason, they are hereby incorporated by reference.

FIGS. 19A–19C show associated with the SP unit U1, a device U2 which is an erasable programmable read only memory (EPROM) also shown in FIG. 17. Its purpose is to provide a programmed memory to be used by the central processing unit constituted by unit U1. The two units communicate with one another through lines 31A and 31, which relate to the LO-ADD field and the HI-ADD field of the message exchanged. One is for the address field, the other for the data field. An oscillator OSC is provided to establish the timing of the digital processing sequence. This is all described in the afore-stated two incorporated-by-reference patent applications.

FIGS. 19A–19C show lines 26 and 27 affected to received and transmitted signals (RX, TX) regarding the INCOM, with their corresponding pins (80 and 79) on the U1 unit. The multiplexer MUX is illustrated by arriving points MUX7 to MUXO (pins 52 to 59) for the PCBA board signals VCN, VBN, VAN, IC, IB, IA, respectively. Pins 24 to 34 correspond to the logic bits established between contacts 1 to 10 and 11 to 20 for the local address of the user's station involved. This address will be identified by the MCU to match the incoming, or the outgoing message, when a message has to be received, or transmitted. Pins 49, 48 and 47 correspond to signals RX, ANEG and APOS of lines 26, 25 and 24 of FIG. 18A. The power supply PS provides a reference voltage VREF (pin 62) and a regulated supply AVDD (pin 50). The microprocessor generates a signal ALE (pin 66) used as the "address latch enable" recognizing the relevant address in the message, and which is sent by the MCU to the EPROM. Thus, program execution is performed according to PA7 to PAO for the HI-ADD, PB2 to PB6 for the LO-ADD in relation to the EPROM. A/D conversion is effected in response to the multiplexer inputs (pins 51 to 60). Power supply outputs are on pins 62, 63. INCOM reception is on pins 47 to 49. INCOM transmission is on pins 79, 80 and 1.

Figure 19D:
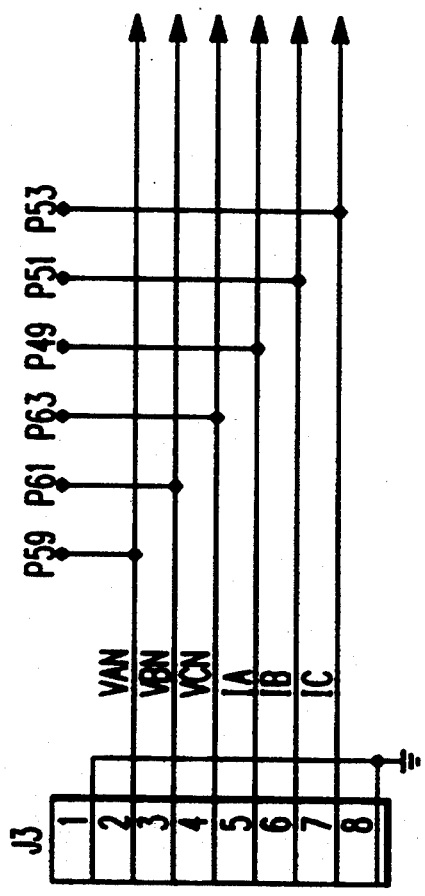
FIG. 19D shows the connector associated in the circuitry of FIGS. 19A–19C with the signals received from the current and voltage printed-circuit board.
Figure 19E:
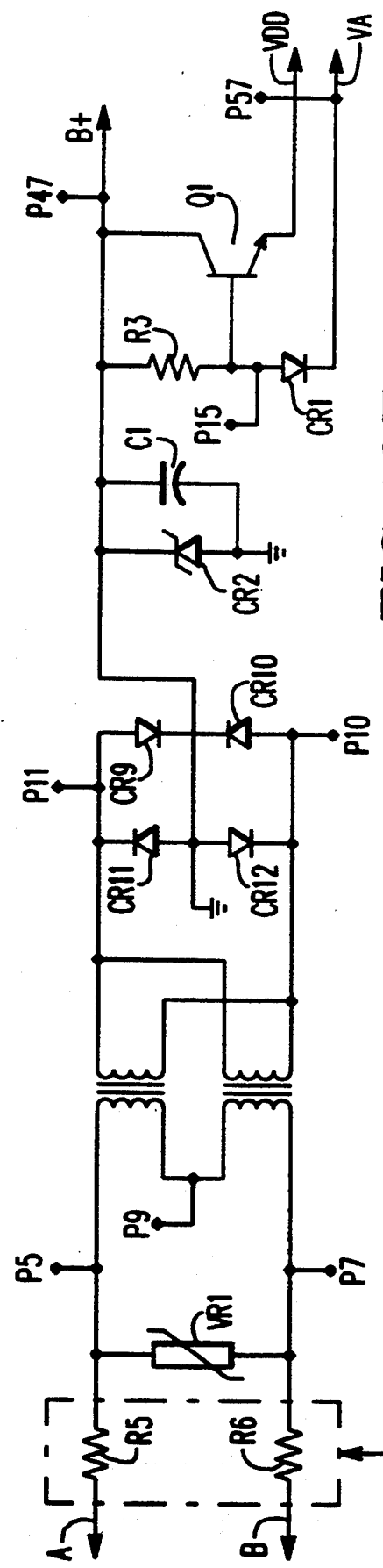
FIG. 19E illustrative of circuitry involved for the power supply in the board of FIGS. 19A–19C.

FIG. 19D illustrates the connections between the J3 connector and the VAN, VBN, VCN, IA, IB, IC receiving pins of the chip SP. FIG. 19E illustrates the circuitry of the power supply derived from phase lines A and B for VA and VDD.

Having described the circuitry involved in the preferred embodiment of the invention, the operation of the energy monitoring system according to the present invention will be described in the context of the aforestated combination of an INCOM system and a SURE PLUS Chip system.

The main function at a local station is to determine instantaneously the energy consumed. Such local determination is based on sampling of the phase voltages and of the phase currents. Power is the product of V (the voltage) and I (the current). E (the energy) is the sum of the sampled products $VA \times IA$, $VB \times IB$ and $VC \times IC$. According to the present invention, sampling is preferably effected according to a sampling rule defined by the following TABLES I and II. Sampling is performed by groups of 8 samples, each referred to hereinafter as an octave. Within such octave, or group of 8 samples, the samples are labelled 0 to 7, each of which being triggered so that an odd number sample occur at 90 degrees from the preceding even number sample, and that an even number sample occur at 112.5 degrees after the preceding odd number sample. Therefore, the succession for the first octave will be according to TABLE I herebelow, the degrees being counted in electrical degrees of the sinewave for the voltage VA, VB, VC), or for the current (IA, IB, IC).

TABLE I

| OCTAVE # 1 (origin Oo at zero degree) ||
|---|---|
| Angle Theta | Sample No |
| 0.0 | Oo |
| 90.0 | 1 |
| 202.5 | 2 |
| 292.5 | 3 |
| 45.0 | 4 |
| 135.0 | 5 |
| 247.5 | 6 |
| 337.5 | 7 |

The rule will also be that from one octave to the next there will be a delay of 98.4 degrees. Therefore, if the first sample of the next octave starts at 01, the latter will be at 98.4 degrees relative to Oo. Similarly, the next octave will start at 02, which corresponds to $2 \times 98.4 = 196.8$ degrees. Therefore, the fifteen subsequent octaves after the octave of TABLE I will be according to TABLE II herebelow:

TABLE II

| Angle Theta | OCTAVES #2 to #16 |
|---|---|
| 98.4 | 01 |
| 196.8 | 02 |
| 295.2 | 03 |
| 33.60001 | 04 |
| 132 | 05 |
| 230.4 | 06 |
| 328.8 | 07 |
| 67.19998 | 08 |
| 165.6 | 09 |
| 264 | 10 |
| 2.399964 | 11 |
| 100.8 | 12 |
| 199.2 | 13 |
| 297.6 | 14 |
| 35.99997 | 15 |

After such a succession of 16 octaves, thus a total of 128 samples, the same sampling process is repeated with a delay of 120.94 electrical angles.

Figure 20:
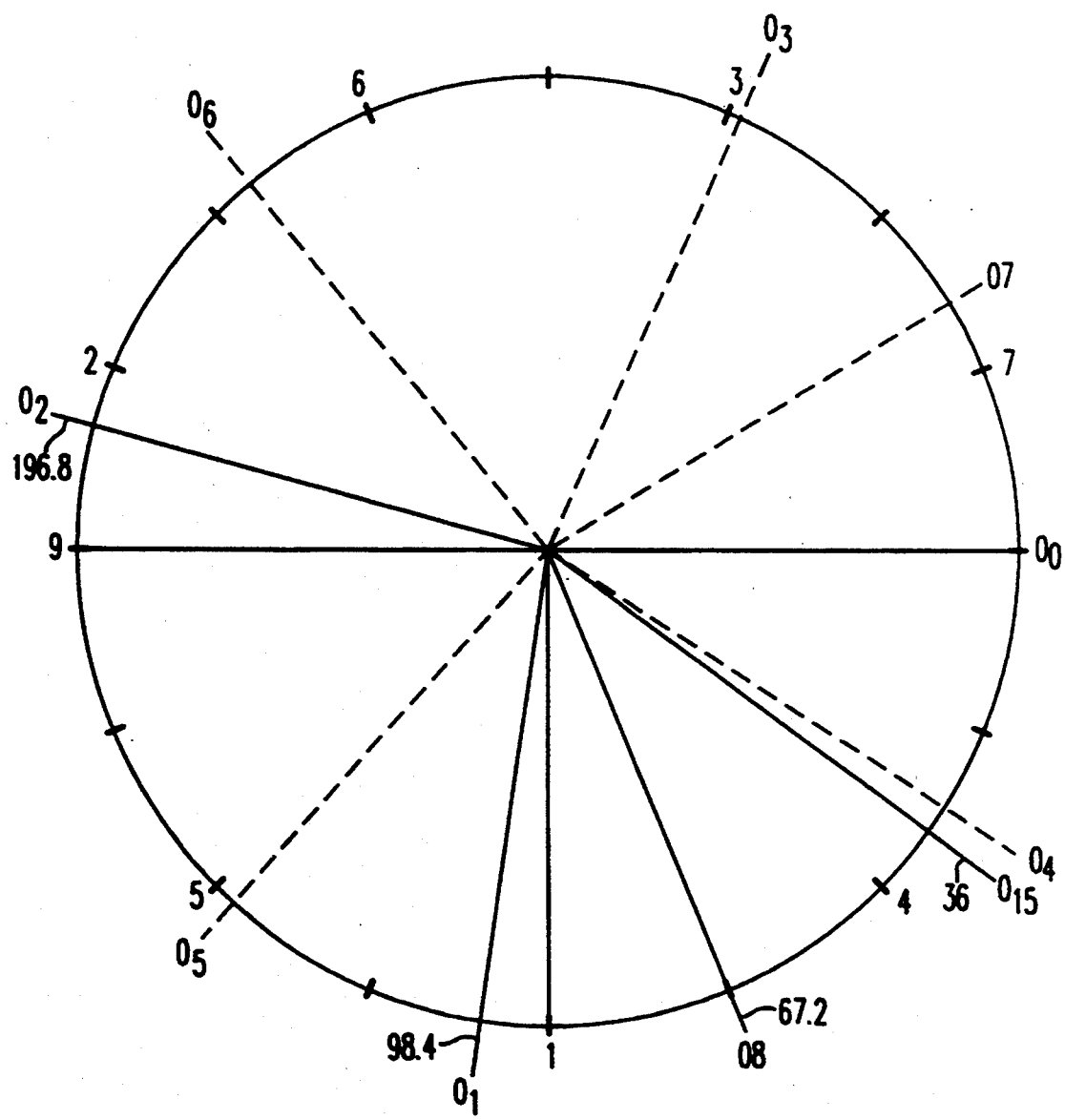
FIG. 20 illustrates the angular distribution about a circle of the 8 samples of the first octave under the sampling process according to the preferred embodiment of the invention.
Figure 21A:
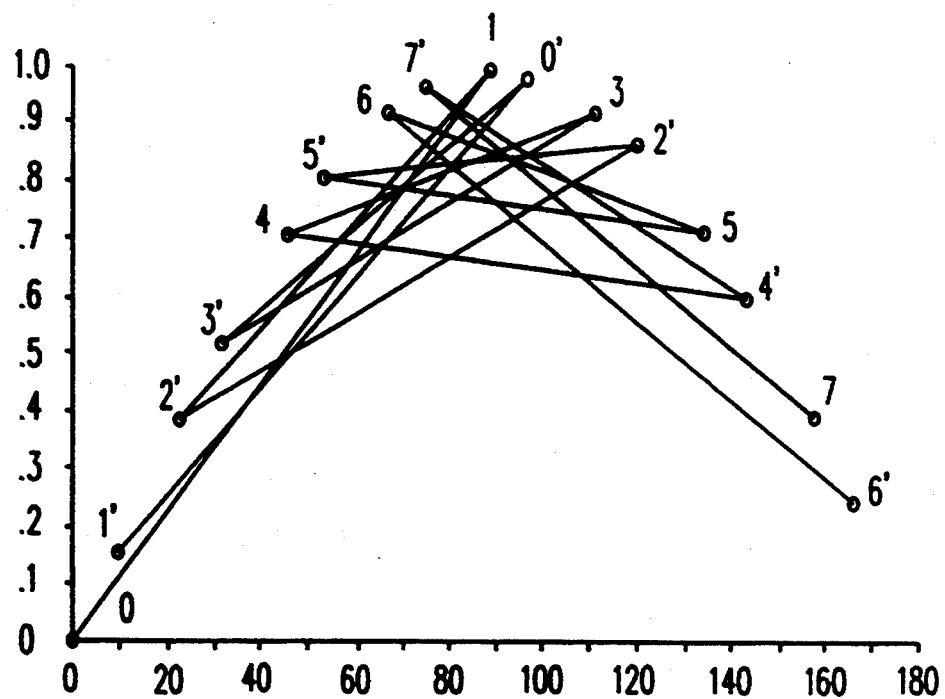
Figure 21B:
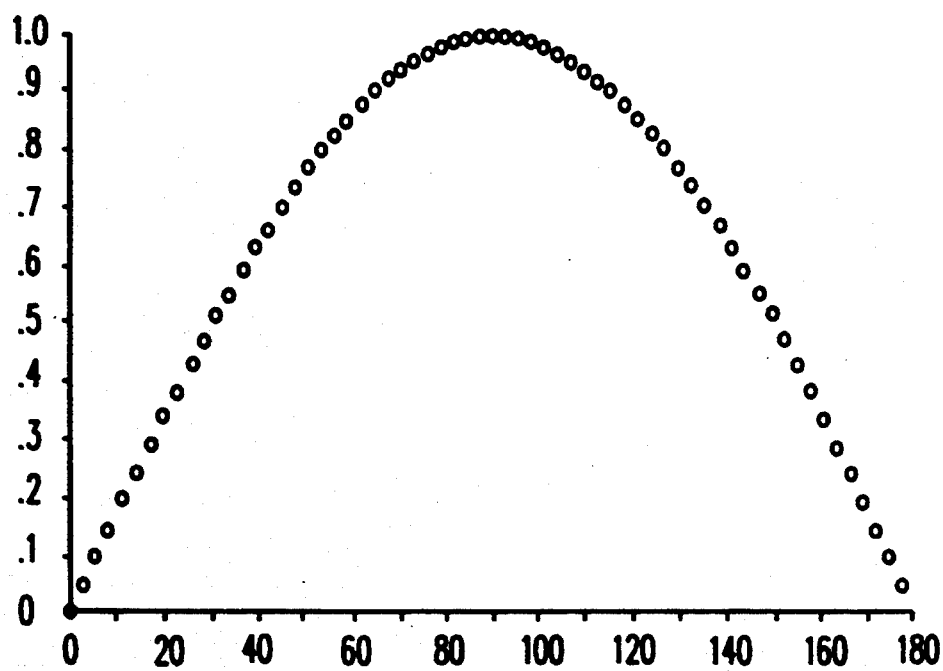
FIG. 21B is the corresponding half-cycle of the fundamental waveform.

It will be observed that this amounts to distributing the 8 samples of an octave evenly over a half-cycle of the sine wave. This will appear first from FIG. 20 wherein the eight samples Oo to 7 of the first octave are shown distributed around the trigonometric circle. 01 appears at an angle of 98.4, which represents a delay of 98.4+22.5=120.9 degrees from the last sample 7 of the first octave. Similarly, the first samples in the successive 15 octaves are spread from 02 (at 196.8 degrees) to 015 (at 36 degrees). Each octave has its samples distributed at 22.5 (90/4) and at 45 degrees (90/2) from one another. Also, as shown by octaves 08 and 016 after 8 octaves the sample of one octave falls upon one of the original 90/4 divisions of the circle. Referring to FIG. 21A, the seven samples 1 to 7 for a group of 8 samples initiated at a zero-crossing (0 degree) are shown in relation to a half-cycle of the fundamental wave. The next octave is shown distributed in between, as indicated with prime numbers. FIG. 21B shows the corresponding half-cycle. From these two Figures it appears that the sampling process generates a cumulative series of samples distributed closely side-by-side along the sinewave, thereby maximizing the accuracy. This is performed for each of the three phases of the voltage VA, VB, VC and of the current IA, IB, IC. In Appendix A is given a Listing of the Sampling for the 8 octaves. Having locally sampled voltage and current with the microcomputer and the adjunct circuitry within the SURE PLUS chip, the object, according to the present invention is to establish instantaneously how much has been accumulated locally of Energy and of the Demand, and to have such information ready to be read, or withdrawn, by the PC computer through the INCOM. Therefore, the PCBA printed-circuit will first provide the analog signals inputted into the Sure Plus chip SP, which is part of the PCBB printed-circuit, where A/D conversion is performed by the microprocessor MCU, and where calculation of the product $V \times I$ occurs continuously and instantaneously.

Figure 22A:
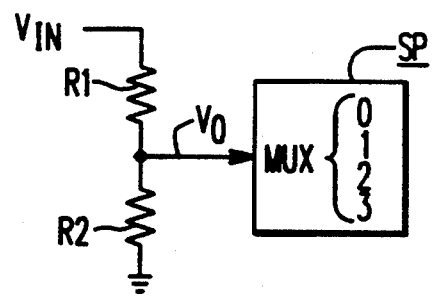
FIG. 22A is a diagram showing the interface between the inputted signals with the chip SP.
Figure 22B:
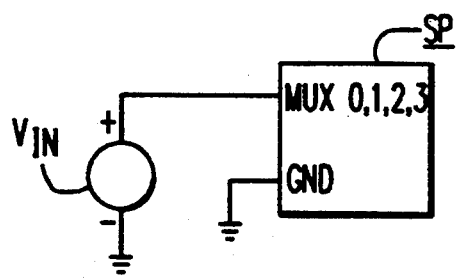
FIGS. 22B and 22C show the voltage and the current mode of chip operation in the A/D conversion process, with FIGS. 22D and 22E being their equivalent circuits, respectively.
Figure 22C:
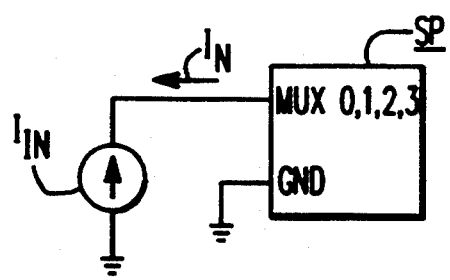
Figure 22D:
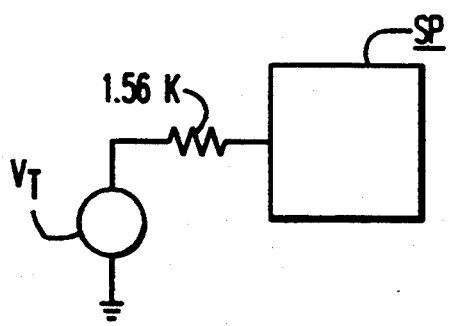
FIG. 22F shows circuitry of the chip SP performing a change from voltage to current mode depending upon the input signals.
FIG. 22G gives the reference to a fundamental cycle for the two aforestated modes.
Figure 22E:
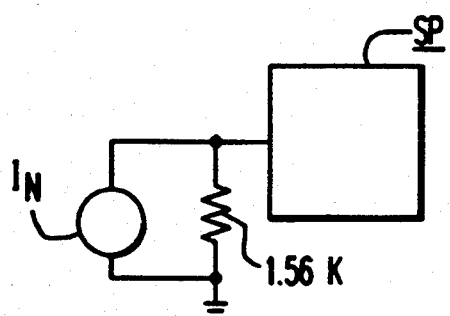
Figure 22F:
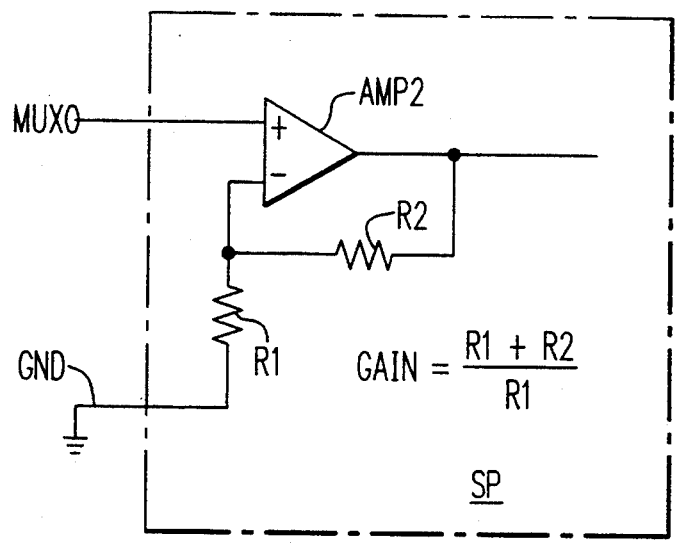
Figure 22G:
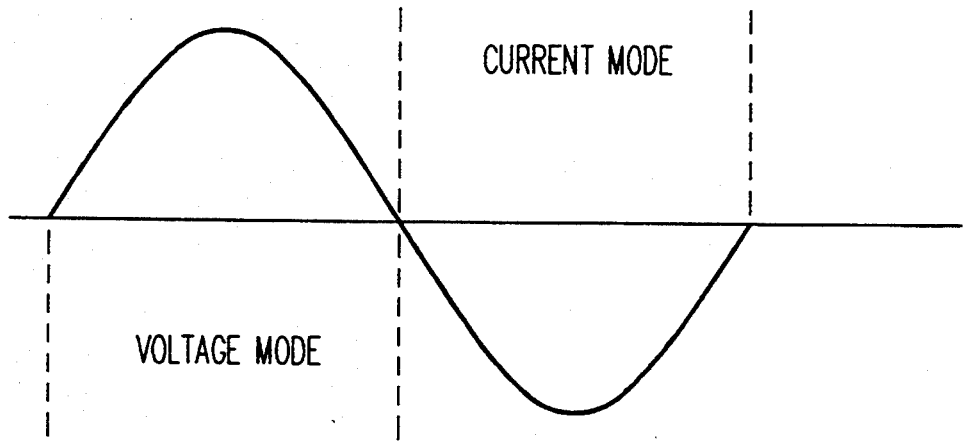
Figure 23:
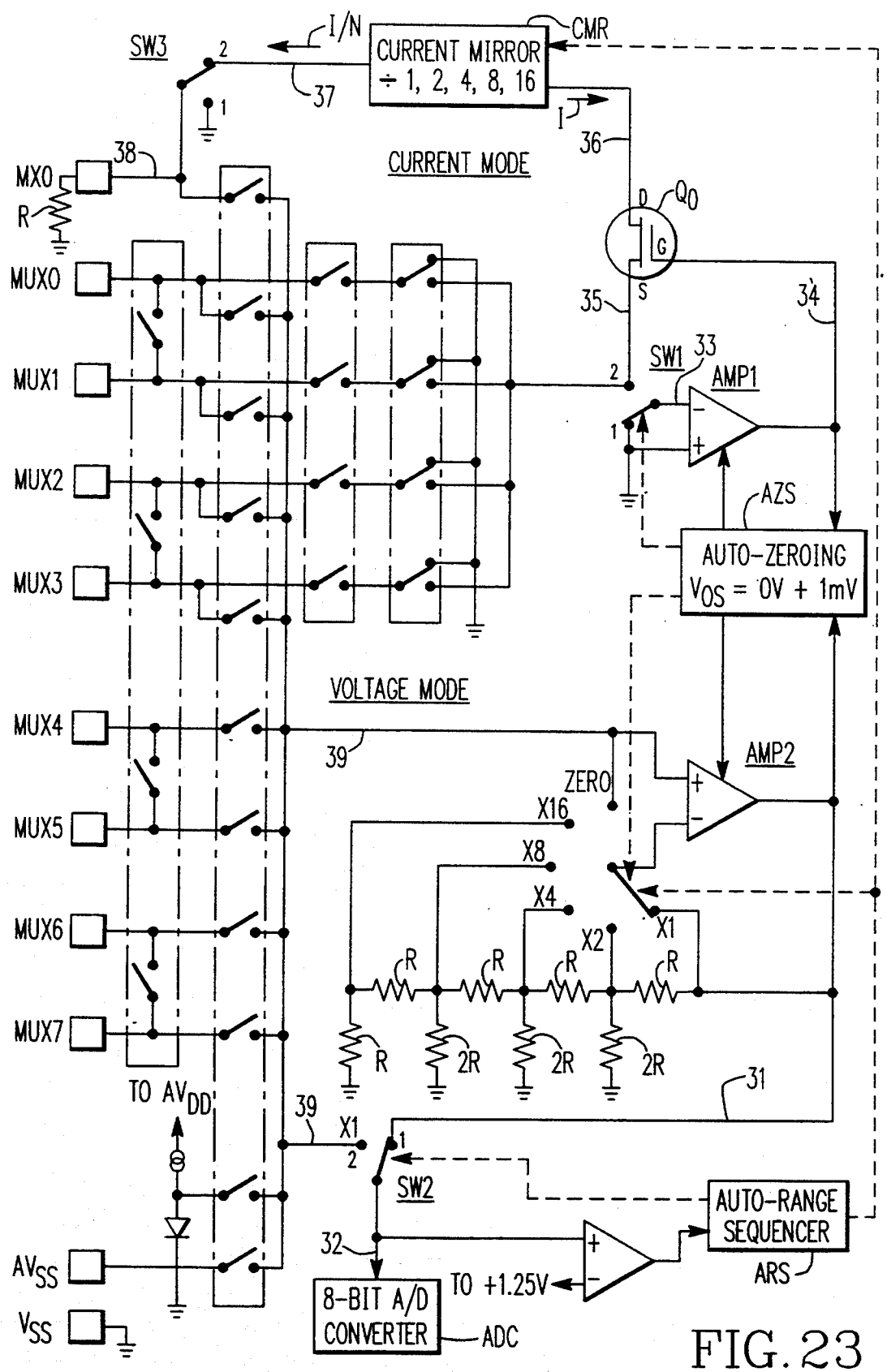
FIG. 23 is a diagram illustrating the circuitry involved in the chip SP of FIG. 19 for the current and voltage modes of FIGS. 22B and 22C.

Referring to FIG. 22A, the input signal from the PCBA printed-circuit is derived from the midpoint between two serially connected resistors R1, R2 connecting the input voltage VIN to ground. The output voltage Vo goes to the multiplex pin (MUXO, MUX1, MUX2 or MUX3) of the chip SP. A/D conversion is performed for the phase currents IA, IB, IC as sampled. In the process, circuitry within the chip SP will create a return to ground. Two situations arise. One is a high impedance input, typical of a voltage source (as illustrated by FIG. 22B), the other (corresponding to a current source) is a very low input impedance amounting to a short-circuit (as illustrated by FIG. 22C). In the first instance, the chip SP will be said to operated in the voltage mode, whereas in the other instance the operation will be said to be the current mode. In the voltage mode, the chip will operate from 0 to a maximum voltage of +2.5 volts. In the current mode, current is flowing from the chip SP (negative current) with a maximum value of −1600 microamperes. If an input signal source is designed to have an output impedance of 1.56 k ohms which is equal to the full scale voltage divided by the "full scale current, both current and voltage modes can be used without any additional scaling factors. This situation is illustrated by FIG. 22D (also known as the Thevenin equivalent) and by FIG. 22E (also known as the Norton equivalent). As shown by FIGS. 22F and 23, the chip SP is internally designed so as to immediately adopt under MCU operation either the voltage or the current mode, depending upon whether the input is VIN of FIG. 22B (high input impedance), or IIN of FIG. 22C (short circuit input). Between the multiplex input (MUXO) and ground (GND) are the respective negative and positive inputs of an operational amplifier AMP1 which is designed for autozero operation In the "current mode", a feedback loop between the operation amplifier output and the negative input includes the gate electrode G and the source electrode S of a FET device Qo such that, when an input causes a VIN negative current to flow from the chip SP, the output of the amplifier is driven positive until the source electrode S supplies a current equal to the VIN current holding the input at zero volts. This is the short-circuit input, or "current mode". In the "voltage mode" amplifier AMP1 and FET device Qo are disabled and any positive voltage Vo appearing at pin MUXO will be translated by normal amplification through a second amplifier AMP2. In the "voltage mode", amplifier AMP2 offers a high impedance to VIN and an essentially zero current flows from MUXO, so that pin MUXO follows the input signal VIN in the "voltage mode", instead of being "zero" as in the "current mode". Considering now FIG. 22G which shows a full cycle of the fundamental, when the signal is positive (first half-cycle) the operation is in the "voltage mode". When the signal is negative (second half-cycle) the operation is in the "current mode". Having explained what are these two modes provided with the chip Sp, it will be observed that whenever there is A/D conversion, only the positive voltage of the voltage phase sample is used whereas, for current sampling the current may be either positive, or negative. For current sampling, if it is positive (first half of the curve of FIG. 22G) A/D conversion in the voltage mode will take place. If it is negative, as shown by FIG. 22F there will be a zero output in the "voltage mode". Zero means a "current mode" situation, and A/D conversion will be done again in the "current mode" according to FIG. 22C, or FIG. 22E.

The analog voltage/current measurement system of FIG. 23 can accurately measure in the voltage mode input voltages from 0 to +2.5 volts and input currents from 0 to −1.6 milliamps. In the best embodiment of the invention, it includes as major features:

An 8-bit analog-to digital converter ADC;

An auto-ranging system ARS used for input scaling;
An auto-zeroing controller AZS applied to input amplifiers AMP1 and AMP2;
An 8 channel input signal multiplexer (MUX0-MUX7);
4 channels that can read currents and voltages for phase current sampling;
4 channels that are used for voltage input only for phase voltage sampling;
Up to 4 sample-and-hold voltage inputs.

All voltage inputs are buffered by a variable gain, auto-ranging voltage amplifier AMP2 before entering the A/D converter ADC. The voltage amplifier's gain is automatically adjusted until the signal is at least one-half of full scale, but not in overflow. Voltage measurements can be made directly or by using a sample-and-hold (integrating) technique. Sample-and-hold measurements require two adjacent input channels configured for "voltage mode" and an external capacitor. All four sample-and-hold input channel pairs are samples simultaneously.

When measuring negative current, an amplifier AMP1 is used, and the operation is in the "current mode". It accepts negative currents (namely, currents flowing out of the input) and it can be operated in either an integrating or, non-integrating mode by connecting either a capacitor, or a resistor (shown at R23 in FIG. 19) to the MXO pin. The amplifier AMP1 is designed so as to maintain its inverting input at a virtual ground by providing current to the selected channel through an auto-ranging current source, known to operate as a current mirror (CMR). Current flowing out of the current source directed at the MXO pin represents a programmable fraction of the current flowing out of the selected input channel. Other sections shown in FIG. 23 relate to:

An internal shunt regulator for AVDD;
A power supply monitor to signal external devices so that the AVDD shunt regulator is no longer drawing current;
An adjustable band gap voltage reference;
A fixed bandgap voltage reference.

The system of FIG. 23 pertains to the internal organization of the SURE PLUS chip and of the microprocessor operation therein, for A/D conversion in either the "voltage mode" of the "current mode". There, are shown the multiplex pins MUX0 to MUX3 for the inputted currents IA, IB, IC (coming from lines 11, 12, 13 of the PCBA printed-circuit, and MXO connected to ground through a resistor R23 (FIG. 19B). Similarly, there are the multiplex pins MUX4 to MUX7 for the input voltages VAN, VBN and BCN. In the latter instance, which is the "voltage mode", the input voltage VIN is applied by line 30 to the non-inverting input of operational amplifier AMP2. The output goes, via line 31, and switch SW2 in position #1 onto line 32 as an input to the A/D converter ADC. The Same will occur for the input currents, provided they are representing a "positive current" (Switch SW2 still in position #1). The signals go to line 30 and are translated into an input on line 32 for the A/D converter ADC. If, however, the input current is "negative", the operation will be performed in the "current mode". Now, switch SW2 and switch SW1 are in position #2. The input current from MUX0-MUX3, will be entering operational amplifier AMP1 by line 33. The output on line 34 is applied to the gating electrode G of a FET device Qo, so that on line 35 and through the source electrode and the drain electrode D a negative current is drawn from line 36 which comes from a current mirror circuit Therefore, a corresponding current will flow from line 37 at the output thereof, which is converted by resistor R23 to ground into a voltage on pin MXO which will by line 39 become an input on line 32 for the A/D converter ADC.

Figure 24A:
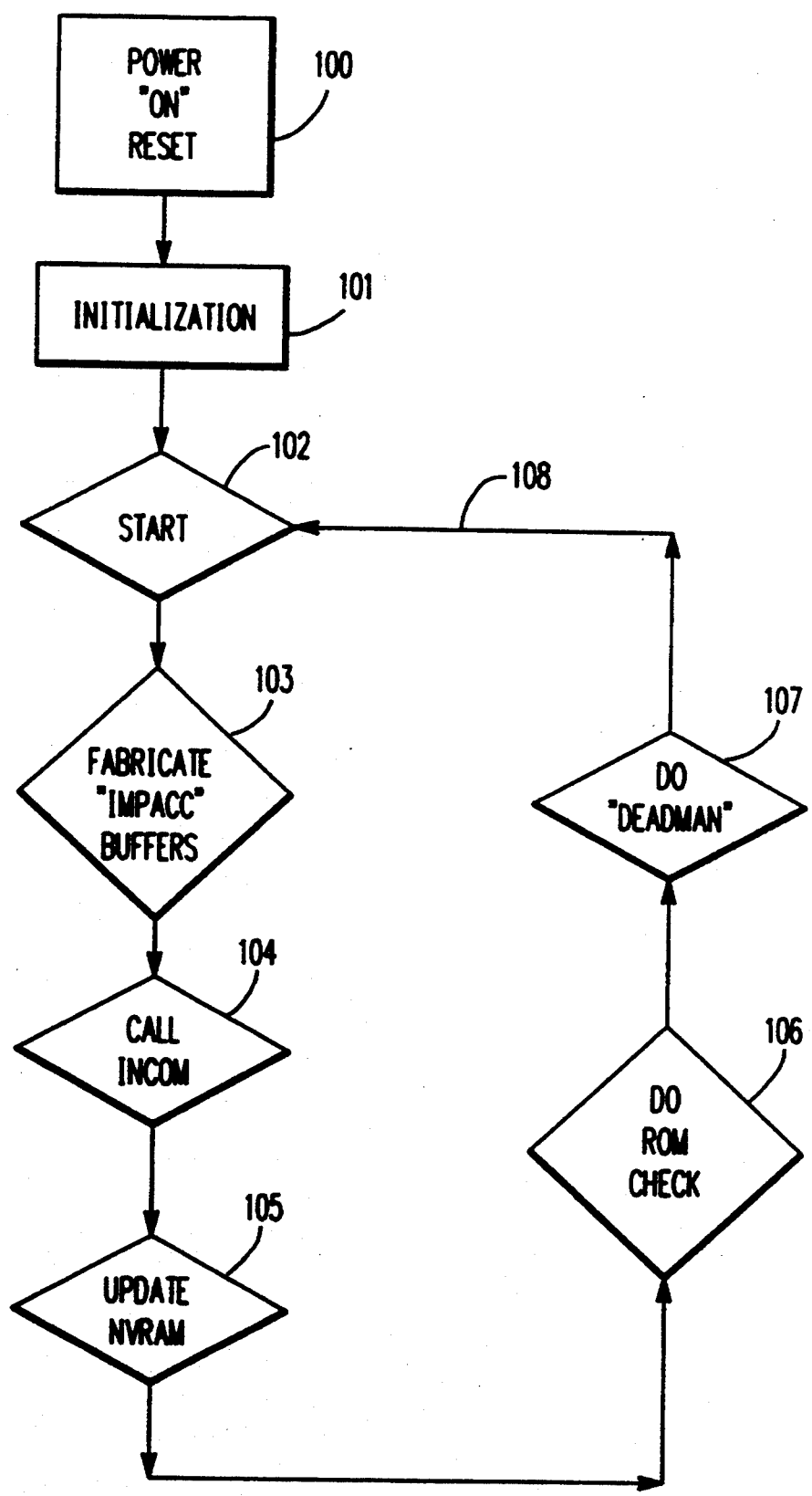
FIGS. 24A, 24B, 24C and 24D are flowcharts illustrating the operation of the energy monitoring system when at the user's station sampling current and voltage, calculating energy and accumulating an instantaneous total of energy according to the present invention.
Figure 24B:
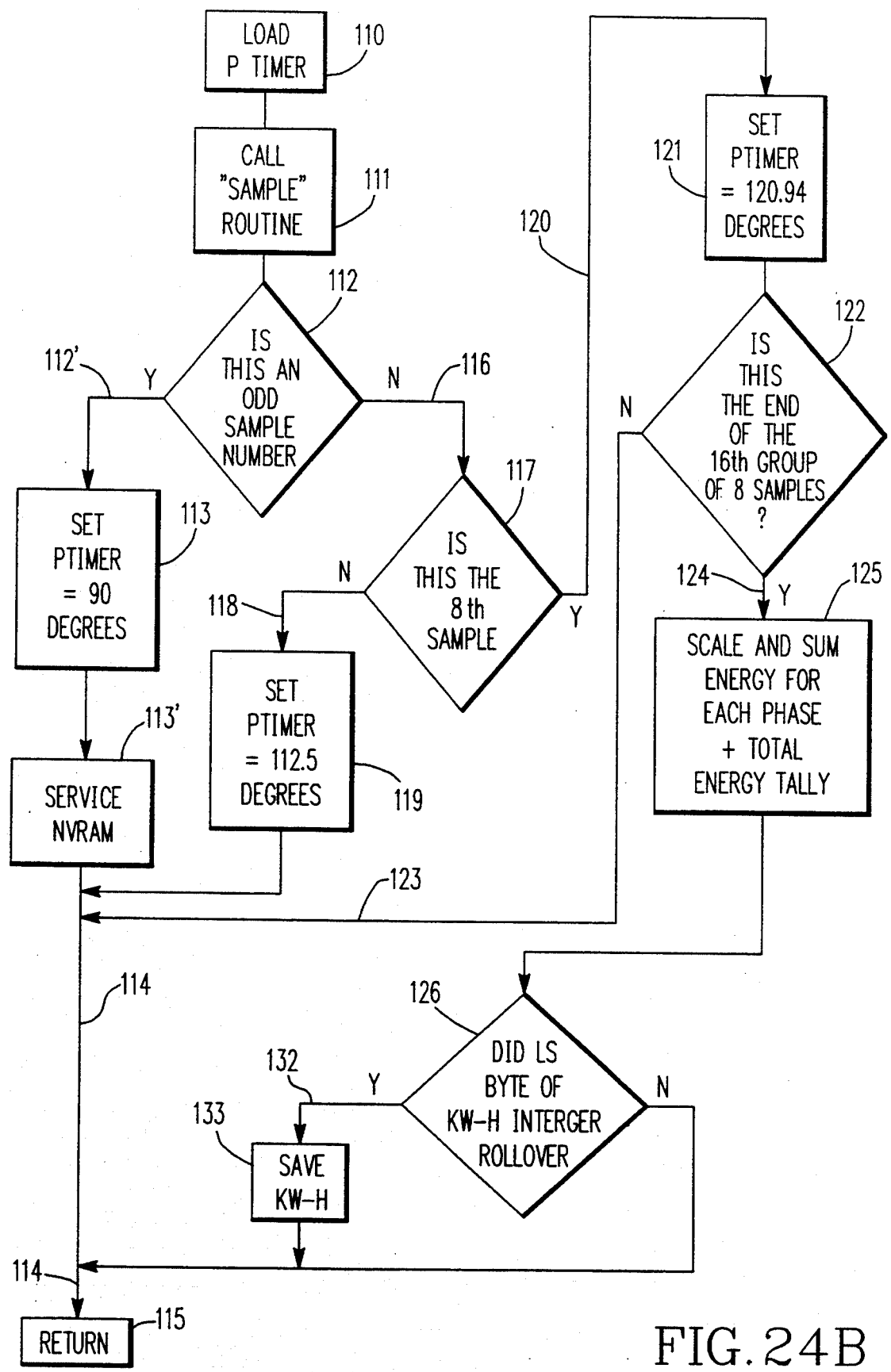
Figure 24C:
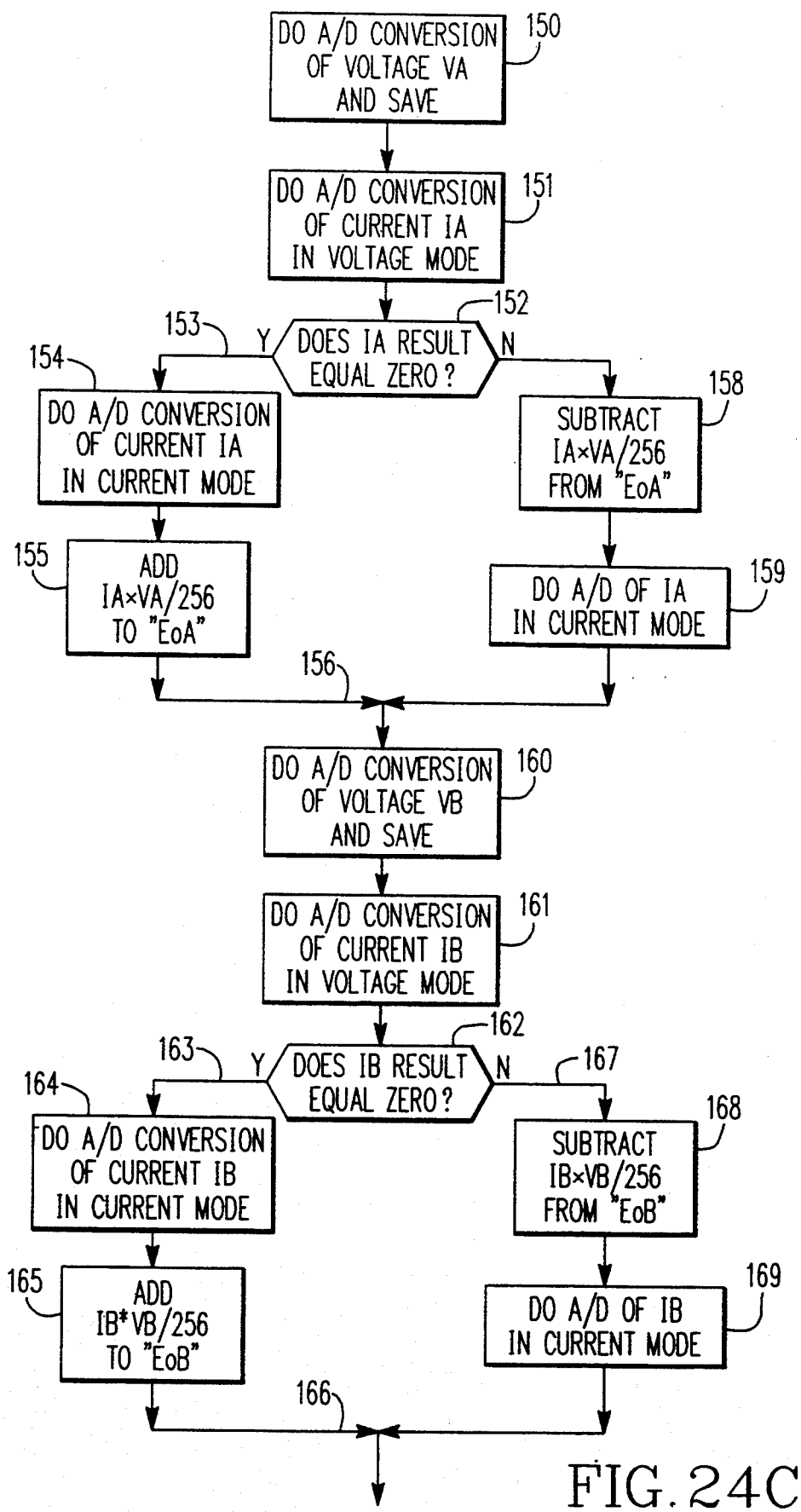

FIGS. 24A, 24B and 24C are flowcharts illustrating the operation of the MCU in performing energy monitoring at the local station The flowchart of FIG. 24A is the Main Routine. At 100 the power is ON, namely Reset. Then, at 101 takes place the Initialization step. At 102 the system starts ("Begin"). At 103 the step is to Fabricate the "IMPACC" buffers, relating to communications of information. At 104, the system calls the INCOM. At 104 the step is to Update NVRAM (the non-volatile RAM). At 106 comes up "Do ROM Check" thus involving the ROM. At 107 is "Do DEADMAN" a feature generally known from the SURE PLUS (SP) operation. Then, by line 108, the system restarts at 102.

Referring to the flowchart of FIG. 24B, this is the Interrupt Routine that the system effectuates for 60 Hz operation. As stated earlier, the sampling will follow the sequence 120o, 90o, 112o, 90o, 112o, 90o, 112o, 12Oo over two cycles. At 110 the step is: Load "PTIMER". By PTIMER is meant here the software, associated with the internal timer of the microprocessor MCU, which is programmed so as to establish the time interval between interrupts in the sampling sequence, according to the afore-stated TABLE I and TABLE II, for the successive octaves. At 111, there is a call for the "SAMPLE" routine. After that, at 112, the question is raised: "is this an odd sample number?". If YES, by 112' the system goes to 113 where the PTIMER is set to 90 degrees, and there is service of the NVRAM at 113'. Thereafter, it goes by 114 to 115 for RETURN. If there is a NO at 112, by 116 comes the question at 117: Is this the eighth sample? If the answer is NO, by 118 at 119 the PTIMER is set equal to 112.5 degrees, and by 114 it goes to 115 for RETURN. If the answer is YES, by 120 at 121 the PTIMER is set at 120.94 degrees. Then, comes at 122 the question: is this the end of the 16th group of eight samples? If the answer is NO, by lines 123 and 114, there is a RETURN at 115. If the answer is YES, by line 124 comes, at 125, the command to scale and sum the ENERGY for each individual phase and provide the total ENERGY tally. Thereafter, at 126 the question is raised "whether the (least significant bits) LS byte of the KW-H (kilowatt-hour) integer is to be rolled-over?" If YES, by line 132, at 133, the KW-H are saved, and a RETURN at 115 is taking place. If there is a NO at 126, there will be a RETURN at 115.

Figure 24D:
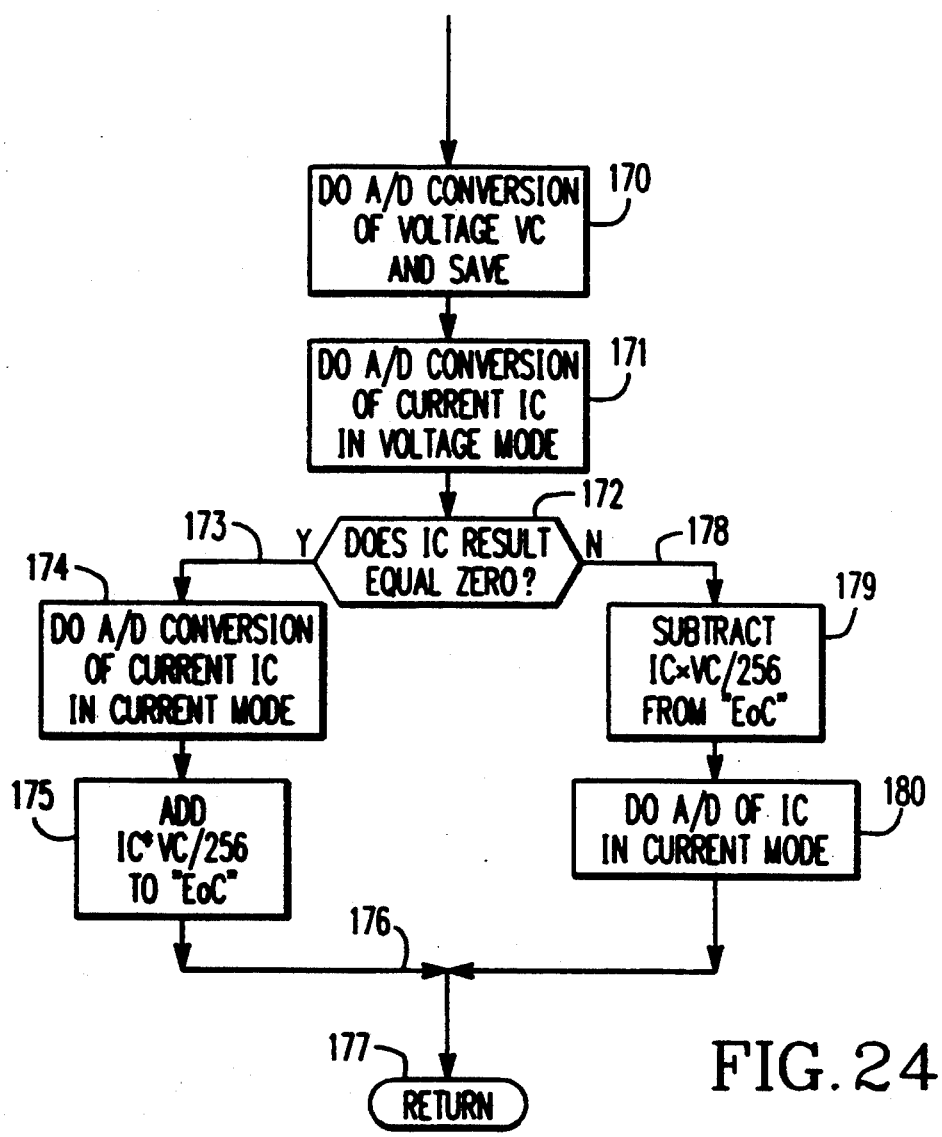

Referring to FIGS. 24C–24D the flowchart of the Sample Routine is as follows: At 150 the step is for phase A of the voltage: "Do A/D conversion of voltage VA and save the result". Then, at 151 is the step regarding phase A of the current: "Do A/D conversion of IA in voltage mode". Thereafter, at 152, comes the question: "Does the IA result equal zero?" This question, as earlier stated means that as it appears from FIG. 22F, that the detected current was either zero or negative. If YES, by line 153, comes at 154 the step: "Do A/D conversion of IA in the current mode". Then, at 155, the next step is to use the sampling value and raise the tally: ADD IA×VA/256 to "EoA". Here, the accumulated energy in the tally accumulator is divided by the number 256 for scaling purposes only. Assuming 8 bits, by multiplying the number of bits would be excessive. Therefore a division by 16×16=256 is used. Then, the system goes to line 156 "If NO at 152, by line 157 comes (at 158) the step: SUBTRACT IA×VA/256 from "EoA" (where "EoA" is the accumulated energy in the buffer register and where, again, the division by 256 is performed for scaling purposes only). Subtraction takes into account the negative sign of the IA in the product IA×VA. Phase current conversions in the "voltage mode" are assigned a negative sign and phase current conversions in the "current mode" are assigned a positive sign. In either case, the system provides the latest energy tally. Also, for reason of symmetry, at 159 is added a step similar to step 154 which is: "Do A/D conversion of IA in the current mode". This step is useless as a performing step, but it parallels the step 154, and therefore adds a duration which matches the other side. Accordingly, the two paths have in the process a timely convergence at 156, from which the system will subsequently repeat the same series of steps with regard to phase B. At this stage 156, the energy calculation for phase A has been completed. The same series of steps will also take place from step 156 to step 166 for phase B (at 160 the A/D conversion of voltage VB and saving; at 161 the A/D conversion of IB in voltage mode; at 161 the test whether IB is equal to zero; at 162 the question whether the IB result is equal to zero leading on one side to an A/D conversion for IB in the current mode at 164 and at 165 adding IB×VB/256 to "EoB", or at 168 subtracting IB×VB/256 from "EoB" before doing at 169 the time factor required A/D conversion of IB in the current mode. Then, comes phase C with the same series of steps from step 166 to step 176. These steps involve: 1/an A/D conversion of voltage VC with saving of the result at 170 and an A/D conversion of current IC in the voltage mode at 171; and 2/(depending upon whether at 172 the result for IC is equal to zero, or not) there will be (at 174) an A/D conversion for IC in the current mode, followed at 175 by "adding IC×VC/256" or there will be (at 179) "subtracting IC×VC/256", a step followed at 180 by a perfunctory step (as before for the two other phases) consisting in doing an A/D conversion of IC in the current mode. The common RETURN is by line 176 at 177. As it appears from the last steps of the flowchart of FIG. 24C, after the A/D conversion at ADC (FIG. 23) a 8-bit sample is derived of VA and IA, for phase A, of VB and IB for phase B, and of VC and IC for phase C, from which samples the Energy is by calculated by phase, to be totalized for the three phases, thus, leading to:

$$E = \Sigma VA \times IA + \Sigma VB \times IB + \Sigma VC \times IC \qquad (1)$$

This amount of energy is continuously stored and accumulated leading to an instantaneous total for the local station. This is done by the backpack unit at all stations for the various local users, and the results are ready at any time to be withdrawn at the PC computer station from all stations for individual billing. This is used at the PC computer station, or any other chosen central station, to monitor the overall energy consumption, in parallel to the collective meter of the electrical company. There is also a need to know the Demand, which is a gradient of energy, namely Energy / Time. Every five minutes, for instance, the PC computer station will determine how much energy has been consumed in such a time interval. By a snapshot every five minutes, the PC computer station will cause each individual station to simultaneously store their instantaneous energy consumption. Between two snapshots, the central station will withdraw from each local station, sequentially, all such stored instantaneous energy consumptions and take the difference between the newest value and the prior value for each local station. This difference is the ENERGY consumed in five minutes, or 5 minute DEMAND, at such local station. This difference is, then, time stamped and user stamped by the central station, and saved for later use in determining how to distribute "DEMAND" billing costs among the local users.

As a general approach to a central monitoring of energy based on the apparatus and system which has been hereinbefore explained and described for one local user station, the several stations are storing and making available at any moment their results of totalized Energy, upon which the PC station will have only to call the results from each station one after the other. However, in order to match a collective reading by the common meter of the electrical company, there is a need to "synchronize" the polling of information from the local user backpack units. This is the problem solved by another aspect of the present invention, as seen from the PC station, or central station, rather than from the remote station.

It is known from U.S. Pat. No. 4,692,761 to pass data relative to power consumption from remote stations to a central unit where the total amount of energy consumed is measured in relation to a centralized meter.

The prior art expresses the need for a true communication insuring a true message and a valid intercommunication. To this effect use has been made of periodical forwarding of data to the central unit, which are still subject to false information due to local operational defects. Combining an exact time relation between the local energy consumed with a reliable message communicated and received have required too much complexity in the dialogue between central unit and remote units. It is proposed now not to require synchronism between the local demand and energy calculations at the remote stations, but to require locally a storing of the instantaneous accumulation of energy by each local station at the command of the central station called "snapshot". The central station, then, reads these local energies in order to determine the energy used between two "snapshots". The passivity of the remote stations insures a constant determination of energy locally, whereas the intervening snapshot from the central unit insures a proper timing which is less demanding than an assigned synchronism of the remote stations.

Figure 25:
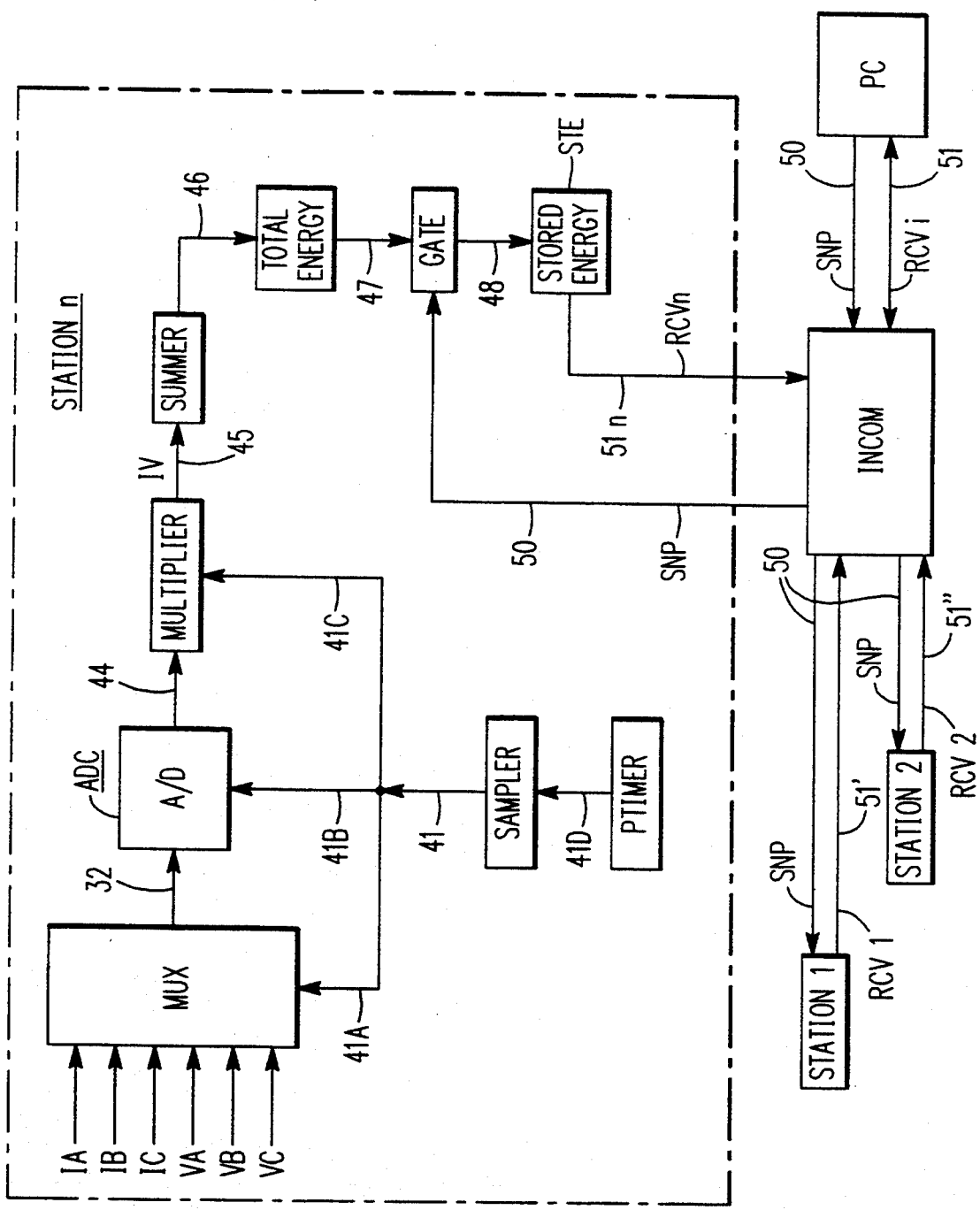
FIG. 25 is a block diagram illustrating snapshot operation from the PC computer station of the energy monitoring system according to the invention.

Referring to FIG. 25, the energy monitoring system is illustrated with the PC computer station PC sending every five minutes a command to store energy. which is transmitted through the INCOM system to each the remote stations ST#1, ST#2, ... ST#n. Upon receiving the command (which may be redundant after the first one, but insures that each local station receives the command) at each station the totalized instantaneous energy as shown for one station (station #n) in FIG. 25 is locally stored. Accordingly, the multiplexer MUX of station #n receives the signals IA, IB, IC, VA, VB, VC, which are sampled under the control signal of lines 41 and 41A, derived from the sampler SMP which is triggered by line 41D from the PTIMER, as explained earlier by reference to the flowchart of FIG. 24B according to the sampling rules of Table I and Table II.

Figure 26:
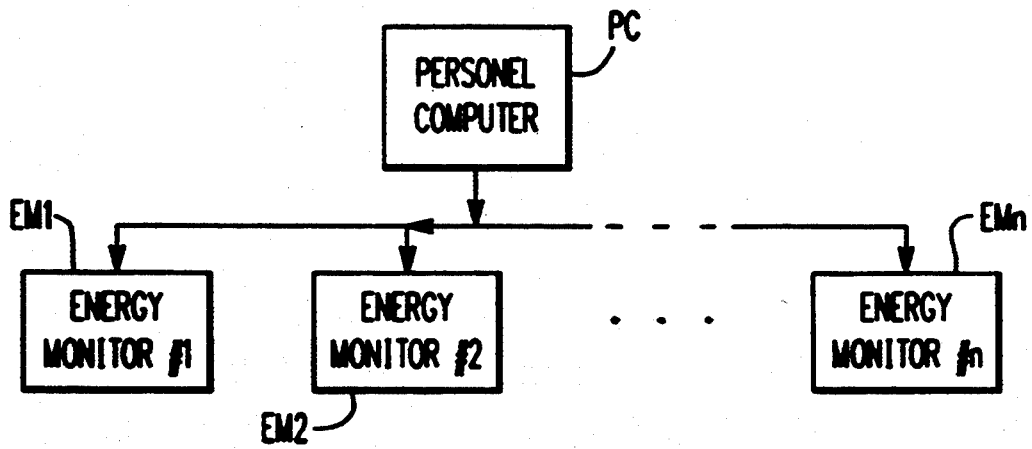
FIG. 26 is a general block diagram of the energy monitoring system.

As explained by reference to FIG. 23, the sampled signals are applied by line 32 to the A/D converter ADC, actuated, also, according to the sampler SMP (by lines 41 and 41B). The digital signals outputted on line 32 are applied to a multiplier MLT which, under the control signal of line 41, via line 41C, generates on line 45 the value IV. The summer SUM passes on line 46 the sampled energy IVs totalized for three phases, and this leads to an accumulated count of total energy Ex at ACCU. This total is constantly updated by each new sampled IVs amount. The latest total is outputted on line 47 which passes through line 48 to storing register STE after being gated by a gate GT. Here come the effects of control by the PC computer station. Each station has been totalizing in one's own register ACCU the latest amount of total energy Ei consumed. When a snapshot command SNP is received from the PC station by line 50 through the INCOM, the gate GT of the addressed station, by line 50, is enabled. Immediately, the latest value Ei is stored by line 48 into register STE. The same is done in each station, simultaneously. Thereafter, by line 51 the PC station reads the amount stored into STE for each station in a sequential manner, for instance in the order 1,2, ... n of the stations. Now it is up to the PC station to compare Ei with the last data received Ei-1 and know, for each station, how much energy has been gained within the five minute time interval separating two successive gating commands by line 50 of the particular station. Knowing Ei =E(i-1), the PC station determines the Demand =Ei-E(i-1). Typically, this is handled by software according to the general block diagram of FIG. 26 showing the PC station in communication with the energy monitor stations #1, #2, #n. PC-based energy monitoring is performed according to flowcharts of FIGS. 27A, 27B and 27C.

Figure 27A:
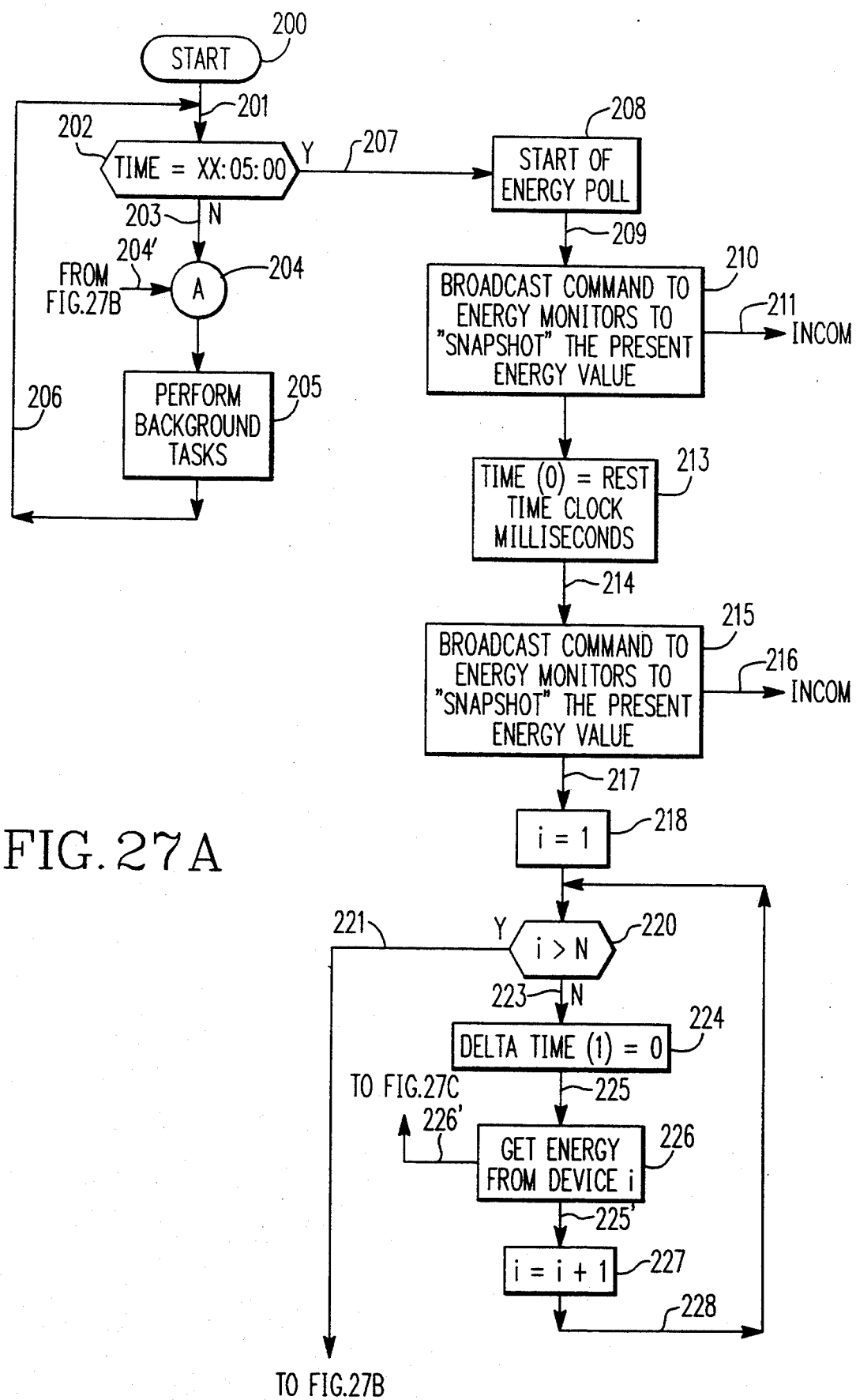
FIGS. 27A, 27B, and 27C are flowcharts explaining the operation of the energy monitoring system of FIGS. 25 and 26.

Referring to FIG. 27A, starting at 200, the next step, via line 201 is at 202 to determine whether the TIME interval of, typically 5 minutes, has been initiated. If NO, by line 203 the system goes to A at 204 where it receives by line 204' the result of the routine of FIG. 27B. Thereafter, the system proceeds at 205 where background tasks are allowed in the free time left. Then, by line 206 there is a RETURN to line 201 for a new time interval. If there is a YES at 202, by line 207 the system goes to 208 where energy polling from all the stations simultaneously is initiated. This comes by line 209 to step 210 where a command 211 is sent through the INCOM to the local stations to "SNAPSHOT" the present accumulated energy, or "instantaneous value" of energy accumulated at the station. Nevertheless, in order to insure a true and valid command, redundancy is used at this stage by establishing a dead time for a rest of about several milliseconds at 213, which by line 214 is followed by another command for a "SNAPSHOT" at 215 by 216 through the INCOM to the local stations.

Thereafter, takes place the individual polling of all the stations to see how much has been accumulated and to check whether a valid energy value has been called for. This routine starts by line 217, with the number i, Of the local station being addressed, being initially made equal to 1 (at 218). Thereafter, the count will increase (at 227) by one until at 220 it reaches n the total-number of local stations. If at 220 i>N, by line 221 the system goes to a new series of n stations for polling (line 222 of the routine of FIG. 27B). If the system is still during the polling of stations, at line 223 (from step 220) a timer is initialized (at 224) to zero for the station being addressed, and by 225 the system goes to the routine of FIG. 27C in order to know the energy accumulated in the local'station and, if necessary, to ascertain the validity of the information received, making another call if not valid. Block 226 of the flow chart of FIG. 27A is illustrated by the flow chart of FIG. 27C described hereinafter. When the energy has been collected for all the stations by line 225 each value of i having been increased by one until at 220 it has reached n, when another command to poll will take place with the new time interval (namely of 5 minutes). If it has (YES on line 221), the system goes to 222 of FIG. 27B for station polling. If NO at 220, by line 223 the system goes to 226, a routine which is illustrated by FIG. 27C.

Figure 27B:
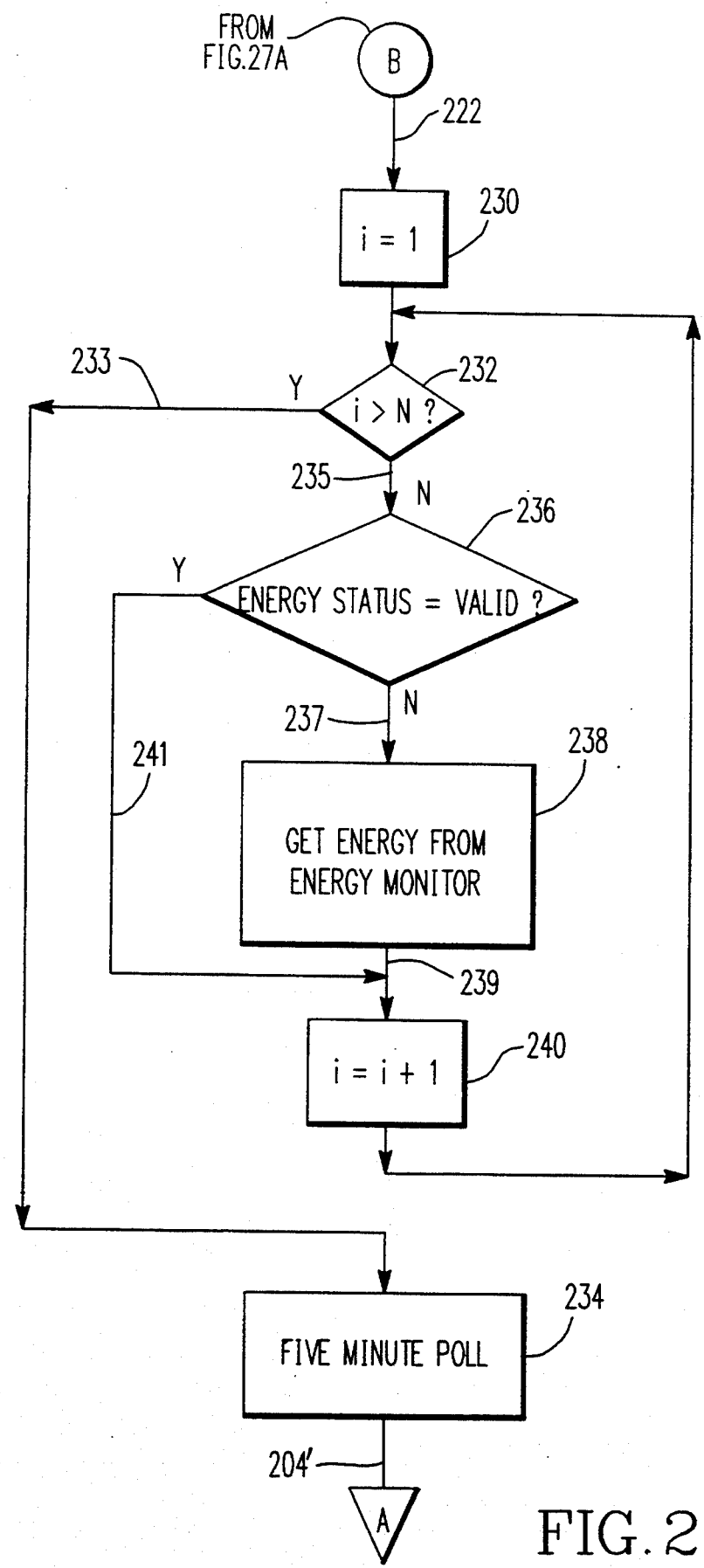

Considering step 226 of FIG. 27A, FIG. 27B illustrates the polling operation for the determination of the energy at each station. Initialization is with i=1 at 230, namely the first addressed station. If before going to the next station (i=i+1 at 240), at 236 is determined whether the energy received is valid. If YES by line 241, the system goes to the next station (adding one to i at 240) until all the stations have been dealt with (n+1 reached at 232). If YES and all stations have been dealt with by line 233 the system goes to 234 where it is ascertained whether the time interval of 5 minutes has lapsed. If so the system is back to A of FIG. 27A. If NO and all stations have not been dealt with, by line 235 it is determined whether the energy received is valid at 236 as described above. If there is a NO on line 237 of block 236, at 238, the system goes to the flow chart routine of FIG. 27C in order to seek a valid response. The energy having been received correctly on line 239, like from 241, the system goes to 240.

Figure 27C:
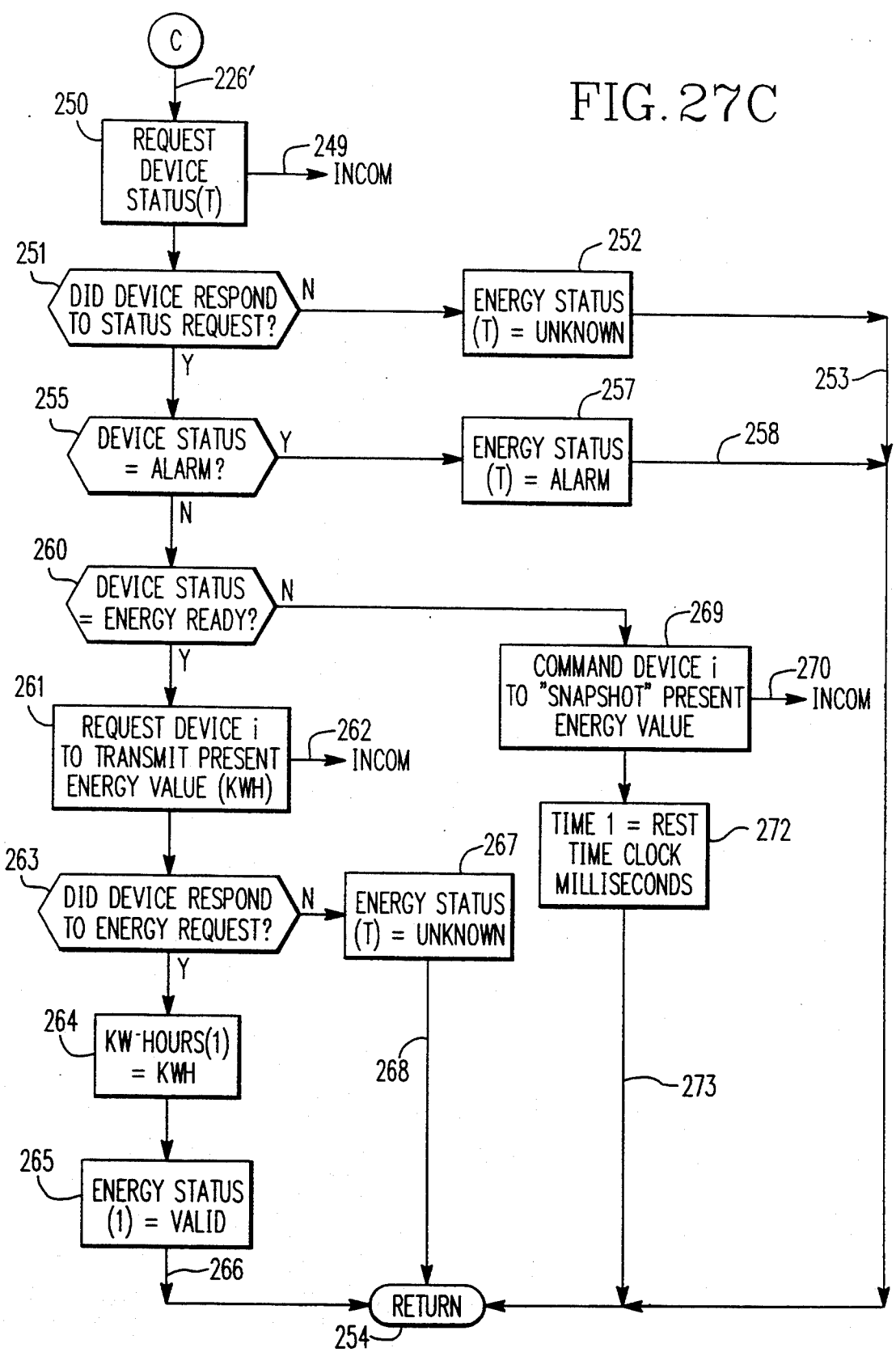

Considering now FIG. 27C (by line 226' from block 226 of FIG. 27A) the flowchart goes to 250 where a request for the local station status is transmitted through the INCOM at 249. Then, at 251 the question is raised "whether the addressed station has responded?". If NOT, this fact is acknowledged at 252 and there is a RETURN by line 253 to 254. If YES at 251, it is determined at 255 whether the status is "ALARM". If YES, at 257 this is acknowledged and there is a RETURN by lines 258 and 253 to 254. If NO alarm has been detected at 255, the determination is at 260 whether the ENERGY READY status has been obtained". If YES, the station is asked to transmit back the energy (in kilowatthour) by line 262 through the INCOM. If at 263 there is a positive response, at 264 the KWH is known and at 265 it is recognized as valid, whereby via line 266 there is a RETURN at 254. If NO at 263, it is acknowledged at 267 as having an unknown status, and by line 268 there will be a RETURN at 254. Having found a NO at 260, the system at 269, to be sure, makes another request to the station (via line 270). In such case, the time delay is accounted for at 272 with a timer before returning to 254 by line 273.

The Numbering System used for the Energy Monitoring System is as follows:
BREAKER FULL LOAD RATING: 160A RMS=¼ full scale A/D reading (0.1569A RMS per bit).
BREAKER MAXIMUM VOLTAGE RATING: 480V line to line, 277V line to neutral=0.56 full scale A/D reading (0.1213V RMS per bit) (above are RMS values, peak is 1.41421 higher for sine wave).
FULL SCALE A/D READING=0FF0H (4080 decimal).
EACH ENERGY SAMPLE PRODUCT WILL BE EQUAL TO:
$(V)*(I)$ or after A/D scaling $E_{sx} = (V_x)/(0.1213\text{V/bit}) * (I_x)/(0.1569\text{A/bit}) * (\frac{1}{2}) * (1/256)$ where ($\frac{1}{2}$) occurs from voltage half wave rectification.

THESE SAMPLES WILL BE SUMMED FOR 128 SAMPLES (606 mS per JCE sampling algorithm) (this is a signed number-three bytes maximum) (128 samples is 16 groups of 8 samples):

$$E_{ox} = \sum_{i=1}^{128} E_{sx}$$

THE TWO MOST SIGNIFICANT BYTES OF Eox ARE SCALED AND SUMMED TO THE "ENERGY" AND "DEMAND" ACCUMULATORS (the two most significant bytes are then zeroed).

THE 5 MINUTE DEMAND (WATTS) NOMINAL SCALE FACTOR "KD" IS 2580 (5 minutes is 495 groups of 128 samples).

DEMAND =

$$\sum_{n=1}^{495} (E_{ox}/256)*(KD)/(256)**2 \text{ WATTS (5 minute average)}.$$

DEMAND IS A 5 BYTE NUMBER MAXIMUM, WITH DECIMAL POINT LEFT OF THE SECOND BYTE.

THE ENERGY (KW-H) NOMINAL SCALE FACTOR "KE" IS 14090 (the integer value of KW-H is stored in a three byte non-volatile word, the least significant byte of KW-H is also stored in volatile RAM):

$$\text{ENERGY} = \sum_{n=1}^{n1} (E_{ox}/256)*(KE)/(256)**4 \text{ KWATT-hours}$$

where $n1$ = (TIME IN SECONDS)/(0.606 seconds).

ENERGY IS A 7 BYTE NUMBER, WITH THE DECIMAL POINT TO THE LEFT OF THE FOURTH BYTE. The three most significant bytes are transferred over the INCOM network. At 150A, 277V 3 phase balanced load, 1 KW-H occurs every 30 seconds. Also, the least significant byte rolls over 14.4 times per day, or 10,000 times in 1.9 years. Non-volatile energy data storage occurs at roll-over.

"KE"="KD" multiplied by the constant 5.4613 or $(256)*(256)/((12)*(1000))$.

The NVRAM Data Storage, NVRAM KW-H Data Save Procedure and the NVRAM KW-H Data Recovery at Power Up are as follows:

NV RAM DATA (16 ROWS OF 16 BYTES) STORAGE: ROW 0 3 DEMAND AND 3 KW-H MULTIPLIERS (2 BYTES EACH), DATE (3)
ROW 1
ROW 2
ROW 3
ROW 4 8 COUNTERS (2 BYTES) 0 TO 10,000 (AT 10,000 SET=0FFFFH)
ROW 5 KW-H LEAST SIGNIFICANT BYTE SAVED AT POWER DOWN AND ITS IMAGE
ROW 6 KW-H MIDDLE BYTE SAVED AT LEAST SIGNIFICANT BYTE ROLLOVER AND ITS IMAGE
ROW 7 KW-H MOST SIGNIFICANT BYTE SAVED AT LEAST SIGNIFICANT BYTE ROLLOVER AND ITS IMAGE
ROW 8 8 COUNTERS (2 BYTES) 0 TO 10,000 (AT 10,000 SET=0FFFFH)
ROW 9 KW-H LEAST SIGNIFICANT BYTE SAVED AT POWER DOWN AND ITS IMAGE
ROW A KW-H MIDDLE BYTE SAVED AT LEAST SIGNIFICANT BYTE ROLLOVER AND ITS IMAGE
ROW B KW-H MOST SIGNIFICANT BYTE SAVED AT LEAST SIGNIFICANT BYTE ROLLOVER AND ITS IMAGE
ROW C
ROW D
ROW E
ROW F
NV RAM KW-H DATA SAVE PROCEDURE:
WITH POWER AVAILABLE AT ROLLOVER OF LEAST SIGNIFICANT BYTE KW-H, SAVE KW-H MIDDLE BYTE, KW-H MOST SIGNIFICANT BYTE, THEN THEIR IMAGES, AND THEN ZERO KW-H LEAST SIGNIFICANT BYTE's IMAGE.
ON POWER FAILURE SAVE KW-H LEAST SIGNIFICANT BYTE.
ON POWER UP WRITE KW-H LEAST SIGNIFICANT BYTE IMAGE, CLEAR KW-H LEAST SIGNIFICANT BYTE.
NV RAM KW-H DATA RECOVERY AT POWER UP:
IF KW-H MIDDLE AND MOST SIGNIFICANT BYTES DO NOT MATCH THEIR IMAGES, SET BOTH VALUES AND IMAGES EQUAL TO (KW-H) OR (IMAGE+1) WHICHEVER IS LARGER—ROLLOVER OF LEAST SIGNIFICANT BYTE IS ASSUMED SO ZERO LEAST SIGNIFICANT BYTE OF KW-H AND ITS IMAGE.
IF KW-H MIDDLE, MOST SIGNIFICANT BYTES MATCH THEIR IMAGES, READ KW-H LEAST SIGNIFICANT BYTE AND ITS IMAGE, USE THE LARGER OF THE TWO FOR INITIAL VALUES IN RAM.

The Energy Measurement Calibration Accuracy is as follows:

Each individual phase will be calibrated at the factory to read the same power level at full load. This is done by adding a gain scaling term to the resultant product of voltage and current. The following analysis assumes there is a gain and an offset associated with each individual phase.

$I = K1*i + K2$, where $K1 = 6.37$ bits/A, $K2 = -1$ bit.

$V = K3*v + K4$, where $K3 = 8.24$ bits/V, $K3 = -1$ bit.

$\text{ENERGY} = VI = K1*K3*i*v + K1*K4*i + K2*K3*v + K2*K4$.

At full load and 120 volts line to neutral:

$K1*i = 956$ bits, $K3*v = 989$ bits.

ENERGY=-
$VI = 945,484 - 956 - 989 + 1 = 945,484 - 1944 = 94-$
$5,484 - 0.2\% = 943,540$.

At 20% full load and 120 volts line to neutral:

$K1*i = 191$ bits, $K3*v = 989$ bits.

ENERGY=-
$VI = 188,899 - 196 - 989 + 1 = 188,899 - 1179 = 18-$
$8,899 - 0.6\% = 187,720$.

If the full load value above were scaled to 950,000 by multiplying it by 1.0068, then the 20% full load energy should be 190,000 but it is only 188,996 after scaling and thus is in error by −0.5%. If, however, the full load value were scaled to 940,000 by multiplying it by 0.9962, then the 20% full load energy should be 188,000, but it is only 187,006 and thus in error again by 0.5%. Scaling the product term thus does not increase the error in measuring energy.

In APPENDIX are placed the LISTINGS regarding: A/the LOCAL STATION ENERGY CALCULATION; and B/PERSONAL COMPUTER BASED ENERGY MONITORING.

(The following page is Appendix Page A-1.)

APPENDIX A

```
*     NAM     INTR
*
*
*        OPT S    PRINT SYMBOL TABLE OPTION
*
*                    --- ( INTR ) ---
*
*
*
*
*

*****************************************************************
***************************************************************** include "header.s"

*****************************************************************
*****************************************************************

* 10-09-90 UPDATED TIMING ANALYSIS OF ROUTINES

REGION "MAIN"

*****************************************************************
*****************************************************************

*       AT THIS POINT, A PRIMARY OUTPUT COMPARE INTERRUPT HAS OCCURRED.

*****************************************************************
*****************************************************************

*        TIMER INTERRUPT PROGRAM.

*        UPON A PRIMARY TIMER INTERRUPT, DO THE FOLLOWING TASKS:
*
*        1. RELOAD PRIMARY TIMER WITH NEXT INTERRUPT TIME.
*        2. SAMPLE ALL ANALOG INPUTS AND COMPUTE THEIR POWER PRODUCT TERMS.
*                SUM POWER TERMS "PTALLY".
*        3. CHECK FOR POWER FAILURE AND SAVE KW-H IF REQUIRED.
*        4. FOR LAST SAMPLE IN EACH GROUP OF EIGHT, SET PTIMER= 120.94 DEGREES.
*        5. AT END OF 16TH GROUP OF 8 SAMPLES, SCALE AND SUM "ENERGY" & "DEMAND".
*        6. AT END OF 495TH BLOCK OF 16 GROUPS OF 8 SAMPLES, SAVE "DEMAND".
*        7. SERVICE THE PROGRAM COUNTERS.
*        8. SERVICE THE INTERNAL NON-VOLATILE RAM.

*        NOT 8TH INTERRUPT= 1469 CYCLES + 400US = 1196US @ 3.6864MHZ.
*        8TH INTERRUPT ONLY= 1509 CYCLES + 400US = 1219US @ 3.6864MHZ.
*        16TH BLOCK OF 8 SAMPLES= 4099 CYCLES + 400US = 2624US @ 3.6864MHZ.
```

```
TIMER_INTERRUPT

SEI                             DISABLE INTERRUPTS
*-------
        LDA     PCD                     TOGGLE PORTC.1 EACH TIME
        EOR     #2                      INTERRUPT ROUTINE IS SERVICED.
        STA     PCD
*-------
        JSR     LOAD_PTIMER             RELOAD TOCH,L AND RESET OCF (TSR.6)

JSR     SAMPLE                  SAMPLE ALL CURRENTS AND VOLTAGES

*       JSR     SPI                     SERVICE THE SPI SERIAL LINK

JSR     PFAIL_DET               DETERMINE IF A POWER FAILURE OCCURRED

*       AT THIS POINT ALL CURRENTS AND VOLTAGES HAVE BEEN SAMPLED AND SAVED.
*       ALL VI PRODUCT HAVE ALSO BEEN CALCULATED AND SUMMED.

*       INCREMENT SAMPLE COUNTER.

CNT
        INC     ICOUNT
        INC     COUNTL
ENDCNT

********************************************************************************
********************************************************************************
********************************************************************************

*       DECREMENT INCOM_TIMER, LIMIT ZERO.  FOR INCOM_TIMER= 0,
*       DO OLD_COMMAND= 0.

ITIMR
        LDA     INCOM_TIMER
        BEQ     INCOM_TIMOUT
        DECA
        STA     INCOM_TIMER
        BRA     END_ITMR

INCOM_TIMOUT
        CLRA
        STA     OLD_COMMAND
END_ITMR

********************************************************************************
********************************************************************************

*       TEST IF ODD SAMPLE NUMBER WAS JUST COMPLETED.

TST2    LDA     ICOUNT
        AND     #1
        BEQ     TSTSMP8

*       ODD SAMPLE IS COMPLETE (90 DEGREE SAMPLE INTERVAL).

*       1. SERVICE THE NVRAM ERASE/WRITE ROUTINE.  (BEGIN AND END NVRAM
*          ERASE OR WRITE TASKS HERE.)

JSR     NV_SERVICE              CONTROL NV RAM ACTIVITY

JSR     NVRAM                   DO NVRAM ERASE / SAVE FUNCTION AS NEEDED

JMP     INTR_END

********************************************************************************

TSTSMP8

*       IS THIS THE EIGTH SAMPLE COMPLETED.
```

```
*       IF NOT, NO OTHER TASKS NEED TO BE DONE.
*       IF TRUE, RESET ICOUNT TO ZERO AND INCREMENT "GROUP" COUNTER "GCOUNT".

LDA     ICOUNT
        AND     #7
        BEQ     SAMP8               END OF GROUP OF EIGHT SAMPLES
        JMP     INTR_END            NOT LAST SAMPLE, NO OTHER TASKS

*       1. RESET ICOUNT TO ZERO.
*       2. INCREMENT GROUP COUNTER "GCOUNT".
*       3. CHECK FOR "GCOUNT"= 16.

SAMP8   CLR     ICOUNT
        INC     GCOUNT
        LDA     GCOUNT
        AND     #15                 TEST FOR 16 GROUPS OF 8 SAMLES EACH.
        BEQ     GRUP16              END OF 16TH GROUP OF EIGHT SAMPLES.
        JMP     INTR_END            NOT LAST GROUP, NO OTHER TASKS.

*       1. RESET GROUP COUNTER "GCOUNT" TO ZERO.
*       2. SCALE AND SUM "DEMAND" AND "ENERGY".
*       3. ZERO "EOXTALY" TWO MS BYTES.
*       4. INCREMENT BLOCK OF 16 GROUPS COUNTER "BCOUNT".
*       5. CHECK FOR "BCOUNT"= 495.

GRUP16  CLR     GCOUNT
        JSR     DEMANDSUM           SCALE EACH PHASE DEMAND, ADD TO TALLYS
        JSR     ENERGYSUM           SCALE EACH PHASE ENERGY, ADD TO TALLY
        JSR     CLREOX              ZERO TWO MS BYTES OF EOX TALLYS
        CLRA
        ADD     BCOUNT+1
        STA     BCOUNT+1
        CLRA
        ADC     BCOUNT
        STA     BCOUNT
*                                   BCOUNT IS INITIALIZED TO 17. 17+495=512=200 HEX
        CMP     #2                  TEST FOR 495TH BLOCK OF 16 GROUPS.
        BHS     SAVE_DMD            BRANCH IF BCOUNT => 200 HEX
        JMP     INTR_END            NOT LAST BLOCK, NO OTHER TASKS.

*       1. SUM AND SAVE DEMAND TALLY IN INCOM BUFFER
*       2. ZERO DEMAND TALLY
*       3. PRELOAD "BCOUNT" WITH 17, 17+495=512 OR 200H (ONE BYTE TEST)

SAVE_DMD
        JSR     SAVE_DEMAND

INTR_END
        CLI                         RE-ENABLE INTERRUPTS
        RTI                         END OF PROTECTION INTERRUPT ROUTINE.

********************************************************************************
********************************************************************************

*                   SUBROUTINES
*                   SUBROUTINES
*                   SUBROUTINES

********************************************************************************
```

```
*       LOAD_PTIMER RELOADS TOCH,L TO ESTABLISH THE NEXT SAMPLE TIME. ONE OF
*       THREE TIME INCREMENTS IS SELECTED FROM TABLE LTTABLE AND SUMMED WITH
*       THE PRESENT COUNTER VALUE:
*
*                       TOCH,L= TCRH,L + (LTTABLE).

*       THE INCREMENT IS SELECTED AS FOLLOWS @60HZ WITH A 4MHZ CRYSTAL.

*       FOR ICOUNT = 7,      INCREMENT= 5598US=> 5598/2= AEFH.  ———— 120.94°
*       FOR ICOUNT = ODD,    INCREMENT= 5208US=> 5208/2= A2CH.  ———— 112.5°
*       FOR ICOUNT = EVEN,   INCREMENT= 4167US=> 4167/2= 823H.  ———— 90°
*       FOR 180 DEGREES,     INCREMENT= 8333US=> 8333/2=1046H.

*       THE INCREMENT IS SELECTED AS FOLLOWS @50HZ. CORRECT FOR 50HZ.

*       FOR ICOUNT = 7,      INCREMENT= 6719US=> 6719/2= DC4H.
*       FOR ICOUNT = ODD,    INCREMENT= 6250US=> 6250/2= DACH.
*       FOR ICOUNT = EVEN,   INCREMENT= 5000US=> 5000/2= 9C4H.
*       FOR 180 DEGREES,     INCREMENT=10000US=>10000/2=1388H.

*       THE INCREMENT IS SELECTED AS FOLLOWS @60HZ WITH A 3.6864MHZ CRYSTAL.

*       FOR ICOUNT = 7,      INCREMENT= 5599US=> 5599/2.17014= A14H.
*       FOR ICOUNT = ODD,    INCREMENT= 5208US=> 5208/2.17014= 960H.
*       FOR ICOUNT = EVEN,   INCREMENT= 4167US=> 4167/2.17014= 780H.
*       FOR 180 DEGREES,     INCREMENT= 8333US=> 8333/2.17014= F00H.

*       THE INCREMENT IS SELECTED AS FOLLOWS @50HZ. CORRECT FOR 50HZ.

*       FOR ICOUNT = 7,      INCREMENT= 6719US=> 6719/2.17014= C18H.
*       FOR ICOUNT = ODD,    INCREMENT= 6250US=> 6250/2.17014= B40H.
*       FOR ICOUNT = EVEN,   INCREMENT= 5000US=> 5000/2.17014= 900H.
*       FOR 180 DEGREES,     INCREMENT=10000US=>10000/2.17014=1200H.

*       TO CLEAR TSR.6 (OUTPUT COMPARE FLAG, OCF), READ TSR, THEN WRITE TO TOCL.

*       ALSO INVERT TCR.0 (NEXT OUTPUT LEVEL ON PCMP). PCMP OUTPUT WILL THEN
*       CHANGE STATE AT EVERY SAMPLE TIME FOR DIAGNOSTIC PURPOSES.

*       82 CYCLES MAX.

LOAD_PTIMER

CLRX                    ASSUME 60HZ INDEX ALWAYS
*       TST     FREQ
*       BEQ     LT1
*       LDX     #8              CORRECT TO 50HZ INDEX

LT1     LDA     ICOUNT
        CMP     #7
        BEQ     LT2
        INCX
        INCX

AND     #1
        BNE     LT2
        INCX
        INCX

LT2     LDA     TSR             READ TSR TO CLEAR TSR.6, FLAG OCF
```

```
        LDA     TCRH              READ HI BYTE FIRST AS REQUIRED
        STA     XTEMP
        LDA     TCRL
        ADD     LTTABLE+1,X       ADD LO BYTES
        STA     ATEMP

LDA     XTEMP             GET TCRH
        ADC     LTTABLE,X         ADD HI BYTES
        STA     TOCH              WRITE HIBYTE FIRST

LDA     ATEMP             REQUIRED TO PERMIT FURTHER OUTPUT COMPARES
        STA     TOCL              AND TO FINISH CLEARING TSR.6.

LDA     TCR               INVERT TCR.0, NEXT OUTPUT LEVEL ON PCMP
        EOR     #$01
        STA     TCR

RTS
```

***********************************************************************

* THE FOLLOWING VALUES ARE VALID FOR A 3.6864MHZ CRYSTAL.

```
LTTABLE
        FDB     $A14    60HZ    5598US
        FDB     $960            5208US
        FDB     $780            4167US
        FDB     $F00            8333US

FDB     $C18    50HZ    6719US
        FDB     $840            6250US
        FDB     $900            5000US
        FDB     $1200           10000US
```

***********************************************************************
***********************************************************************

* SAMPLE ROUTINE.

* THIS ROUTINE IS PART OF THE INTERRUPT ROUTINE.
* DO NOT USE MAIN LOOP WORKING REGISTERS HERE. (VERIFY).

* NO INTERRUPT OF THE SAMPLE ROUTINE IS PERMITTED SINCE OTHER INTERRUPTS
* ALSO USE THE A/D CONVERTER.

* SAMPLE IA, VA, IB, VB, IC, VC.
* DURING THE CONVERSION TIMES, EXECUTE
* INSTANTANEOUS PHASE POWER COMPUTATIONS AND TALLY RESULTS.

* REMOVE A/D RESULT BEFORE STARTING ANOTHER A/D CONVERSION -JCS.

* FOR DEMAND (AUTO CALIBRATION) PURPOSES, CALCULATE THE SUM OF 128
* POWER TERMS FOR EACH INDIVIDUAL PHASE (16 GROUPS OF 8 SAMPLES).

* 1157 CYCLES + 400US MAX WITH AN 8MHZ CRYSTAL. RETIME@4MHZ.

```
SAMPLE
        CLR     ACSF              ENABLE CURRENT AUTO RANGING
        CLR     AVSF              ENABLE VOLTAGE AUTO RANGING
```

```
         BSET    5,ADCR         RESET ADCR.7

LDA     #$18           SELECT IA INPUT AND MX0
         STA     AMUX           START CONVERSION OF IA

IA       BRCLR   7,ADCR,IA      WAIT HERE FOR A/D COMPLETION
         BSET    5,ADCR         RESET ADCR.7

*        CLR     SIGN           SIGN OF CURRENT DETERMINES SIGN OF PRODUCT
                                SINCE VOLTAGE IS EITHER PLUS OR ZERO.
         LDA     ADC
         TSTA                   WAS IA VALUE EQUAL TO ZERO
         BEQ     ADIAV          IF IA WAS ZERO TRY A/D ON IA IN VOLTAGE MODE

STA     TEMP           STORE VALUE OF IA
         LDX     ACSF           FETCH SCALE FACTOR = 1,2,4,8, OR 16
         JMP     STVA

ADIAV    BCLR    0,ACFR         DO CONVERSION ON IA IN VOLTAGE MODE
         CLRA
         STA     AMUX           START CONVERSION OF IA IN VOLTAGE MODE

IAV      BRCLR   7,ADCR,IAV     WAIT FOR CONVERSION RESULT
         BSET    5,ADCR
         BSET    0,ACFR         RESTORE IA TO CURRENT MODE
         LDA     ADC
         STA     TEMP           STORE VALUE OF IA
         LDX     AVSF           FETCH SCALE FACTOR = 1,2,4,8 OR 16
         COM     SIGN           CURRENT WAS NEGATIVE IF A/D IN VOLTAGE MODE

STVA     LDA     #$04           SELECT VA INPUT
         STA     AMUX           START CONVERSION OF VA

LDA     TEMP           FETCH IA RESULT
         MUL                    RET WITH X,A= 12 BIT RESULT

STX     NUM2           SAVE IA IN NUM2
         STA     NUM2+1
         STX     IAS
         STA     IAS+1

VA       BRCLR   7,ADCR,VA      WAIT HERE FOR A/D COMPLETION OF VA
         BSET    5,ADCR         RESET ADCR.7

LDA     ADC
         STA     TEMP
         LDX     AVSF           FETCH SCALE FACTOR = 1,2,4,8, OR 16

LDA     #$28           SELECT IB INPUT
         STA     AMUX           START CONVERSION OF VB

LDA     TEMP           FETCH VA RESULT
         MUL                    RET WITH X,A= 12 BIT RESULT

STX     NUM1+0
         STA     NUM1+1
         STX     VAN
         STA     VAN+1

PA       JSR     DMULT          NUM3= NUM1 X NUM2 = IA X VA

LDX     #EOATALY       SET INDEX POINTER TO EOA TALLY
```

```
        TST     SIGN            SIGN IS ZERO FOR A POSITIVE RESULT
        BEQ     PPOSA

JSR     SUBEO           SUBTRACT PA FROM EOA TALLY
        JMP     VB
PPOSA
        JSR     SUMEO           ADD PA TO EOA TALLY

*------------------------------------------------------------

IB      BRCLR   7,ADCR,IB       WAIT HERE FOR A/D COMPLETION OF IB
        BSET    5,ADCR          RESET ADCR.7

CLR     SIGN

LDA     ADC
        TSTA                    WAS VALUE OF IB EQUAL TO ZERO
        BEQ     ADIBV           IF IB WAS ZERO TRY A/D ON IB IN VOLTAGE MODE
        STA     TEMP
        LDX     AVSF            FETCH SCALE FACTOR = 1,2,4,8, OR 16
        JMP     STVB

ADIBV   BCLR    1,ACFR          DO CONVERSION ON IB IN VOLTAGE MODE
        LDA     #$01
        STA     AMUX            START CONVERSION OF IB IN VOLTAGE MODE

IBV     BRCLR   7,ADCR,IBV      WAIT FOR CONVERSION RESULT
        BSET    5,ADCR
        BSET    1,ACFR          RESTORE IB TO CURRENT MODE
        LDA     ADC
        STA     TEMP
        LDX     AVSF
        COM     SIGN            CURRENT WAS NEGATIVE IF A/D IN VOLTAGE MODE

STVB    LDA     #$05            SELECT VB INPUT
        STA     AMUX            START CONVERSION OF VB

LDA     TEMP            FETCH IB RESULT
        MUL                     RET WITH X,A= 12 BIT RESULT

STX     NUM2            SAVE IB IN NUM2
        STA     NUM2+1
        STX     IBS
        STA     IBS+1

VB      BRCLR   7,ADCR,VB       WAIT HERE FOR A/D COMPLETION
        BSET    5,ADCR          RESET ADCR.7

LDA     ADC
        STA     TEMP
        LDX     AVSF            FETCH SCALE FACTOR = 1,2,4,8, OR 16

LDA     #$48            SELECT IC INPUT
        STA     AMUX            START CONVERSION OF IC

LDA     TEMP            FETCH VB RESULT
        MUL                     RET WITH X,A= 12 BIT RESULT

STX     NUM1+0
        STA     NUM1+1
        STX     VBN
        STA     VBN+1

PB      JSR     DMULT           RET WITH NUM3= VB*IB, NUM1= VB
```

```
              LDX     #EOBTALY         SET INDEX POINTER TO EOB TALLY
              TST     SIGN             SIGN IS ZERO FOR POSITIVE NUMBERS
              BEQ     PPOSB

JSR     SUBEO            SUBTRACT PB FROM EOB TALLY
              JMP     IC
      PPOSB
              JSR     SUMEO            NUM3= NUM1 X NUM2 = IB X VB

*------------------------------------------------------------

IC      BRCLR   7,ADCR,IC        WAIT HERE FOR A/D COMPLETION OF IC
              BSET    5,ADCR           RESET ADCR.7

CLR     SIGN

LDA     ADC
              TSTA                     WAS IC VALUE EQUAL TO ZERO
              BEQ     ADICV            IF IC WAS ZERO TRY A/D USING VOLTAGE MODE
              STA     TEMP
              LDX     ACSF             FETCH SCALE FACTOR = 1,2,4,8, OR 16
              JMP     STVC

ADICV   BCLR    2,ACFR           DO CONVERSION ON IC IN VOLTAGE MODE
              LDA     #$02
              STA     AMUX             START CONVERSION OF IC IN VOLTAGE MODE

ICV     BRCLR   7,ADCR,ICV       WAIT FOR CONVERSION RESULT
              BSET    5,ADCR
              BSET    2,ACFR           RESTORE IC TO CURRENT MODE
              LDA     ADC
              STA     TEMP             STORE VALUE OF IC
              LDX     AVSF             FETCH SCALE FACTOR = 1,2,4,8 OR 16
              COM     SIGN             CURRENT WAS NEGATIVE IF A/D IN VOLTAGE MODE

STVC    LDA     #$06             SELECT IG INPUT
              STA     AMUX             START CONVERSION OF IG

LDA     TEMP             FETCH IC RESULT
              MUL                      RET WITH X,A= 12 BIT RESULT

STX     NUM2             SAVE IC IN NUM2
              STA     NUM2+1
              STX     ICS
              STA     ICS+1

VC      BRCLR   7,ADCR,VC        WAIT HERE FOR A/D COMPLETION OF VC
              BSET    5,ADCR           RESET ADCR.7

LDA     ADC              FETCH VC RESULT
              LDX     AVSF             FETCH SCALE FACTOR = 1,2,4,8, OR 16
              MUL                      RET WITH X,A= 12 BIT RESULT

STX     NUM1+0           SAVE VC IN NUM1
              STA     NUM1+1
              STX     VCN
              STA     VCN+1

PC      JSR     DMULT            RET WITH NUM3= VC*IC= NUM1 * NUM2
```

```
            LDX     #EOCTALY        SET INDEX POINTER TO EOC TALLY
            TST     SIGN
            BEQ     PPOSC

JSR     SUBEO           SUBTRACT PC FROM EOC TALLY
            JMP     ENDSMP
PPOSC
            JSR     SUMEO           ADD PC TO EOC TALLY

ENDSMP  RTS
```

```
*********************************************************************
*********************************************************************
*       POWER FAIL DETECTION IS DONE BY CHECKING THE PAST AND PRESENT VALUES
*       OF VB + VC PHASE VOLTAGES. IF DURING A SAMPLE INTERVAL, ANY OR THE
*       SUM OF THE THREE VOLTAGES EXCEEDS 94V OR 2FF HEX THEN POWER IS "OK".
*       IF THE SUMS OF THE PAST AND PRESENT SETS OF SAMPLE VALUES FAILS THIS
*       TEST, THEN POWER IS ASSUMED TO HAVE BEEN LOST.

*       54 CYCLES MAX.

PFAIL_DET
            LDA     VBN+1               GET VB+VC AND CHECK FOR > 2FF HEX
            ADD     VCN+1
            STA     PFAIL+1             MS BYTE DONE
            LDA     VBN
            ADC     VCN
            STA     PFAIL               PFAIL(0,1)=VB(0,1)+VC(0,1)
            CMP     #2                  TEST MS BYTE OF PFAIL
            BHI     POWER_OK
            BRCLR   6,FLAGS1,POWER_BD
            BRSET   7,FLAGS1,POWER_FL   THIRD SEQUENTIAL LOSS OF POWER
            BSET    7,FLAGS1            SET SECOND DETECTION FLAG OF POWER FAILURE
POWER_BD
            BSET    6,FLAGS1            SET FIRST DETECTION FLAG OF POWER FAILURE
            BRA     END_PWR
POWER_FL
            BSET    S_LS_B,FLAGS2       SAVE LS BYTE OF ENERGY AT POWER FAILURE
            BRA     END_PWR
POWER_OK
            BCLR    6,FLAGS1
            BCLR    7,FLAGS1            POWER IS OK, CLEAR LOSS OF POWER FLAGS
END_PWR
            RTS
```

```
*********************************************************************
*********************************************************************
*       DEMANDSUM SCALES AND SUMS THE THREE INDIVIDUAL PHASE DEMAND VALUES
*       AND ALSO CALCULATES THE PHASE POWERS FOR INCOM BASED ON EOX VALUES.

*       EACH INSTANTANEOUS V*I=ESX PRODUCT IS SUMMED ON A PER PHASE BASIS FOR
*       128 SAMPLES. THIS SUM OF 128 SAMPLES (EOX WHERE X= PHASE A,B OR C)
*       IS SCALED BY A DEMAND CALIBRATION FACTOR AND THEN SUMMED WITH ITS
*       PHASE DEMAND TALLY. IF THE 128 SAMPLE SUM IS NEGATIVE, THEN ZERO IS
*       ADDED TO THE DEMAND TALLY AND "POWER=NEGATIVE" FLAGS ARE SET.

*       ESX = (Vx)/(.1212V/BIT)*(Ix)/(.1569A/BIT)*(1/2)*(1/256)
*                WHERE   1/2 IS FROM VOLTAGE HALF WAVE RECTIFICATION.
*                        1/256 IS BECAUSE LS BYTE OF PRODUCT IS DROPPED.
*                        X IS PHASE A, B OR C

*       EOX = SUM OF 128 SEQUENTIAL ESX VALUES, THE TWO MS BYTES OF EOX
*       ARE USED FOR THE POWER, DEMAND AND ENERGY CALCULATIONS AND ZEROED.
```

```
*       XDEMAND TALLY = SUM OF ("EOX VALUES"/256)*(DEMAND CALIBRATION FACTOR)

*       THE NOMINAL DEMAND CALIBRATION FACTOR VALUE IS 2580 DECIMAL.

*       WHEN 495 EOX VALUES HAVE BEEN USED, A 5 MINUTE DEMAND IS STORED AND
*       THE DEMAND TALLYS ARE ZEROED.

*       DEMAND TALLY IS A 5 BYTE NUMBER. WITH "WATTS" AS THE UNITS, THE
*       DECIMAL POINT IS TO THE LEFT OF THE TWO L.S. BYTES.
*       DEMAND IS THUS THE THREE MS BYTES OF THE SUM OF THE THREE PHASE DEMAND
*       TALLYS AFTER 495 SEQUENTIAL "EOX" VALUES HAVE BEEN USED. AND IS WATTS.

DEMANDSUM

*       DASCASUM SCALES AND SUMS EOA TO DATALY AND DOES PHASE A POWER CALC.
*       AND LOAD THE  PHASE A POWER TO THE INCOM POWER TALLY.
*
*       DXTALY=[(EOX/256)*(DXCAL)] + DXTALY
*
*       INCOM POWER =PWRA + PWRB + PWRC
*       PWRX= (EOX/256)*(DXCAL)*(495=256+239)*(1/256)*(1/256)
*       PWRX= (EOX/256)*(DXCAL)*(1/256)*(1 + 239/256)

*       1179 CYCLES MAX.

DASCASUM

BRCLR    7,EOATALY,POSEOA      WAS EOA TALLY POSITIVE

BSET     EANFLG,FLAGS0         SET PHASE A POWER NEGATIVE FLAG BIT
        LDA      #$FF                  RESET TWO MS BYTES TO ZERO VALUE
        STA      EOATALY
        STA      EOATALY+1
        JMP      DBSCASUM
POSEOA
        LDA      EOATALY
        STA      NUM1

LDA      EOATALY+1
        STA      NUM1+1

LDA      DCAL+0
        STA      NUM2+0

LDA      DCAL+1
        STA      NUM2+1

JSR      DMULT                 NUM3(0,1,2,3)= (EOATALY/256)*(DACAL)

LDX      #DATALY+1             NOTE, DEMAND TALLY IS A 5 BYTE NUMBER
        LDA      NUM3                  PREPARATION FOR LATER POWER CALCULATION
        STA      POWER                 INITIALIZE PARTIAL TALLY OF INCOM POWER
        CLR      NUM1
        STA      NUM1+1                SAVE FOR POWER CALULATION

LDA      NUM3+1
        STA      POWER+1               POWER(0,1,2) = (EOA/256)*(DACAL)*(1/256)
        STA      NUM1+2                NUM1(0,1,2,3)= (EOA/256)*(DACAL)*(1/256)

LDA      NUM3+2
        STA      POWER+2
        STA      NUM1+3

JSR      ADD4_IND              FOUR LS DEMAND "A" BYTES SUMMED
        DECX                           POINT TO MS TALLY BYTE
        BCC      CAPOWER               JUMP IF NO CARRY INTO MS BYTE
```

```
        INC     0,X                     INCREMENT MS TALLY BYTE
CAPOWER
        LDA     #239
        STA     TEMP+1
        JSR     MUL4X1                  NUM1=(EOA/256)*(DACAL)*(1/256)*(239/256)
        LDX     #POWER
        JSR     ADD4_X1
*       DBSCASUM SCALES AND SUMS EOB TO DBTALY AND DOES PHASE B POWER CALC.
*       AND LOAD THE PHASE B POWER TO THE INCOM POWER TALLY.
*
DBSCASUM

BRCLR   7,EOBTALY,POSEOB        WAS EOB TALLY POSITIVE

BSET    EBNFLG,FLAGS0           SET PHASE B POWER NEGATIVE FLAG BIT
        LDA     #$0FF
        STA     EOBTALY
        STA     EOBTALY+1
        JMP     DCSCASUM
POSEOB
        LDA     EOBTALY
        STA     NUM1

LDA     EOBTALY+1
        STA     NUM1+1

LDA     DCAL+2
        STA     NUM2+0

LDA     DCAL+3
        STA     NUM2+1

JSR     DMULT                   NUM3= (EOBTALY/256)*(DBCAL)

LDX     #DBTALY+1               NOTE, DEMAND TALLY IS A 5 BYTE NUMBER
        CLR     NUM1
        LDA     NUM3+2                  PREPARATION FOR LATER POWER CALCULATION
        STA     NUM1+3                  SAVE FOR POWER CALULATION
        ADD     POWER+2                 DO PARTIAL TALLY OF INCOM POWER
        STA     POWER+2                 AND SAVE

*                                       NOTE, POWER = (EOB/256)*(DBCAL)*(1/256)
        LDA     NUM3+1                  PREPARATION FOR LATER POWER CALCULATION
        STA     NUM1+2                  SAVE FOR POWER CALULATION
        ADC     POWER+1                 DO PARTIAL TALLY OF INCOM POWER
        STA     POWER+1                 AND SAVE

LDA     NUM3+0                  PREPARATION FOR LATER POWER CALCULATION
        STA     NUM1+1                  SAVE FOR POWER CALULATION
        ADC     POWER+0                 DO PARTIAL TALLY OF INCOM POWER
        STA     POWER+0                 AND SAVE

JSR     ADD4_IND                FOUR LS DEMAND "B" BYTES SUMMED
        DECX                            POINT TO MS TALLY BYTE
        BCC     CBPOWER                 JUMP IF NO CARRY INTO MS BYTE
        INC     0,X                     INCREMENT MS TALLY BYTE
CBPOWER
        LDA     #239
        STA     TEMP+1
        JSR     MUL4X1                  NUM1=(EOB/256)*(DBCAL)*(1/256)*(239/256)
        LDX     #POWER
        JSR     ADD4_X1
*       DCSCASUM SCALES AND SUMS EOC TO DCTALY AND DOES PHASE C POWER CALC.
*       AND LOAD THE PHASE C POWER TO THE INCOM POWER TALLY.
*
DCSCASUM
```

```
        BRCLR   7,EOCTALY,POSEOC    WAS EOC TALLY POSITIVE

BSET    ECNFLG,FLAGS0       SET PHASE C POWER NEGATIVE FLAG BIT
        LDA     #$FF
        STA     EOCTALY
        STA     EOCTALY+1
        JMP     ENDMND
POSEOC
        LDA     EOCTALY
        STA     NUM1

LDA     EOCTALY+1
        STA     NUM1+1

LDA     DCAL+4
        STA     NUM2+0

LDA     DCAL+5
        STA     NUM2+1

JSR     DMULT               NUM3= (EOCTALY/256)*(DCCAL)

LDX     #DCTALY+1           NOTE, DEMAND TALLY IS A 5 BYTE NUMBER
        CLR     NUM1
        LDA     NUM3+2              PREPARATION FOR LATER POWER CALCULATION
        STA     NUM1+3              SAVE FOR POWER CALULATION
        ADD     POWER+2             DO PARTIAL TALLY OF INCOM POWER
        STA     POWER+2             AND SAVE

*                                   NOTE, POWER = (EOC/256)*(DCCAL)*(1/256)
        LDA     NUM3+1              PREPARATION FOR LATER POWER CALCULATION
        STA     NUM1+2              SAVE FOR POWER CALULATION
        ADC     POWER+1             DO PARTIAL TALLY OF INCOM POWER
        STA     POWER+1             AND SAVE

LDA     NUM3+0              PREPARATION FOR LATER POWER CALCULATION
        STA     NUM1+1              SAVE FOR POWER CALULATION
        ADC     POWER+0             DO PARTIAL TALLY OF INCOM POWER
        STA     POWER+0             AND SAVE

JSR     ADD4_IND            FOUR LS DEMAND "C" BYTES SUMMED
        DECX                        POINT TO MS TALLY BYTE
        BCC     CCPOWER             JUMP IF NO CARRY INTO MS BYTE
        INC     0,X                 INCREMENT MS TALLY BYTE
CCPOWER
        LDA     #239
        STA     TEMP+1
        JSR     MUL4X1              NUM1=(EOC/256)*(DCCAL)*(1/256)*(239/256)
        LDX     #POWER
        JSR     ADD4_X1
ENDMND  RTS
```

********************************************************************************
********************************************************************************

*   ESCALE SUBROUTINE.
*   ENERGY COMPUTATION IS CONDUCTED ONCE EACH 128 SAMPLES.

*   EACH SAMPLE THE INSTANTANEOUS POWER ESX FOR EACH PHASE IS CALCULATED.
*   ESX = (Vx)/(.1212V/BIT)*(Ix)/(.1569A/BIT)*(1/2)*(1/256)

```
*       WHERE   1/2 IS FROM VOLTAGE HALF WAVE RECTIFICATION.
*               1/256 IS BECAUSE LS BYTE OF PRODUCT IS DROPPED.
*               X IS PHASE A, B OR C

*       FOR 128 SAMPLES EACH PHASE ESX IS SUMMED INTO AN EOX TALLY.
*       EOX = SUM OF 128 SEQUENTIAL ESX VALUES, THE TWO MS BYTES OF EOX
*       ARE USED FOR THE POWER, DEMAND AND ENERGY CALCULATIONS AND ZEROED.

*       ENERGY TALLY = "PHASE A ENERGY" + "PHASE B ENERGY" + "PHASE C ENERGY"
*       "PHASE X ENERGY" = SUMMATION OF (EOX/256)*(X ENERGY CALIBRATION FACTOR)
*               THE NOMINAL "ENERGY CALIBRATION FACTOR" IS 14090 DECIMAL.

*       IF ENERGY OF ANY INDIVIDUAL ENERGY TALLY IS NEGATIVE, ZERO IS ADDED TO
*       THE TOTAL FOR ITS CONTRIBUTION. THAT IS TOTALIZED KW-H ALWAYS
*       INCREASES OR REMAINS THE SAME, BUT NEVER DECREASES.

*       1120 CYCLES MAX.

ENERGYSUM
        CLR     ATEMP                   TEMPORARY ARRAY CONTROL FLAG REGISTER
        BRCLR   7,EOATALY,AENERGY
        BSET    EANFLG,FLAGS1           PHASE A ENERGY WAS NEGATIVE
        JMP     BENERGY

AENERGY
        BCLR    EANFLG,FLAGS1           CLEAR PHASE "A" NEGATIVE ENERGY FLAG
        LDA     EOATALY
        STA     NUM1

LDA     EOATALY+1
        STA     NUM1+1

LDA     ECAL+0
        STA     NUM2+0

LDA     ECAL+1
        STA     NUM2+1

JSR     DMULT                   NUM3= (EOATALY/256)*(EACAL)

LDX     #ETALLY                 NOTE, ENERGY TALLY IS A 7 BYTE NUMBER
        LDA     NUM3
        STA     NUM1

LDA     NUM3+1
        STA     NUM1+1

LDA     NUM3+2
        STA     NUM1+2

LDA     NUM3+3
        STA     NUM1+3

JSR     ADD4_IND                FOUR LS ENERGY "A" BYTES SUMMED
        BCC     BENERGY                 JUMP IF NO CARRY INTO MS BYTE

*                                       INCREMENT "ENERGY"

CLRA                            DO LS BYTE OF ENERGY TALLY
        ADC     ENERGY+2
        STA     ENERGY+2
        BCC     BENERGY                 JUMP IF NO CARRY INTO MS BYTE

BSET    EC2_1,ATEMP             TEMPORARY BIT TO CHANGE TO OTHER TALLY
        BSET    S_CK_B,FLAGS2           YES, SET BIT TO SAVE CHECKSUM
        BSET    S_MD_B,FLAGS2           SET BIT TO SAVE MIDDLE BYTE
```

```
          BSET    C_LS_E,FLAGS6           SET BIT TO CLEAR LS BYTE OF TALLY
          CLRA
          ADC     ENERGY+1
          STA     ENERGY+1
          BCC     BENERGY                 JUMP IF NO CARRY INTO MS BYTE

BSET    S_MS_B,FLAGS2           YES, SET BIT TO SAVE MS BYTE
          BSET    EP1,FLAGS2              INCREMENT AND UPDATE POINTER1
          BSET    EP2,FLAGS2              INCREMENT AND UPDATE POINTER2
          CLRA
          ADC     ENERGY+0
          STA     ENERGY+0

BENERGY
          BRCLR   7,EOATALY,DOBENRGY
          BSET    EBNFLG,FLAGS1           PHASE B ENERGY WAS NEGATIVE
          JMP     CENERGY

DOBENRGY
          BCLR    EBNFLG,FLAGS1           CLEAR PHASE "B" NEGATIVE ENERGY FLAG
          LDA     EOBTALY
          STA     NUM1

LDA     EOBTALY+1
          STA     NUM1+1

LDA     ECAL+2
          STA     NUM2+0

LDA     ECAL+3
          STA     NUM2+1

JSR     DMULT                   NUM3= (EOBTALY/256)*(EBCAL)

LDX     #ETALLY                 NOTE, ENERGY TALLY IS A 7 BYTE NUMBER
          LDA     NUM3
          STA     NUM1

LDA     NUM3+1
          STA     NUM1+1

LDA     NUM3+2
          STA     NUM1+2

LDA     NUM3+3
          STA     NUM1+3

JSR     ADD4_IND                FOUR LS ENERGY "A" BYTES SUMMED
          BCC     CENERGY                 JUMP IF NO CARRY INTO MS BYTE

INCREMENT "ENERGY"

CLRA                            DO LS BYTE OF ENERGY TALLY
          ADC     ENERGY+2
          STA     ENERGY+2
          BCC     CENERGY                 JUMP IF NO CARRY INTO MS BYTE

BSET    EC2_1,ATEMP             TEMPORARY BIT TO CHANGE TO OTHER TALLY
          BSET    S_CK_B,FLAGS2           YES, SET BIT TO SAVE CHECKSUM
          BSET    S_MD_B,FLAGS2           SET BIT TO SAVE MIDDLE BYTE
          BSET    C_LS_E,FLAGS6           SET BIT TO CLEAR LS BYTE OF TALLY
          CLRA
          ADC     ENERGY+1
          STA     ENERGY+1
          BCC     CENERGY                 JUMP IF NO CARRY INTO MS BYTE
```

```
            BSET    S_MS_B,FLAGS2           YES, SET BIT TO SAVE MS BYTE
            BSET    EP1,FLAGS2              INCREMENT AND UPDATE POINTER1
            BSET    EP2,FLAGS2              INCREMENT AND UPDATE POINTER2
            CLRA
            ADC     ENERGY+0
            STA     ENERGY+0

CENERGY
            BRCLR   7,EOATALY,DOCENRGY
            BSET    ECNFLG,FLAGS1           PHASE C ENERGY WAS NEGATIVE
            JMP     ENDENERGY
DOCENRGY
            BCLR    ECNFLG,FLAGS1           CLEAR PHASE "C" NEGATIVE ENERGY FLAG
            LDA     EOCTALY
            STA     NUM1

LDA     EOCTALY+1
            STA     NUM1+1

LDA     ECAL+4
            STA     NUM2+0

LDA     ECAL+5
            STA     NUM2+1

JSR     DMULT                   NUM3= (EOCTALY/256)*(ECCAL)

LDX     #ETALLY                 NOTE, ENERGY TALLY IS A 7 BYTE NUMBER
            LDA     NUM3
            STA     NUM1

LDA     NUM3+1
            STA     NUM1+1

LDA     NUM3+2
            STA     NUM1+2

LDA     NUM3+3
            STA     NUM1+3

JSR     ADD4_IND                FOUR LS ENERGY "C" BYTES SUMMED
            BCC     ENDENERGY                       JUMP IF NO CARRY INTO MS BYTE

*--------                           INCREMENT "ENERGY"

CLRA                            DO LS BYTE OF ENERGY TALLY
            ADC     ENERGY+2
            STA     ENERGY+2
            BCC     ENDENERGY               WAS THERE A CARRY INTO THE MIDDLE BYTE

BSET    EC2_1,ATEMP             TEMPORARY BIT TO CHANGE TO OTHER TALLY
            BSET    S_CK_B,FLAGS2           YES, SET BIT TO SAVE CHECKSUM
            BSET    S_MD_B,FLAGS2           SET BIT TO SAVE MIDDLE BYTE
            BSET    C_LS_E,FLAGS6           SET BIT TO CLEAR LS BYTE OF TALLY
            CLRA
            ADC     ENERGY+1
            STA     ENERGY+1
            BCC     ENDENERGY               WAS THERE A CARRY INTO THE MS BYTE

BSET    S_MS_B,FLAGS2           YES, SET BIT TO SAVE MS BYTE
            BSET    EP1,FLAGS2              INCREMENT AND UPDATE POINTER1
            BSET    EP2,FLAGS2              INCREMENT AND UPDATE POINTER2
            CLRA
            ADC     ENERGY+0
            STA     ENERGY+0
```

```
ENDENERGY
        LDA     FLAGS6
        EOR     ATEMP                   CHANGE TALLYS IF REQUIRED, BIT "EC2_1"
        STA     FLAGS6                  IS CHANGED AS REQUIRED.
        RTS
```

***************************************************************************
***************************************************************************

*       CLREOX ZEROES THE TWO MOST SIGNIFICANT BYTES OF THE THE THREE BYTE
*       TALLYS EOA, EOB, EOC.  IF THE SIGN WAS NEGATIVE ZEROES BECOME OFFH.

*       80 CYCLES MAX.

```
CLREOX
        LDA     #$FF                    USE IF TALLYS WERE NEGATIVE
        BRCLR   7,EOATALY,ZAT
        STA     EOATALY
        STA     EOATALY+1
        BRA     DOBTAL
ZAT     CLR     EOATALY
        CLR     EOATALY+1
DOBTAL
        BRCLR   7,EOBTALY,ZBT
        STA     EOBTALY
        STA     EOBTALY+1
        BRA     DOCTAL
ZBT     CLR     EOBTALY
        CLR     EOBTALY+1
DOCTAL
        BRCLR   7,EOCTALY,ZCT
        STA     EOCTALY
        STA     EOCTALY+1
        BRA     ENDZTAL
ZCT     CLR     EOCTALY
        CLR     EOCTALY+1
ENDZTAL
        RTS
```

***************************************************************************
***************************************************************************

*       SUM ALL THREE INDIVIDUAL PHASE DEMAND TALLYS AND SAVE THE RESULT
*       IN THE INCOM DEMAND TALLY.  THEN ZERO ALL THREE INDIVIDUAL PHASE
*       DEMAND TALLYS. ALSO ZERO THE "BCOUNT" BLOCK OF GROUPS COUNTER.

*       152 CYCLES MAX.

```
SAVE_DEMAND

LDA     DATALY+2                ADD PHASE A AND PHASE B DEMAND TALLYS
        ADD     DBTALY+2
        STA     DEMAND+2

LDA     DATALY+1
        ADC     DBTALY+1
        STA     DEMAND+1

LDA     DATALY+0
        ADC     DBTALY+0
        STA     DEMAND+0

LDA     DCTALY+2                ADD ON PHASE C DEMAND TALLY AND SAVE
```

```
        ADD     DEMAND+2
        STA     DEMAND+2

LDA     DCTALY+1
        ADC     DEMAND+1
        STA     DEMAND+1

LDA     DCTALY+0
        ADC     DEMAND+0
        STA     DEMAND+0

BSET    NDEMAND,FLAGS0

ZERO_DTALLY

CLR     DATALY+4        LS BYTE OF POWER PHASE A DEMAND TALLY
        CLR     DATALY+3
        CLR     DATALY+2
        CLR     DATALY+1
        CLR     DATALY+0

CLR     DBTALY+4        LS BYTE OF POWER PHASE B DEMAND TALLY
        CLR     DBTALY+3
        CLR     DBTALY+2
        CLR     DBTALY+1
        CLR     DBTALY+0

CLR     DCTALY+4        LS BYTE OF POWER PHASE C DEMAND TALLY
        CLR     DCTALY+3
        CLR     DCTALY+2
        CLR     DCTALY+1
        CLR     DCTALY+0

LDA     #17             PRELOAD "BCOUNT"=17, 17+495=512= 200H
        STA     BCOUNT+1
        CLR     BCOUNT+0

END_DSAVE
        RTS

****************************************************************************
****************************************************************************

*       ROW_ERASE.
*       ENTER WITH X OFFSET POINTING TO THE FIRST LOCATION OF THE ROW TO BE
*       ERASED.

*       26 CYCLES

ROW_ERASE
        CLR     NVCR            ABORT ANY CURRENT ERASE/WRITE ACTIVITY
        LDA     #$0E            SET ROW, ERASE, AND EILAT BITS
        STA     NVCR

STA     EEPROM,X        WRITE ANYTHING TO ANY LOCATION IN ROW EEPROM+X
        BSET    0,NVCR          SET E1PGM BIT

*                       AFTER A 10 MS DELAY
*                       CLEAR   "NVCR" CONTROL BYTE
        RTS

*       END
```

APPENDIX B

PERSONAL COMPUTER BASED ENERGY MONITORING

```
     PC                                            IOS
HARDWARE CLOCK      :   Timer        :     :    MAIN LOOP
                    :   Tick         :     :    (COMM_PROG)
_:¯:_:¯:_:¯:_  >>   :   ISR          :  >> :    executes a normal
                    :                :     :    polling scheme but watches
                    : on 5 minute    :     :    the POLL_ENERGY_FLAG
                    : mark sets      :     :    (in procedure
                    : POLL_ENERGY_FLAG:    :    SERVICE_UTILITY)
                    :                :     :    and breaks out to do
                                                the ENERGY_POLL
                                                as follows:

ENERGY_POLL();
{
        if ((POLL_ENERGY_FLAG == true)
        {
           BROADCAST_SNAPSHOT_ENERGY();    // redundant broadcast to
           BROADCAST_SNAPSHOT_ENERGY();    // insure energy data capture /* Read all DATA PLUS devices */ for ( DEVICE = 1; DEVICE <= n; DEVICE++)
        {
         if (DEVICE_TABLE [DEVICE].DEVICE_TYPE == DATA_PLUS)

DP_ENERGY_ACTION_TABLE(POLL_ENERGY,DEVICE_TABLE[DEVICE]);
        }

/* might want to delay here if no DATA PLUS devices */
        /*                              .                   */
        /*                              .                   */
```

```
/* Read all ENERGY MONITOR devices */ for ( DEVICE = 1; DEVICE <= n; DEVICE++)
{
 DEVICE_TABLE[DEVICE].DEVICE_DATA_ADDRESS[DELTA_SECOND] = 0;

if (DEVICE_TABLE [DEVICE].DEVICE_TYPE == EMON)

EMON_ENERGY_ACTION_TABLE(POLL_ENERGY,DEVICE_TABLE[DEVICE]);
}

/* Read all DATA PLUS or ENERGY MONITOR devices */
/* that did not respond properly last time.    */ for ( DEVICE = 1; DEVICE <= n; DEVICE++)
{
 if (   (DEVICE_TABLE [DEVICE].DEVICE_TYPE == DATA_PLUS )
     && (DEVICE_TABLE [DEVICE].DEVICE_DATA_ADDRESS[EMON_STATUS]
         != VALID))

DP_ENERGY_ACTION_TABLE(POLL_ENERGY,DEVICE_TABLE[DEVICE]);

if (   (DEVICE_TABLE [DEVICE].DEVICE_TYPE == EMON )
     && (DEVICE_TABLE [DEVICE].DEVICE_DATA_ADDRESS[EMON_STATUS]
         != VALID))

EMON_ENERGY_ACTION_TABLE(POLL_ENERGY,DEVICE_TABLE[DEVICE]);

}

/* Stop polling so that device dependent data will not be */
/* overwritten when normal polling resumes.  Application  */
/* must read device dependent data and issue START_POLLING*/
/* request as quickly as possible.                        */

STOP_POLLING();

/* Log an event (device # not important) setting the newly */
/* defined TREND ENERGY LOG bit (bit 6) in the action field */
/* of the event record.                                     */

SET_EVENT_LOG();

}
```

```
EMON_ENERGY_ACTION_TABLE(POLL_TYPE, DEVICE_TBL_PTR);

{ switch(POLL_TYPE)
      { case POLL_ENERGY:

/* First get the FAST STATUS */ if ( GET_STD_STATUS() == false)
            {
                DEVICE_TBL_PTR.DEVICE_DEPENDENT_DATA [EMON_STATUS] = UNKNOWN;
                return(false);
            } //if /* Analyze the Energy Monitor status byte */
            switch (EMON_STATUS)
            {
              case ALARM:
                 DEVICE_TBL_PTR.DEVICE_DEPENDENT_DATA [EMON_STATUS] = ALARM;
                 return(false);

case WRONG_DEVICE:
                 DEVICE_TBL_PTR.DEVICE_DEPENDENT_DATA [EMON_STATUS] = UNKNOWN;
                 return(false);

case ENERGY_NOT_READY:

DEVICE_TBL_PTR.DEVICE_DEPENDENT_DATA [EMON_STATUS] = NREADY;

/* Try to save energy once more */

STD_SLAVE_COMMAND( SAVE_ENERGY_SNAPSHOT );

/* Get time offset in seconds to correct */
                 /* skew in energy snapshot sample         */

DEVICE_TBL_PTR.DEVICE_DEPENDENT_DATA [DELTA_SEC] = TIME.SECONDS;
                 return(false);

case ENERGY_READY:
                 if (GET_STD_SNAPSHOT_ENERGY == false)
                 {
                    DEVICE_TBL_PTR.DEVICE_DEPENDENT_DATA [EMON_STATUS] = UNKNOWN;
                    return(false);
                 }

/* Move energy values to device dependent data */
                 /*                     .                       */
                 /*                     .                       */
                 /*                     .                       */

/* Mark the Energy Monitor data vaild */
                 DEVICE_TBL_PTR.DEVICE_DEPENDENT_DATA [EMON_STATUS] = VALID;
                 return(true);

} //switch default:

/* illegal request */
              DEVICE_TBL_PTR.DEVICE_DEPENDENT_DATA [EMON_STATUS] = UNKNOWN;
              return(false);

} //switch
}
```

We claim:

1. A backpack unit to be associated with an installed local circuit interrupting device having a case and at least one terminal female lug for connection with a local cable conducting a current and a voltage for a load; the backpack unit comprising:

electric circuitry to be oriented transversely of said circuit interrupting device local cable and having at least one central opening for admitting the local cable therethrough, said electric circuitry including transducer means for deriving analog signals representative of the local cable current and voltage; means for converting said analog signals into characteristic digital signals; digital means responsive to said digital characteristic signals for generating digital signals representative of local power consumed through the local cable; and connector means for outputting said power representative digital signals; and a housing for said electric circuitry having a central opening corresponding to said at least one central opening of said electric circuitry, the central openings of said electric circuitry and said housing admitting the local cable therethrough in order that the local cable current flows between the local cable and said circuit interrupting device terminal female lug, such that the local cable current remains external to the backpack unit, said housing including a male plug disposed therein and connected to said transducer means, said male plug extending therefrom and projecting outside the housing and external to the backpack unit for connection to said circuit interrupting device terminal female lug in order to mount the backpack unit against said case of said installed local circuit interrupting device, and in order to provide to said transducer means the local cable voltage.

2. The backpack unit of claim 1 with said housing having a cross-section in a plane of said electric circuitry equal at most to a cross-section of said circuit interrupting device case projecting in a plane normal to said local cable.

3. The backpack unit of claim 2 with a bidirectional communication line means being provided connected to a computer and to said electric circuitry; said computer communicating digitally and asynchronously with said digital means for directly initiating operation of said generating means and for outputting said power representative signals.

4. The backpack unit of claim 3 with said communication line means including a lower-link module for converting said representative digital signals into a digitally coded value of said local power consumed, said digitally coded value being given a message format for asynchronous and sequential transmission through said communication line mans:

5. The backpack unit of claim 4 with said lower-link module being addressed by said computer through said communication line means for directly initiating the derivation of an instantaneous value of said local power consumed.

6. A system associated with a plurality of installed circuit interrupting devices disposed on a common panelboard with respective corresponding cases, female terminal lugs and local cables each local cable conducting a current and a voltage for a load; backpack units of the same plurality being provided, each backpack unit being mounted against a corresponding one of said circuit interrupting device cases for outputting digital signals representative of local power consumed at the corresponding location for a local cable, each backpack unit having an opening admitting the corresponding local cable therethrough in order that the current of the corresponding local cable flows between the corresponding local cable and the corresponding female terminal lug, such that the current of the corresponding local cable remains external to the corresponding backpack unit but induces a sensed current signal representative of the current of the corresponding local cable in a transducer means within the corresponding backpack unit, each backpack unit also having external means providing an internal sensed voltage signal representative of the voltage of the corresponding local cable and internal means calculating power from said sensed current and voltage signals; a bidirectional communication line means being established serially between a computer and coupled with respective lower-link modules of the several backpack units for the respective locations; the computer communicating selectively and instantaneously with said backpack units for deriving an indication of the local power consumed at the respective locations.

7. The system of claim 6 having a collective electrical meter for computing energy consumed in distribution of electricity for use through said local cable and the computer recording and calculating through said communication line means and with the lower-link of each of said backpack units the energy consumed individually at said respective locations.

8. The backpack unit of claim 6 wherein said circuit interrupting device is a circuit breaker.

9. A backpack unit to be associated with an installed local circuit interrupting device having a molded case and at least one terminal female lug for connection with a local cable providing a current and a voltage for a load; the backpack unit comprising:

two parallel and side-by-side printed-circuit (PC) boards to be oriented transversely of said circuit interrupting device local cable and having at least one central common opening for admitting the cable therethrough;

one of said PC boards including transducer means for deriving analog signals representative of the local cable current and voltage;

said other PC board having:

means for converting said analog signals into characteristic digital signals; digital means responsive to said digital characteristic signals for generating digital signals representative of local power consumed through the local cable; and connector means for outputting said power representative digital signals;

said two PC boards being connected laterally for passing said analog signals from said one PC board to said other PC board; and a housing for said two PC boards having a central opening corresponding to said at least one central common opening of said two PC boards, the central common opening of said two PC boards and the central opening of said housing admitting the local cable therethrough in order that the current of the local cable flows between the local cable and said circuit interrupting device terminal female lug, such that the current of the local cable remains external to the backpack unit, said housing including a male plug disposed therein and connected to said transducer means, said male plug extending therefrom and projecting outside the housing and external to the backpack unit for connection to said circuit interrupting device terminal female lug in order to mount the backpack unit against said case and on said installed circuit interrupting device, and in order to provide to said transducer means the voltage of the local cable.

10. The backpack unit of claim 9 wherein said circuit interrupting device is a circuit breaker.

* * * * *